(12) United States Patent
Kuwahara

(10) Patent No.: US 11,295,974 B2
(45) Date of Patent: Apr. 5, 2022

(54) SUBSTRATE TREATING APPARATUS

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 108 days.

(21) Appl. No.: 16/520,459

(22) Filed: Jul. 24, 2019

(65) Prior Publication Data

US 2020/0098609 A1 Mar. 26, 2020

(30) Foreign Application Priority Data

Sep. 21, 2018 (JP) .............................. JP2018-178011

(51) Int. Cl.
*H01L 21/67* (2006.01)
*H01L 21/677* (2006.01)

(52) U.S. Cl.
CPC .. *H01L 21/67745* (2013.01); *H01L 21/67098* (2013.01); *H01L 21/67196* (2013.01)

(58) Field of Classification Search
CPC ............... B05C 13/00; H01L 21/67167; H01L 21/67098; H01L 21/67017; H01L 21/67184
See application file for complete search history.

(56) References Cited

U.S. PATENT DOCUMENTS

| 5,110,248 A | 5/1992 | Asano et al. ................. 414/172 |
| 5,177,514 A | 1/1993 | Ushijima et al. ............ 354/319 |

(Continued)

FOREIGN PATENT DOCUMENTS

| JP | 2009-010291 A | 1/2009 |
| KR | 10-2006-0124602 A | 12/2006 |

(Continued)

OTHER PUBLICATIONS

Office Action dated Sep. 28, 2020 for corresponding Korean Patent Application No. 10-2019-0091682.

(Continued)

*Primary Examiner* — Gregory A Wilson
(74) *Attorney, Agent, or Firm* — Ostrolenk Faber LLP

(57) ABSTRACT

A substrate treating apparatus includes first and second transport mechanisms, an intermediate transport mechanism, first and second intermediate parts, and a controller. The intermediate transport mechanism is disposed between the first and second transport mechanisms. The first intermediate part is disposed within a first overlapped area where the first transport mechanism and the intermediate transport mechanism are capable of transporting a substrate. The substrate is placed in the first intermediate part. The second intermediate part is disposed within a second overlapped area where the intermediate transport mechanism and the second transport mechanism are capable of transporting the substrate. The substrate is placed in the second intermediate part. The intermediate transport mechanism repeats cycle operation based on the controller's control. The cycle operation by the intermediate transport mechanism includes only a first access operation of accessing the first intermediate part and a second access operation of accessing the second intermediate part.

25 Claims, 21 Drawing Sheets

(56) References Cited

U.S. PATENT DOCUMENTS

| | | | |
|---|---|---|---|
| 6,790,763 B2* | 9/2004 | Kondo | B24B 37/005 |
| | | | 257/E21.174 |
| 8,851,008 B2* | 10/2014 | Fukutomi | H01L 21/6715 |
| | | | 118/64 |
| 8,883,653 B2* | 11/2014 | Hashizume | B05C 15/00 |
| | | | 438/745 |
| 9,184,071 B2* | 11/2015 | Ogura | H01L 21/67178 |
| 9,539,607 B2* | 1/2017 | Kuwahara | H01L 21/681 |
| 10,579,041 B2* | 3/2020 | Nurani | H01L 22/12 |
| 2006/0266290 A1 | 11/2006 | Kiyota | 118/719 |
| 2007/0254493 A1 | 11/2007 | Salinas et al. | 438/795 |
| 2008/0063809 A1 | 3/2008 | Lee et al. | 427/558 |
| 2009/0000543 A1 | 1/2009 | Fukutomi et al. | 118/58 |
| 2013/0272824 A1* | 10/2013 | Iida | H01L 21/67772 |
| | | | 414/222.01 |
| 2014/0080304 A1* | 3/2014 | Zhang | H01L 21/67167 |
| | | | 438/680 |
| 2015/0314314 A1* | 11/2015 | Kuwahara | B08B 3/02 |
| | | | 427/8 |
| 2017/0053817 A1* | 2/2017 | Inagaki | H01L 21/67178 |
| 2020/0098609 A1* | 3/2020 | Kuwahara | H01L 21/67766 |

FOREIGN PATENT DOCUMENTS

| | | |
|---|---|---|
| TW | I366233 B | 6/2012 |
| TW | I493649 B | 7/2015 |

OTHER PUBLICATIONS

Office Action dated Dec. 16, 2020 for corresponding Taiwanese Patent Application No. 108126465.

Semiconductor Manufacturing Technology, 2001, p. 358, Fig. 13.25.

\* cited by examiner

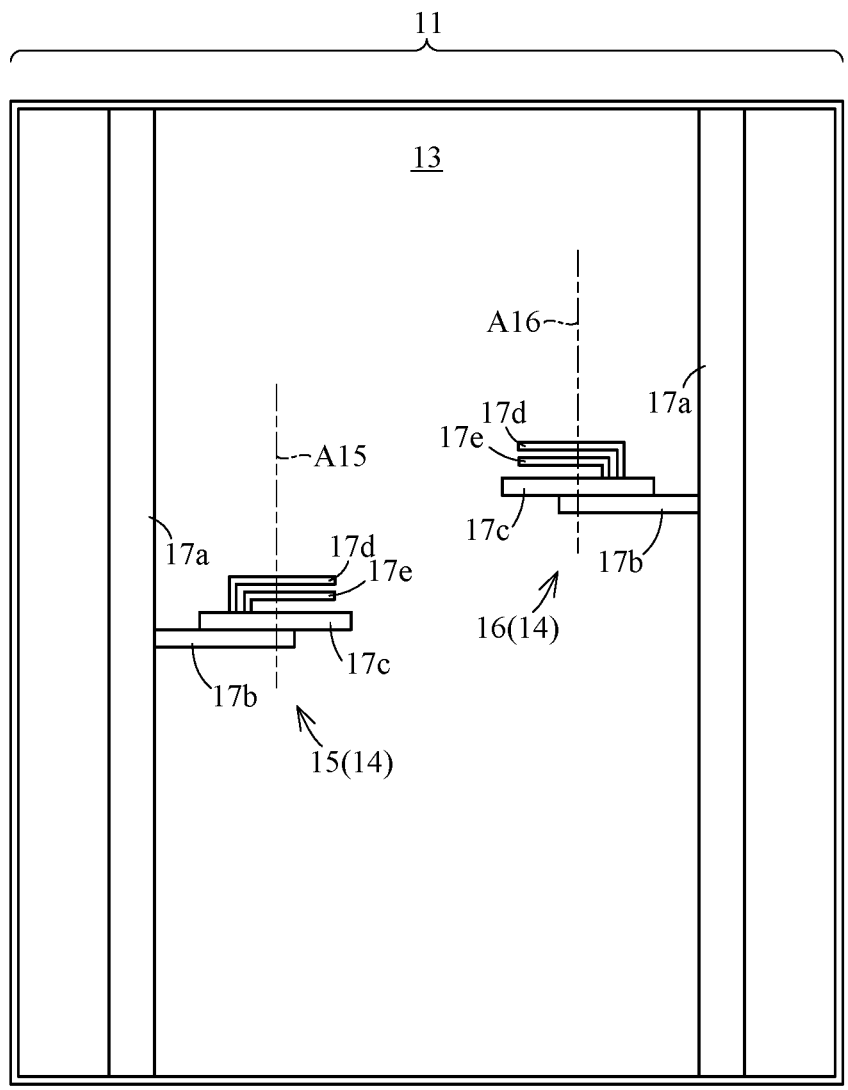
FIG. 9
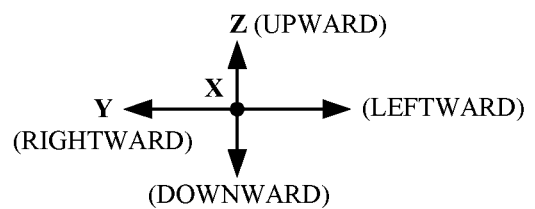

FIG. 10
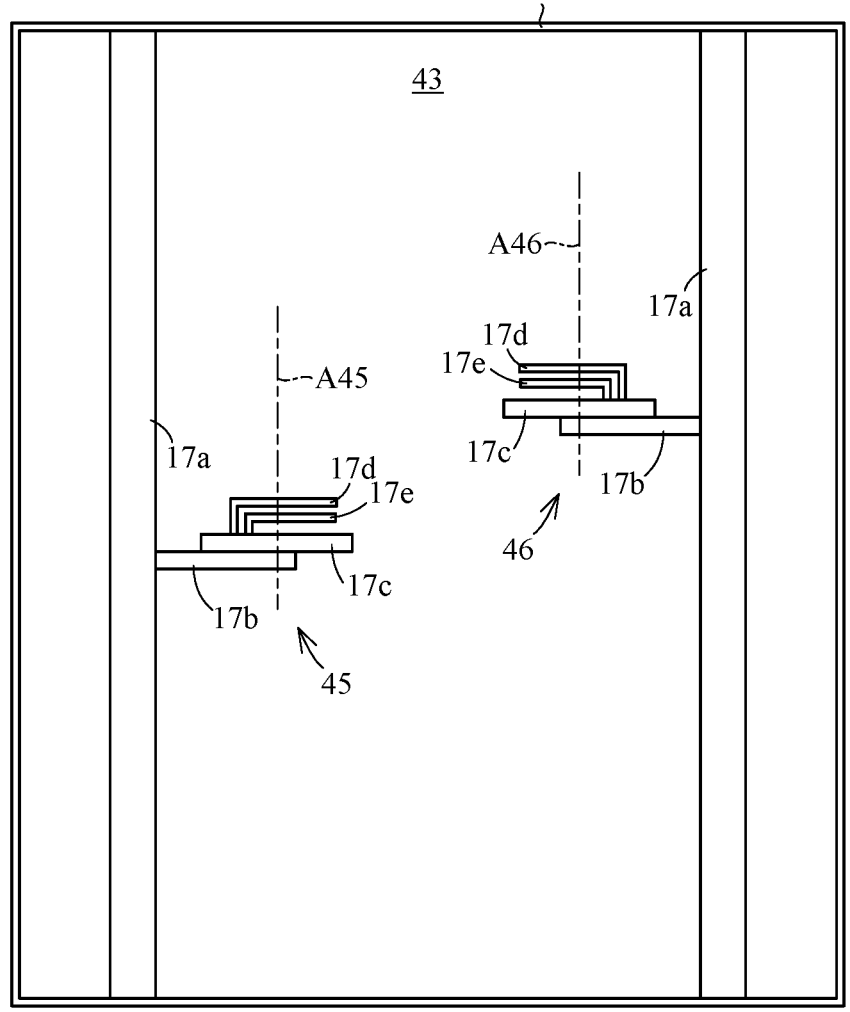
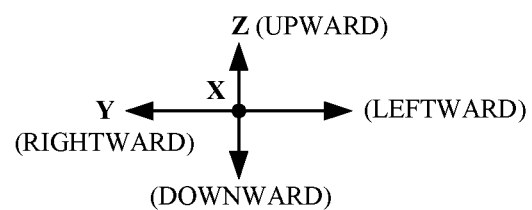

FIG. 11
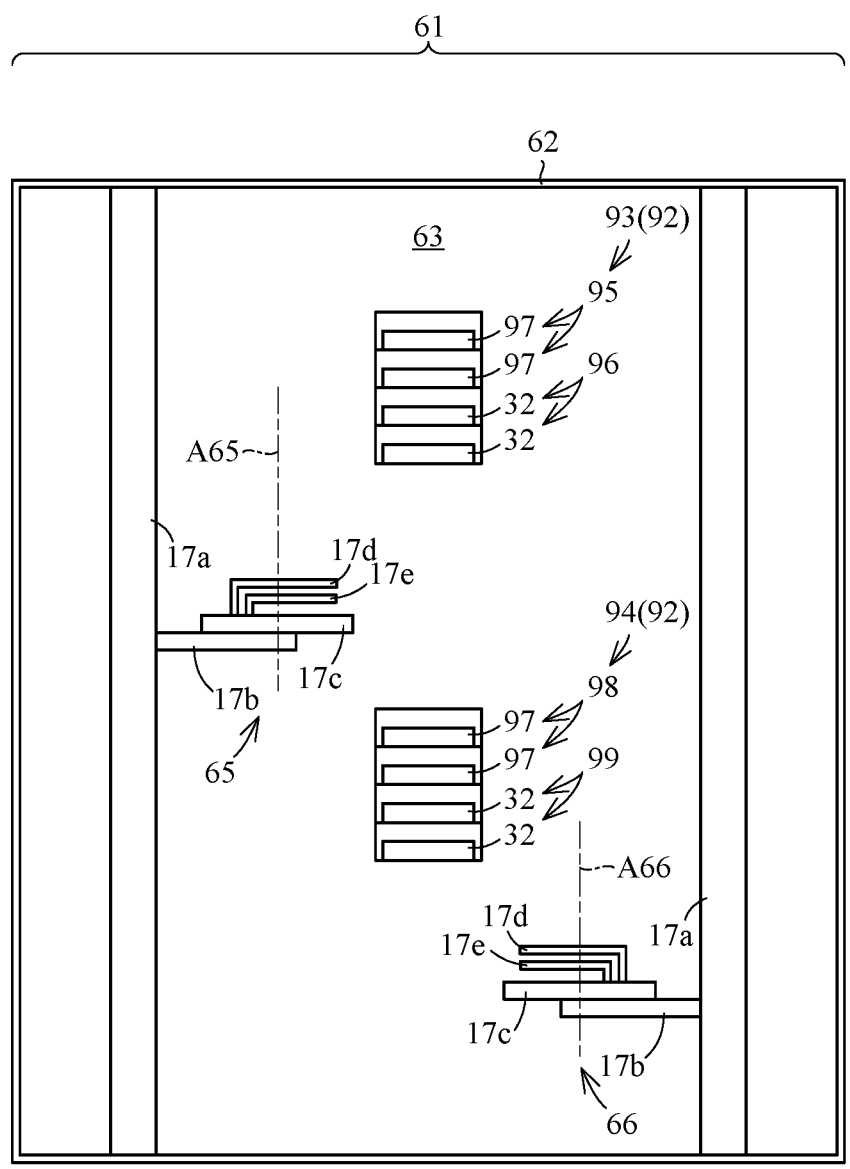
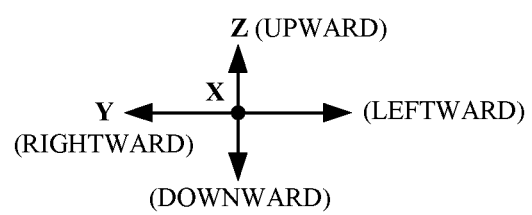

SUBSTRATE TREATING APPARATUS

CROSS-REFERENCE TO RELATED APPLICATIONS

This application claims priority to Japanese Patent Application No. 2018-178011 filed Sep. 21, 2018, the disclosure of which is hereby incorporated herein by reference in its entirety for all purposes.

BACKGROUND OF THE INVENTION

Field of the Invention

The present invention relates to a substrate treating apparatus that performs treatment to substrates. Examples of the substrates include a semiconductor wafer, a substrate for liquid crystal display, a substrate for organic electroluminescence (EL), a substrate for flat plasma display (FPD), a substrate for optical display, a magnetic disk substrate, an optical disk substrate, a magneto-optical disk substrate, a substrate for photomask, and a solar cell substrate.

Description of the Related Art

Japanese Unexamined Patent Publication No. 2009-010291A discloses a substrate treating apparatus. Hereinunder, numerals in the above Patent Literature are expressed in parentheses. A substrate treating apparatus (1) includes a transport mechanism (TID), a transport mechanism (T1), a transport mechanism (T2), and a transport mechanism (TIFA). The transport mechanisms (TID, T1, T2, TIFA) each transport a substrate.

The substrate treating apparatus (1) further includes a mount table (PASS1), a mount table (PASS2), and a mount table (PASS5). The mount tables (PASS1, PASS2, PASS5) each receive the substrate. The transport mechanism (TID) and the transport mechanism (T1) reciprocally transfer the substrate W via the mount table (PASS1). The transport mechanism (T1) and the transport mechanism (T2) reciprocally transfer the substrate W via the mount table (PASS2). The transport mechanism (T2) and the transport mechanism (TIFA) reciprocally transfer the substrate W via the mount table (PASS5).

The substrate treating apparatus (1) includes a treating unit for treating the substrate. Specifically, the substrate treating apparatus (1) includes a coating unit (31), a heat treating unit (41), an edge exposing unit (EEW), a developing unit (DEV), and a heat treating unit (42). The transport mechanism (T1) transports the substrate to the coating unit (31) and the heat treating unit (41). The transport mechanism (T2) transports the substrate to the edge exposing unit (EEW), the developing unit (DEV), and the heat treating unit (42).

The transport mechanism (T1) performs a series of operations (hereinunder, referred to as "cycle operation") repeatedly. The cycle operation performed by the transport mechanism (T1) includes at least four access operations as under:
first access operation: access to the mount table (PASS1)
second access operation: access to the mount table (PASS2)
third access operation: access to the coating unit (31)
fourth access operation: access to the heat treating unit (41)

The transport mechanism (T2) performs a series of operations (hereinunder, referred to as "cycle operation") repeatedly. The cycle operation performed by the transport mechanism (T2) includes at least five access operations as under:
fifth access operation: access to the mount table (PASS2)
sixth access operation: access to the mount table (PASS5)
seventh access operation: access to the edge exposing unit (EEW)
eighth access operation: access to the developing unit (DEV)
ninth access operation: access to the heat treating unit (42)

SUMMARY OF THE INVENTION

It is required to obtain more enhanced throughput (the number of substrates capable of undergoing treatment per unit time) of the substrate treating apparatus. However, the configuration of the substrate treating apparatus (1) described in the Patent Literature has difficulty in obtaining the more enhanced throughput.

The present invention has been made regarding the state of the art noted above, and its one object is to provide a substrate treating apparatus that allows enhanced throughput of the substrate treating apparatus.

The present invention is constituted as stated below to achieve the above object. One aspect of the present invention provides a substrate treating apparatus. The substrate treating apparatus includes a first transport mechanism that transports a substrate; a second transport mechanism that transports the substrate; an intermediate transport mechanism that is disposed between the first transport mechanism and the second transport mechanism and transports the substrate; a first intermediate part that is disposed within a first overlapped area where the first transport mechanism and the intermediate transport mechanism are capable of transporting the substrate and on which the substrate is placed; a second intermediate part that is disposed within a second overlapped area where the intermediate transport mechanism and the second transport mechanism are capable of transporting the substrate and on which the substrate is placed; and a controller that performs control to the first transport mechanism, the second transport mechanism, and the intermediate transport mechanism. The intermediate transport mechanism repeatedly performs cycle operation in accordance with the control by the controller. The cycle operation performed by the intermediate transport mechanism includes only a first access operation of accessing the first intermediate part, and a second access operation of accessing the second intermediate part.

The cycle operation performed by the intermediate transport mechanism includes only the first access operation and the second access operation. In other words, the number of access operations included in the cycle operation by the intermediate transport mechanism is two. As noted above, the number of access operations included in the cycle operation by the intermediate transport mechanism is relatively small. Accordingly, time required for the cycle operation by the intermediate transport mechanism is relatively short. In other words, the frequency of cycle operation performable by the intermediate transport mechanism per unit time is relatively large. Consequently, the intermediate transport mechanism transports the substrate at relatively high efficiency (hereinafter, referred to as "transportation efficiency by the intermediate transport mechanism" appropriately). This achieves suitably enhanced throughput of the substrate treating apparatus.

The first intermediate part is disposed within the first overlapped area where the first transport mechanism and the intermediate transport mechanism are capable of transporting the substrate. The first overlapped area is a region where a first area and an intermediate area are overlapped. The first area is a region where the first transport mechanism is capable of transporting the substrate, whereas the intermediate area is a region where the intermediate transport mechanism is capable of transporting the substrate. Accordingly, the first transport mechanism is capable of accessing the first intermediate part suitably. The intermediate transport mechanism is capable of accessing the first intermediate part suitably.

The substrate is placed on the first intermediate part. Accordingly, the substrate is capable of being transported between the first transport mechanism and the intermediate transport mechanism via the first intermediate part.

The second intermediate part is disposed within the second overlapped area where the intermediate transport mechanism and the second transport mechanism are capable of transporting the substrate. The second overlapped area is a region where the intermediate area and a second area overlap. The intermediate area is a region where the intermediate transport mechanism is capable of transporting the substrate, whereas the second area is a region where the second transport mechanism is capable of transporting the substrate. Consequently, the intermediate transport mechanism is capable of accessing the second intermediate part suitably. The second transport mechanism is capable of accessing the second intermediate part suitably.

The substrate is placed on the second intermediate part. Accordingly, the substrate is capable of being transported between the intermediate transport mechanism and the second transport mechanism via the second intermediate part.

The cycle operation performed by the intermediate transport mechanism includes the first access operation in which the intermediate transport mechanism accesses the first intermediate part. The cycle operation performed by the intermediate transport mechanism includes the second access operation in which the intermediate transport mechanism accesses the second intermediate part. Accordingly, the intermediate transport mechanism performs the cycle operation repeatedly, thereby accessing the first intermediate part and the second intermediate part alternately. As noted above, the cycle operation performed by the intermediate transport mechanism includes only the first access operation and the second access operation. Accordingly, the intermediate transport mechanism is capable of accessing the first intermediate part and the second intermediate part efficiently. Accordingly, the intermediate transport mechanism allows efficient transportation of the substrate between the first intermediate part and the second intermediate part.

In the above-described substrate treating apparatus, the first transport mechanism places the substrate on the first intermediate part, and the second transport mechanism picks up the substrate from the second intermediate part. The intermediate transport mechanism performs the first access operation and the second access operation. The first access operation includes picking up the substrate from the first intermediate part, and the second access operation includes placing the substrate on the second intermediate part. The intermediate transport mechanism performs the cycle operation, thereby receiving the substrate via the first intermediate part from the first transport mechanism, and transporting the substrate from the first intermediate part to the second intermediate part, and passing the substrate via the second intermediate part to the second transport mechanism. Such is preferable. The intermediate transport mechanism performs the first access operation including operation of unloading the substrate from the first intermediate part. Consequently, the intermediate transport mechanism is capable of unloading the substrate from the first intermediate part efficiently. The intermediate transport mechanism performs the second access operation including operation of loading the substrate into the second intermediate part. Consequently, the intermediate transport mechanism is capable of loading the substrate into the second intermediate part efficiently. Accordingly, the intermediate transport mechanism performs the cycle operation repeatedly, thereby achieving effective transportation of the substrate from the first intermediate part to the second intermediate part. The first transport mechanism loads the substrate into the first intermediate part. Accordingly, the intermediate transport mechanism performs the cycle operation repeatedly, thereby achieving effective receipt of the substrate from the first intermediate part via the first intermediate part. The second transport mechanism unloads the substrate from the second intermediate part. Accordingly, the intermediate transport mechanism performs the cycle operation repeatedly, thereby achieving effective deliver of the substrate to the second transport mechanism via the second intermediate part.

In the above-described substrate treating apparatus, the first operation by the intermediate transport mechanism includes placing the substrate on the first intermediate part, and the second access operation by the intermediate transport mechanism includes picking up the substrate from the second intermediate part. The intermediate transport mechanism performs cycle operation, thereby transporting the substrate from the second intermediate part to the first intermediate part. Such is preferable. The intermediate transport mechanism performs the first access operation including operation of loading the substrate into the first intermediate part. Consequently, the intermediate transport mechanism is capable of loading the substrate into the first intermediate part efficiently. The intermediate transport mechanism performs the second access operation including operation of unloading the substrate from the second intermediate part. Consequently, the intermediate transport mechanism is capable of unloading the substrate from the second intermediate part efficiently. Accordingly, the intermediate transport mechanism performs the cycle operation repeatedly, thereby achieving effective transportation of the substrate from the second intermediate part to the first intermediate part.

In the above-described substrate treating apparatus, the first transport mechanism picks up the substrate from the first intermediate part, and the second transport mechanism places the substrate on the second intermediate part. The intermediate transport mechanism performs the cycle operation, thereby receiving the substrate from the second intermediate part via the second intermediate part, and passing the substrate to the first transport mechanism via the first intermediate part. Such is preferable. The first transport mechanism unloads the substrate from the first intermediate part. Accordingly, the intermediate transport mechanism performs the cycle operation repeatedly, thereby achieving effective deliver of the substrate to the first transport mechanism via the first intermediate part. The second transport mechanism loads the substrate into the second intermediate part. Accordingly, the intermediate transport mechanism performs the cycle operation repeatedly, thereby achieving effective receipt of the substrate from the second transport mechanism via the second intermediate part.

In the above-described substrate treating apparatus, the first access operation performed by the intermediate transport mechanism does not include placing the substrate on the first intermediate part, and the second access operation performed by the intermediate transport mechanism does not include picking up the substrate from the second intermediate part. The intermediate transport mechanism does not transport the substrate from the second intermediate part to the first intermediate part. Such is preferable. The first access operation performed by the intermediate transport mechanism does not include loading the substrate into the first intermediate part. Accordingly, the intermediate transport mechanism needs much shorter time for the first access operation. The second access operation performed by the intermediate transport mechanism does not include unloading the substrate from the second intermediate part. Accordingly, the intermediate transport mechanism needs much shorter time for the second access operation. Consequently, the intermediate transport mechanism needs much shorter time for the cycle operation. This achieves much enhanced transportation efficiency by the intermediate transport mechanism. As a result, much enhanced throughput of the substrate treating apparatus is obtainable.

In the above-described substrate treating apparatus, the first intermediate part includes a plurality of first sending units where one substrate is placed individually, and the second intermediate part includes a plurality of second sending units where one substrate is placed individually. The intermediate transport mechanism performs the first access operation and the second access operation. The first access operation includes picking up the substrates from the first sending units but does not include placing the substrates on the first sending units. The second access operation includes placing the substrates on the second sending units, but does not include picking up the substrates from the second sending units. Such is preferable. The intermediate transport mechanism performs the first access operation including operation of unloading the substrates from the first sending units. Consequently, the intermediate transport mechanism is capable of unloading the substrates from the first sending units efficiently. The first access operation performed by the intermediate transport mechanism does not include loading the substrates into the first sending units. Consequently, this simplifies operation of the intermediate transport mechanism with respect to the first sending units. Accordingly, this also simplifies control of the intermediate transport mechanism by the controller. The second access operation performed by the intermediate transport mechanism includes loading the substrates into the second sending units. Consequently, the intermediate transport mechanism is capable of loading the substrates into the second sending units efficiently. The intermediate transport mechanism performs the second access operation not including operation of unloading the substrates from the second sending units. Consequently, this simplifies operation of the intermediate transport mechanism with respect to the second sending units. Accordingly, this also simplifies control of the intermediate transport mechanism by the controller.

In the substrate treating apparatus described above, it is preferred that the first sending units are arranged in line in an upward/downward direction, and the second sending units are arranged in line in the upward/downward direction. Since the first sending units are arranged in line in the upward/downward direction, the intermediate transport mechanism allows easy access to the first sending units individually. Since the second sending units are arranged in line in the upward/downward direction, the intermediate transport mechanism allows easy access to the second sending units individually.

In the above-described substrate treating apparatus, the first intermediate part includes a plurality of first return units where one substrate is placed individually, and the second intermediate part includes a plurality of second return units where one substrate is placed individually. The intermediate transport mechanism performs the first access operation and the second access operation. The first access operation includes placing the substrates on the first return units but does not include picking up the substrates from the first return units. The second access operation includes picking up the substrates from the second return units, but does not include placing the substrates on the second return units. Such is preferable. The first access operation performed by the intermediate transport mechanism includes loading the substrates into the first return units. Consequently, the intermediate transport mechanism is capable of loading the substrate into the first return units efficiently. The intermediate transport mechanism performs the first access operation not including operation of unloading the substrates from the first return units. Consequently, this simplifies operation of the intermediate transport mechanism with respect to the first return units. Accordingly, this also simplifies control of the intermediate transport mechanism by the controller. The intermediate transport mechanism performs the second access operation including operation of unloading the substrates from the second return units. Consequently, the intermediate transport mechanism is capable of unloading the substrates from the second return units efficiently. The second access operation performed by the intermediate transport mechanism does not include loading the substrates into the second return units. Consequently, this simplifies operation of the intermediate transport mechanism with respect to the second return units. Accordingly, this also simplifies control of the intermediate transport mechanism by the controller.

In the substrate treating apparatus described above, it is preferred that the first return units are arranged in line in the upward/downward direction, and the second return units are arranged in line in the upward/downward direction. Since the first return units are arranged in line in the upward/downward direction, the intermediate transport mechanism allows easy access to the first return units individually. Since the second return units are arranged in line in the upward/downward direction, the intermediate transport mechanism allows easy access to the second return units individually.

In the substrate treating apparatus described above, it is preferred that the first return units are positioned so as to overlap the first sending units in plan view, and the second return units are positioned so as to overlap the second sending units in plan view. The intermediate transport mechanism allows easy access to both the first sending units and the first return units. The intermediate transport mechanism allows easy access to both the second sending units and the second return units.

In the substrate treating apparatus described above, it is preferred that at least one of the first sending units is one of a heat treating unit that performs a heat treatment to the substrate and a mounting unit only used for placing the substrate without performing any treatment to the substrate, and at least one of the first return units is the other of the heat treating unit and the mounting unit, the mounting unit is positioned so as to overlap the heat treating unit in plan view, and the heat treating unit and the mounting unit are arranged one by one alternatively. The heat treating unit has a relatively small size. For instance, the size of the heat treating unit is smaller than a liquid treating unit. Here, the liquid treating unit is a treating unit that performs treatment to the substrate by supplying a treatment liquid to the substrate. The mounting unit has a relatively small size.

Accordingly, the first intermediate part may include a relatively large number of heat treating units and a relatively large number of mounting units. This allows suitable prevention of jammed transportation of the substrate in the first interference. In other words, this allows suitable prevention of the jammed transportation of the substrate between the first transport mechanism and the intermediate transport mechanism. The mounting unit is positioned so as to overlap the heat treating unit in plan view. Accordingly, the intermediate transport mechanism allows easy access to both the heat treating unit and the mounting unit. The heat treating unit and the mounting unit are arranged one by one alternately. Accordingly, the intermediate transport mechanism allows easier access to both the heat treating unit and the mounting unit.

In the substrate treating apparatus described above, it is preferred that the substrate treating apparatus includes a plurality of shelves that are arranged in the upward/downward direction and support the heat treating unit and the mounting unit, the number of heat treating units disposed between adjacent two of the shelves in the vertically is one, and the number of mounting units disposed between adjacent two of the shelves in the upward/downward direction is one. Such is preferable. Since the shelves are arranged in line in the upward/downward direction, the heat treating unit and the mounting unit are arrangeable suitably in the shelves. One heat treating unit is disposed between adjacent two of the shelves in the upward/downward direction, and one mounting unit is disposed between adjacent two of the shelves in the vertically. In other words, each of the heat treating units and each of the mounting units are arranged between the two adjacent shelves in the upward/downward direction. Accordingly, the heat treating unit and the mounting unit are easily arrangeable one by one alternately in the upward/downward direction.

In the above-described substrate treating apparatus, the heat treating unit includes a first plate on which the substrate is placed, a second plate that is disposed lateral of the first plate and on which the substrate is placed, and a lid disposed above the second plate. The mounting unit includes a mounting plate that is disposed above the first plate and lateral of the lid and on which the substrate is placed. The intermediate transport mechanism performs the first access operation of accessing the first plate and the mounting plate. Such is preferable. The second plate is disposed lateral of the first plate. The lid is disposed above the second plate. The mounting plate is disposed above the first plate and lateral of the lid. This achieves a small installation space of the heat treating unit and the mounting unit. Consequently, the first intermediate part may include a relatively large number of heat treating units and a relatively large number of mounting units.

It is preferred in the substrate treating apparatus mentioned above that at least either the first intermediate part or the second intermediate part performs further treatment to the placed substrate. If the first intermediate part performs treatment to the substrate placed thereon, the substrate is capable of undergoing the treatment effectively in the first intermediate part while being transported to the first intermediate part effectively. This achieves enhanced throughput of the substrate treating apparatus effectively. If the second intermediate part performs treatment to the substrate placed thereon, the substrate is capable of undergoing the treatment effectively in the second intermediate part while being transported to the second intermediate part effectively. This achieves enhanced throughput of the substrate treating apparatus effectively.

It is preferred in the substrate treating apparatus mentioned above that the treatment is a non-liquid treatment that is performed without supplying any treatment liquid to the substrate. A space for a non-liquid treatment is relatively small. For instance, a space for the non-liquid treatment is smaller than a space for liquid treatment. Accordingly, if the first intermediate part performs the treatment to the substrate, the first intermediate part is capable of performing non-liquid treatment to the substrate effectively. This allows suitable prevention of jammed transportation of the substrate in the first intermediate part. Likewise, if the second intermediate part performs the treatment to the substrate, the second intermediate part is capable of performing non-liquid treatment to the substrate effectively. This allows suitable prevention of jammed transportation of the substrate in the second intermediate part.

It is preferred in the substrate treating apparatus mentioned above that the treatment is a heat treatment that is performed without supplying any treatment liquid to the substrate. A space for the heat treatment is relatively small. For instance, a space for the heat treatment is smaller than a space for the liquid treatment. Accordingly, if the first intermediate part performs the treatment to the substrate, the first intermediate part is capable of performing the heat treatment to the substrate effectively. This allows suitable prevention of jammed transportation of the substrate in the first intermediate part. Likewise, if the second intermediate part performs the treatment to the substrate, the second intermediate part is capable of performing the heat treatment to the substrate effectively. This allows suitable prevention of jammed transportation of the substrate in the second intermediate part.

It is preferred in the substrate treating apparatus mentioned above that at least either the first intermediate part or the second intermediate part further inspects the placed substrate. If the first intermediate part inspects the substrate placed thereon, the substrate is capable of undergoing the inspection effectively in the first intermediate part while being transported to the first intermediate part effectively. This achieves enhanced throughput of the substrate treating apparatus effectively. Likewise, if the second intermediate part inspects the substrate placed thereon, the substrate is capable of undergoing the inspection effectively in the second intermediate part while being transported to the second intermediate part effectively. This achieves enhanced throughput of the substrate treating apparatus effectively.

In the substrate treating apparatus described above, it is preferred that the first intermediate part is disposed out of a second area where the second transport mechanism is capable of transporting the substrate, and the second intermediate part is disposed out of a first area where the first transport mechanism is capable of transporting the substrate. The first intermediate part is disposed out of the region where the second transport mechanism is capable of transporting the substrate. Accordingly, the first transport mechanism and the intermediate transport mechanism are capable of accessing the first intermediate part without any interference with the second transport mechanism. Likewise, the second intermediate part is disposed out of the region where the first transport mechanism is capable of transporting the substrate. Accordingly, the intermediate transport mechanism and the second transport mechanism are capable of accessing the second intermediate part without any interference with the first transport mechanism.

It is preferred in the substrate treating apparatus mentioned above that an intermediate area where the intermediate transport mechanism is capable of transporting the substrate is substantially circular in plan view. The intermediate transport mechanism allows easy access to both the first intermediate part and the second intermediate part.

It is preferred in the substrate treating apparatus mentioned above that the intermediate transport mechanism includes a rotator that is rotatable around a rotation axis parallel to the upward/downward direction, and a holder that is supported on the rotator for holding the substrate, and that the rotator is immovable in a horizontal direction. The rotator is immovable in the horizontal direction. Accordingly, the intermediate transport mechanism is capable of accessing both the first intermediate part and the second intermediate part more easily.

Another aspect of the present invention provides a substrate treating apparatus. The substrate treating apparatus includes three or more transport mechanisms that are disposed in a forward/rearward direction, two or more intermediate parts that are disposed between adjacent two of the transport mechanisms in the forward/rearward direction and on which substrates are placed, and a controller that performs control to the transport mechanisms. It is assumed that a forwardmost transport mechanism of the transport mechanisms is a front end transport mechanism, a rearmost transport mechanism of the transport mechanisms is a rear end transport mechanism, all transport mechanisms except for the front end transport mechanism and the rear end transport mechanism are an intermediate transport mechanism, the intermediate part adjacent to a rear side of the front end transport mechanism is a front end intermediate part, and the intermediate part adjacent to a front side of the rear end transport mechanism is a rear end intermediate part. The intermediate transport mechanism repeatedly performs cycle operation in accordance with the control by the controller. The cycle operation performed by the intermediate transport mechanism includes only a first access operation of accessing the intermediate part adjacent to a front side of the intermediate transport mechanism, and a second access operation of accessing the intermediate part adjacent to a rear side of the intermediate transport mechanism.

The cycle operation performed by the intermediate transport mechanism includes only the first access operation and the second access operation. In other words, the number of access operations included in the cycle operation by the intermediate transport mechanism is only two. As noted above, the number of access operations included in the cycle operation by the intermediate transport mechanism is relatively small. Accordingly, relatively high transportation efficiency by the intermediate transport mechanism is obtainable. This achieves suitably enhanced throughput of the substrate treating apparatus.

The intermediate part is disposed between the two transport mechanisms adjacent to each other in the forward/rearward direction. For instance, if the number of transport mechanisms arranged in the forward/rearward direction is three, the number of intermediate parts is two. If the number of transport mechanisms arranged in the forward/rearward direction is N (N: an integer of three or more), the number of intermediate parts is (N−1).

The substrate is placed on the intermediate part. The two intermediate transport mechanisms adjacent to each other in the forward/rearward direction place the substrate on the intermediate part between the two transport mechanisms adjacent to each other in the forward/rearward direction. Accordingly, the substrate is capable of being transported between the transport mechanisms adjacent to each other in the forward/rearward direction via the intermediate part.

The intermediate transport mechanism is a transport mechanism except for the front end transport mechanism and the rear end transport mechanism. For instance, if the number of transport mechanisms arranged in the forward/rearward direction is three, the intermediate transport mechanism is one. If the number of transport mechanisms arranged in the forward/rearward direction is N (N: an integer of three or more), the number of intermediate transport mechanisms is (N−2).

The intermediate transport mechanism performs the first access operation of accessing the intermediate part adjacent to the front side of the intermediate transport mechanism. The intermediate transport mechanism performs the second access operation of accessing the intermediate part adjacent to the rear side of the intermediate transport mechanism. Accordingly, the intermediate transport mechanism performs the cycle operation repeatedly, thereby achieving alternate access to the intermediate part adjacent to the front side of the intermediate transport mechanism and the intermediate part adjacent to the rear side of the intermediate transport mechanism. As noted above, the cycle operation performed by the intermediate transport mechanism includes only the first access operation and the second access operation. Accordingly, the intermediate transport mechanism achieves effective access to the intermediate part adjacent to the front side of the intermediate transport mechanism and the intermediate part adjacent to the rear side of the intermediate transport mechanism. Accordingly, the intermediate transport mechanism allows efficient transportation of the substrate between the front end intermediate part and the rear end intermediate part.

Here, the "intermediate part adjacent to the transport mechanism" means an intermediate part that is disposed within the region where the transport mechanism is capable of transporting the substrate. For instance, the "intermediate part adjacent to the front side of the intermediate transport mechanism" means the intermediate part that is disposed forward of the intermediate transport mechanism and within the region where the intermediate transport mechanism is capable of transporting the substrate.

In the above-described substrate treating apparatus, the front end transport mechanism places the substrate on the front end intermediate part, the rear end transport mechanism picks up the substrate from the rear end intermediate part. The intermediate transport mechanism performs the first access operation including operation of picking up the substrate from the intermediate part adjacent to the front side of the intermediate transport mechanism, and the second access operation including operation of placing the substrate on the intermediate part adjacent to the rear side of the intermediate transport mechanism. The intermediate transport mechanism performs the cycle operation, thereby receiving the substrate from the front end transport mechanism via the front end intermediate part, and transporting the substrate from the front end intermediate part to the rear end intermediate part, and passing the substrate to the front end transport mechanism via the rear end intermediate part. Such is preferable. The intermediate transport mechanism performs the first access operation including the operation of unloading the substrate from the intermediate part adjacent to the front side of the intermediate transport mechanism. Consequently, the intermediate transport mechanism is capable of unloading the substrate from the intermediate part adjacent to the front side of the intermediate transport mechanism efficiently. The intermediate transport mechanism performs the second access operation including the operation of loading the substrate into the intermediate part adjacent to the rear side of the intermediate transport mechanism. Consequently, the intermediate transport mechanism is capable of loading the substrate into the intermediate part adjacent to the rear side of the intermediate transport mechanism efficiently. Accordingly, the intermediate transport mechanism performs the cycle operation repeatedly, thereby achieving effective transportation of the substrate from the front end intermediate part to the rear end intermediate part. The front end transport mechanism loads the substrate into the front end intermediate part. Accordingly, the intermediate transport mechanism performs the cycle operation repeatedly, thereby achieving effective receipt of the substrate from the front end transport mechanism via the front end intermediate part. The rear end transport mechanism unloads the substrate from the rear end intermediate part. Accordingly, the intermediate transport mechanism performs the cycle operation repeatedly, thereby achieving effective deliver of the substrate to the rear end transport mechanism via the rear end intermediate part.

In the above-described substrate treating apparatus, the front end transport mechanism picks up the substrate from the front end intermediate part, the rear end transport mechanism places the substrate on the rear end intermediate part. The intermediate transport mechanism performs the first access operation including operation of placing the substrate on the intermediate part adjacent to the front side of the intermediate transport mechanism, and the second access operation including operation of picking up the substrate from the intermediate part adjacent to the rear side of the intermediate transport mechanism. The intermediate transport mechanism performs the cycle operation, thereby receiving the substrate from the rear end transport mechanism via the rear end intermediate part, and transporting the substrate from the rear end intermediate part to the front end intermediate part, and passing the substrate to the front end transport mechanism via the front end intermediate part. Such is preferable. The intermediate transport mechanism performs the first access operation including the operation of loading the substrate into the intermediate part adjacent to the front side of the intermediate transport mechanism. Consequently, the intermediate transport mechanism is capable of loading the substrate into the intermediate part adjacent to the front side of the intermediate transport mechanism efficiently. The intermediate transport mechanism performs the second access operation including the operation of unloading the substrate from the intermediate part adjacent to the rear side of the intermediate transport mechanism. Consequently, the intermediate transport mechanism is capable of unloading the substrate from the intermediate part adjacent to the rear side of the intermediate transport mechanism efficiently. Accordingly, the intermediate transport mechanism performs the cycle operation repeatedly, thereby achieving effective transportation of the substrate from the rear end intermediate part to the front end intermediate part. The front end transport mechanism unloads the substrate from the front end intermediate part. Accordingly, the intermediate transport mechanism performs the cycle operation repeatedly, thereby achieving effective deliver of the substrate to the front end transport mechanism via the front end intermediate part. The rear end transport mechanism loads the substrate into the rear end intermediate part. Accordingly, the intermediate transport mechanism performs the cycle operation repeatedly, thereby achieving effective receipt of the substrate from the rear end transport mechanism via the rear end intermediate part.

It is preferred in the substrate treating apparatus mentioned above that at least one of the intermediate parts further performs treatment to the placed substrate. The substrate is capable of undergoing the treatment effectively in at least one of the intermediate parts while being transported to the intermediate parts effectively. This achieves enhanced throughput of the substrate treating apparatus effectively.

It is preferred in the substrate treating apparatus mentioned above that the front end intermediate part further performs treatment to the placed substrate. The substrate is capable of undergoing the treatment effectively in the front end intermediate part while being transported to the front end intermediate part effectively. This achieves enhanced throughput of the substrate treating apparatus effectively.

In the above-described substrate treating apparatus, the apparatus includes a carrier mount table that is disposed in front of the front end transport mechanism and on which a carrier for accommodating the substrate is mounted. The front end transport mechanism repeatedly performs cycle operation in accordance with the control by the controller. The cycle operation by the front end transport mechanism only includes third access operation of accessing the carrier on the carrier mount table, and fourth access operation of accessing the front end intermediate part. The cycle operation performed by the front end transport mechanism includes only the third access operation and the fourth access operation. In other words, the number of access operations included in the cycle operation by the front end transport mechanism is only two. As noted above, the number of access operations included in the cycle operation by the front end transport mechanism is relatively small. Accordingly, relatively high transportation efficiency by the front end transport mechanism is obtainable. This achieves suitably enhanced throughput of the substrate treating apparatus.

The front end transport mechanism performs the third access operation of accessing the carrier mounted on the carrier mount table. The front end transport mechanism performs the fourth access operation of accessing the front end intermediate part. Accordingly, the front end transport mechanism performs the cycle operation repeatedly, thereby accessing the carrier and the front end intermediate part alternately. As described above, the cycle operation performed by the front end transport mechanism includes only the third access operation and the fourth access operation. Accordingly, the front end transport mechanism is capable of accessing the carrier and the front end intermediate part efficiently. Accordingly, the front end transport mechanism allows efficient transportation of the substrate between the carrier and the front end intermediate part.

In the above-described substrate treating apparatus, the apparatus includes a rear end processing part that is disposed in any one of a lateral position of the rear end transport mechanism and a rear position of the rear end transport mechanism for performing treatment to the substrate. The rear end transport mechanism repeatedly performs cycle operation in accordance with the control by the controller. The cycle operation by the rear end transport mechanism only includes a third access operation of accessing the rear end intermediate part, and a fourth access operation of accessing the rear end processing part. The cycle operation performed by the rear end transport mechanism includes only the third access operation and the fourth access operation. In other words, the number of access operations included in the cycle operation by the rear end transport mechanism is only two. As noted above, the number of access operations included in the cycle operation by the rear end transport mechanism is relatively small. Accordingly, relatively high transportation efficiency by the rear end transport mechanism is obtainable. This achieves suitably enhanced throughput of the substrate treating apparatus.

The rear end transport mechanism performs the third access operation of accessing the rear end intermediate part. The rear end transport mechanism performs the fourth access operation of accessing the rear end processing part. Accordingly, the rear end transport mechanism performs the cycle operation repeatedly, thereby accessing the rear end processing part and the rear end intermediate part alternately. As described above, the cycle operation performed by the rear end transport mechanism includes only the third access operation and the fourth access operation. Accordingly, the rear end transport mechanism is capable of accessing the rear end processing part and the rear end intermediate part efficiently. Accordingly, the rear end transport mechanism allows efficient transportation of the substrate between the rear end intermediate part and the rear end processing part.

The rear end processing part performs the treatment to the substrate. Accordingly, the substrate is capable of undergoing the treatment effectively in the rear end processing part while being transported to the rear end processing part effectively. This achieves enhanced throughput of the substrate treating apparatus effectively.

The present specification also discloses an aspect of a substrate treating apparatus as under.

It is preferred in the substrate treating apparatus mentioned above that at least one among the first sending units and the second sending units is a treating unit that performs further treatment to the placed substrate. If at least one of the first sending units is the treating unit, the intermediate transport mechanism is capable of unloading the substrate from the treating unit efficiently. Accordingly, the substrate is capable of undergoing the treatment effectively in the first sending unit while being transported to the first sending unit effectively. This achieves enhanced throughput of the substrate treating apparatus effectively. If at least one of the second sending units is the treating unit, the intermediate transport mechanism is capable of loading the substrate into the treating unit efficiently. Accordingly, the substrate is capable of undergoing the treatment effectively in the second sending unit while being transported to the second sending unit effectively. This achieves enhanced throughput of the substrate treating apparatus effectively.

It is preferred in the substrate treating apparatus mentioned above that the treating unit is a non-liquid treating unit that performs treatment to the substrate without supplying any treatment liquid to the substrate. The non-liquid treating unit has a relatively small size. For instance, the size of the non-liquid treating unit is smaller than a liquid treating unit. If the first sending units are the non-liquid treating unit, the first intermediate part may include a relatively large number of non-liquid treating units as the first sending units. Consequently, this allows suitable prevention of the jammed transportation of the substrate between the first transport mechanism and the intermediate transport mechanism. If the second sending units are the non-liquid treating unit, the second intermediate part may include a relatively large number of non-liquid treating units as the second sending units. Consequently, this allows suitable prevention of the jammed transportation of the substrate between the intermediate transport mechanism and the second transport mechanism.

It is preferred in the substrate treating apparatus mentioned above that the treating unit is a heat treating unit that performs a heat treatment to the substrate. The heat treating unit has a relatively small size. For instance, the size of the heat treating unit is smaller than a liquid treating unit. If the first sending units are the heat treating unit, the first intermediate part may include a relatively large number of heat treating units as the first sending units. This allows suitable prevention of jammed transportation of the substrate in the first sending units. If the second sending units are the heat treating unit, the second intermediate part may include a relatively large number of heat treating units as the second sending units. This allows suitable prevention of jammed transportation of the substrate in the second sending units.

It is preferred in the substrate treating apparatus mentioned above that at least one among the first return units and the second return units is an inspecting unit that inspects the substrate. If at least one of the first return units is the inspecting unit, the intermediate transport mechanism is capable of loading the substrate into the inspecting unit efficiently. Accordingly, the substrate is capable of undergoing the inspection effectively in the first return unit while being transported to the first return unit effectively. This achieves enhanced throughput of the substrate treating apparatus effectively. If at least one of the second return units is the inspecting unit, the intermediate transport mechanism is capable of unloading the substrate from the inspecting unit efficiently. Accordingly, the substrate is capable of undergoing the inspection effectively in the second return unit while being transported to the second return unit effectively. This achieves enhanced throughput of the substrate treating apparatus effectively.

It is preferred in the substrate treating apparatus mentioned above that the front end intermediate part includes the treating unit that further performs treatment to one placed substrate, and the front end transport mechanism performs at least either placing the substrate on the treating unit or picking up the substrate from the treating unit. The substrate is capable of undergoing the treatment effectively in the front end intermediate part while being transported to the front end intermediate part effectively. This achieves enhanced throughput of the substrate treating apparatus effectively.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 9 is a front view of an interior of the indexer block.

FIG. 10 is a front view of a first transportation block.

FIG. 11 is a front view of a second transportation block.

DESCRIPTION OF EMBODIMENTS

The following describes a substrate treating apparatus of the present invention with reference to drawings.

First Embodiment

Summary of Substrate Treating Apparatus

Figure 1:
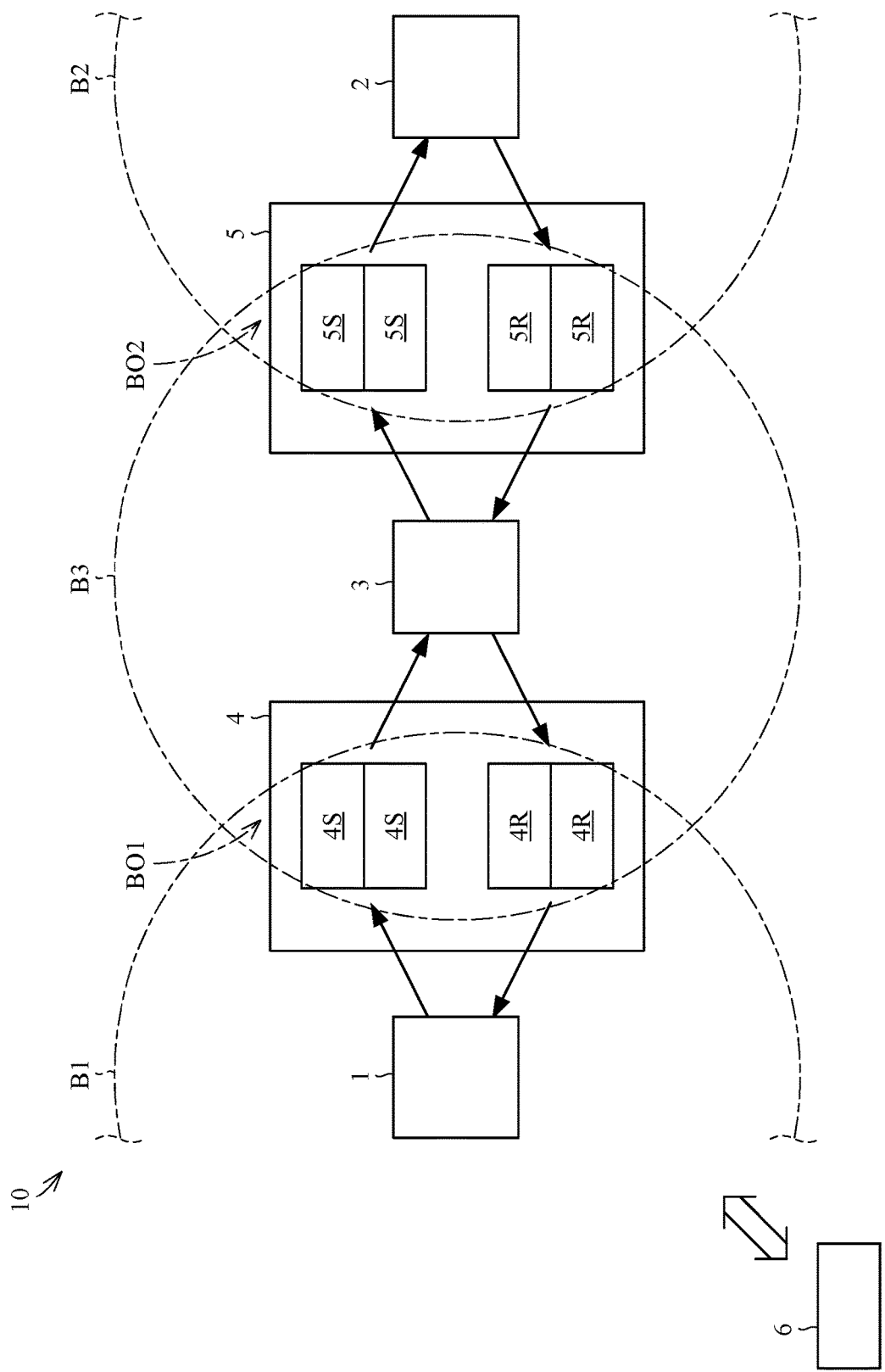
FIG. 1 is a conceptual view of a substrate treating apparatus according to a first embodiment.
Figure 4:
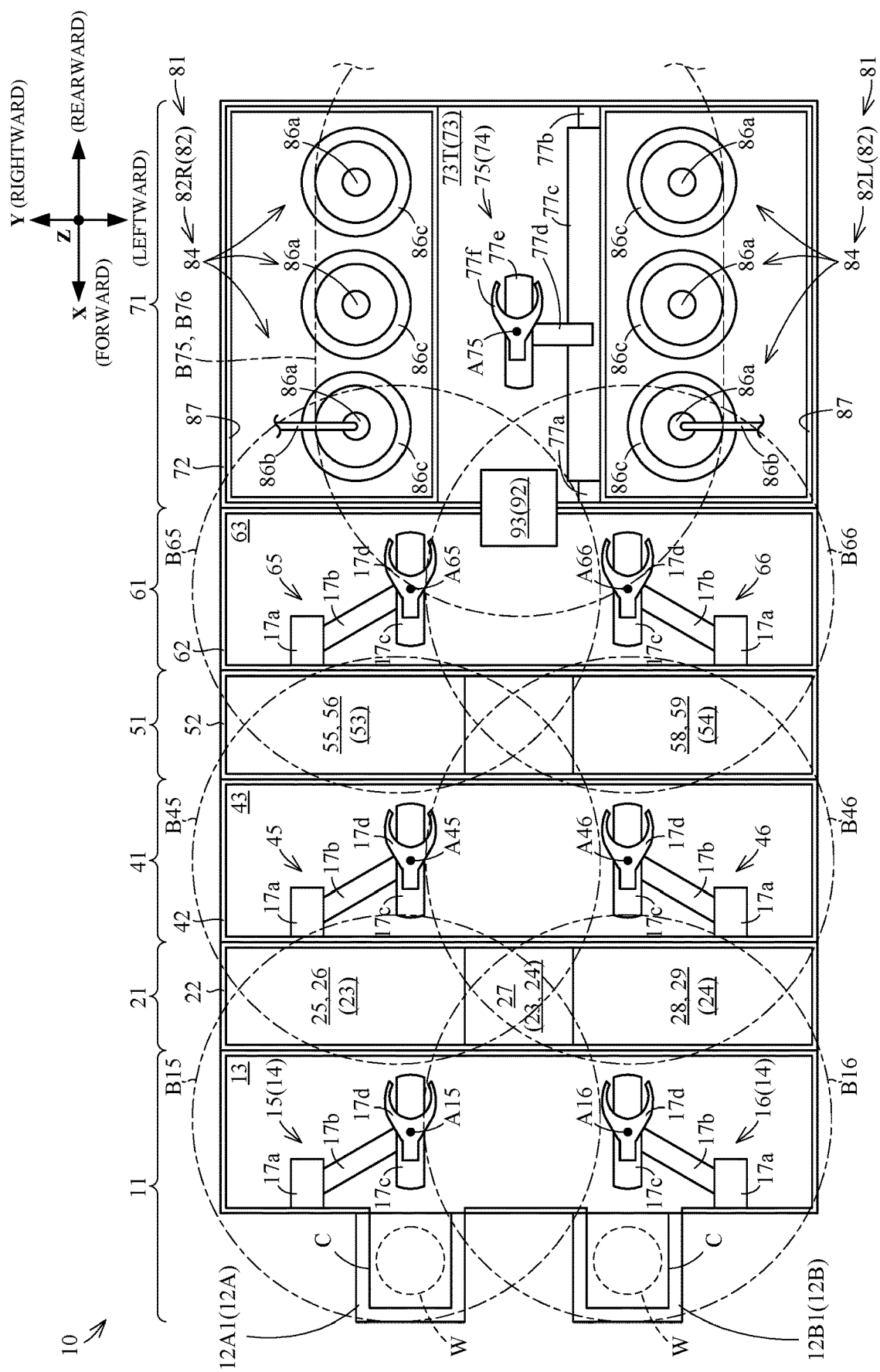
FIG. 4 is a plan view of the substrate treating apparatus according to the first embodiment.

FIG. 1 is a conceptual view of a substrate treating apparatus according to the first embodiment 1. A substrate treating apparatus 10 according to the first embodiment performs a succession of treatment to substrates (e.g., semiconductor wafers) W. Here, the substrates W are illustrated in FIG. 4, mentioned later.

Examples of the substrates W include a semiconductor wafer, a substrate for liquid crystal display, a substrate for organic electroluminescence (EL), a substrate for flat plasma display (FPD), a substrate for optical display, a magnetic disk substrate, an optical disk substrate, a magneto-optical disk substrate, a substrate for photomask, and a solar cell substrate. The substrates W each have a thin flat plate shape. The substrate W is substantially circular in plan view.

The substrate treating apparatus 10 includes a first transport mechanism 1 that transports the substrates W, a second transport mechanism 2 that transports the substrates W, and an intermediate transport mechanism 3 that transports the substrates W. The intermediate transport mechanism 3 is disposed between the first transport mechanism 1 and the second transport mechanism 2.

FIG. 1 schematically illustrates a first area B1, a second area B2, and an intermediate area B3. The first area B1 is an area where the first transport mechanism 1 is capable of transporting the substrates W. In other words, the first area B1 is an area where the first transport mechanism 1 is capable of performing access. The first transport mechanism 1 is incapable of transporting the substrates W out of the first area B1. The substrates W are moved within the first area B1 by the first transport mechanism 1. The second area B2 is an area where the second transport mechanism 2 is capable of transporting the substrates W. In other words, the second area B2 is an area where the second transport mechanism 2 is capable of performing access. The intermediate area B3 is an area where the intermediate transport mechanism 3 is capable of transporting the substrates W. In other words, the intermediate area B3 is an area where the intermediate transport mechanism 3 is capable of performing access. The first area B1 partially overlaps the intermediate area B3. The second area B2 partially overlaps the intermediate area B3. The first area B1 does not overlap the second area B2.

FIG. 1 schematically illustrates a first overlapped area BO1, and a second overlapped area BO2. The first overlapped area BO1 is an area where the first area B1 overlaps the intermediate area B3. In other words, the first overlapped area BO1 is an area where the first transport mechanism 1 and the intermediate transport mechanism 3 are capable of transporting the substrates W. The second overlapped area BO2 is an area where the second area B2 overlaps the intermediate area B3. In other words, the second overlapped area BO2 is an area where the second transport mechanism 2 and the intermediate transport mechanism 3 are capable of transporting the substrates W.

The substrate treating apparatus 10 includes a first intermediate part 4 and a second intermediate part 5. The substrates W are placed in the first intermediate part 4. The substrates W are placed in the second intermediate part 5. The first intermediate part 4 is disposed within the first overlapped area BO1. The first intermediate part 4 is disposed out of the second area B2. The second intermediate part 5 is disposed within the second overlapped area BO2. The second intermediate part 5 is disposed out of the first area B1.

The first intermediate part 4 may perform further treatment to the substrates W placed therein. The treatment performed in the first intermediate part 4 may be non-liquid treatment. The non-liquid treatment is performed without supplying any treatment liquid to the substrates W. The treatment performed in the first intermediate part 4 may be a heat treatment. The heat treatment is one type of the non-liquid treatment. Likewise, the second intermediate part 5 may perform further treatment to the substrates W placed therein. The treatment performed in the second intermediate part 5 may be non-liquid treatment. The treatment performed in the second intermediate part 5 may be a heat treatment.

The first intermediate part 4 may further inspect the substrates W placed therein. Likewise, the second intermediate part 5 may further inspect the substrates W placed therein.

The first intermediate part 4 includes a plurality of first sending units 4S. One of the substrates W is placed in one of the first sending units 4S. The substrates W transported from the first transport mechanism 1 to the intermediate transport mechanism 3 are exclusively placed in the first sending units 4S.

The first intermediate part 4 includes a plurality of first return units 4R. One of the substrates W is placed in one of the first return units 4R. The substrates W transported from the intermediate transport mechanism 3 to the first transport mechanism 1 are exclusively placed in the first return units 4R.

The second intermediate part 5 includes a plurality of second sending units 5S. One of the substrates W is placed in one of the second sending units 5S. The substrates W transported from the intermediate transport mechanism 3 to the second transport mechanism 2 are exclusively placed in the second sending units 5S.

The second intermediate part 5 includes a plurality of second return units 5R. One of the substrates W is placed in one of the second return units 5R. The substrates W transported from the second transport mechanism 2 to the intermediate transport mechanism 3 are exclusively placed in the second return units 5R.

Each of the first sending units 4S is, for example, any one of a mounting unit, a treating unit, and an inspecting unit. Each of the first return units 4R is, for example, any one of a mounting unit, a treating unit, and an inspecting unit. Each of the second sending units 5S is, for example, any one of a mounting unit, a treating unit, and an inspecting unit. Each of the second return units 5R is, for example, any one of a mounting unit, a treating unit, and an inspecting unit.

The mounting unit performs no treatment to the substrates W. One of the substrates W is merely placed on the mounting unit.

The treating unit performs further treatment to the one placed substrate W. The treating unit may be a liquid treating unit. Here, the liquid treating unit performs treatment to the substrate W by supplying the treatment liquid to the substrate W. The liquid treating unit is, for example, a coating unit that forms a coating film on the substrate W, a developing unit that performs development of the substrate W, or a cleaning unit that cleans the substrate W. The treating unit may be a non-liquid treating unit. Here, the non-liquid treating unit performs treatment to the substrate W without supplying any treatment liquid to the substrate W. The non-liquid treating unit is, for example, a heat treating unit that performs a heat treatment to the substrate, or an edge exposure treating unit that exposes a peripheral edge of the substrate W.

The inspecting unit performs further inspection to the one placed substrate W. The following exemplarily describes the details of the inspection performed by the inspecting unit.

a shape, a condition, or defect of a surface of the substrate W a shape, a condition, a film thickness, or defect of a coating film formed on the surface of the substrate W a shape, a condition, a, or defect of a pattern formed on the surface of the substrate W Here, at least one among the first sending units 4S and the second sending units 5S may be the treating unit. At least one of the first return units 4R and the second return unit 5R may be the treating unit. At least one of the first sending units 4S and the first return units 4R may be the treating unit. At least one of the second sending units 5S and the second return units 5R may be the treating unit.

The treating unit as the first sending units 4S may be the non-liquid treating unit. The treating unit as the first sending units 4S may be the heat treating unit. Likewise, the treating unit as the first return units 4R, the second sending units 5S, or the second return units 5R may be the non-liquid treating unit. The treating unit as the first return units 4R, the second sending units 5S, or the second return units 5R may be the heat treating unit.

At least one of the first return units 4R and the second return unit 5R may be the inspecting unit.

The substrate treating apparatus 10 further includes a controller 6. The controller 6 performs control of the first transport mechanism 1, the second transport mechanism 2, and the intermediate transport mechanism 3.

The controller 6 is implemented by a central processing unit (CPU) that performs various processes, a RAM (Random-Access Memory) as a workspace of arithmetic processing, and a storage medium such as a fixed disk. The storage medium stores various types of information such as processing recipes for processing the substrate W (processing programs) and information about identification of the substrates W.

The first transport mechanism 1 operates in accordance with the control by the controller 6 as below. The first transport mechanism 1 places the substrates W on the first intermediate part 4. Specifically, the first transport mechanism 1 loads the substrates W into the first sending units 4S. The first transport mechanism 1 picks up the substrates W from the first intermediate part 4. Specifically, the first transport mechanism 1 unloads the substrates W from the first return unit 4R.

The second transport mechanism 2 operates in accordance with the control by the controller 6 as below. The second transport mechanism 2 picks up the substrates W from the second intermediate part 5. Specifically, the second transport mechanism 2 unloads the substrates W from the second sending unit 5S. The second transport mechanism 2 places the substrates W on the second intermediate part 5. Specifically, the second transport mechanism 2 loads the substrates W into the second return units 5R.

Figure 2:
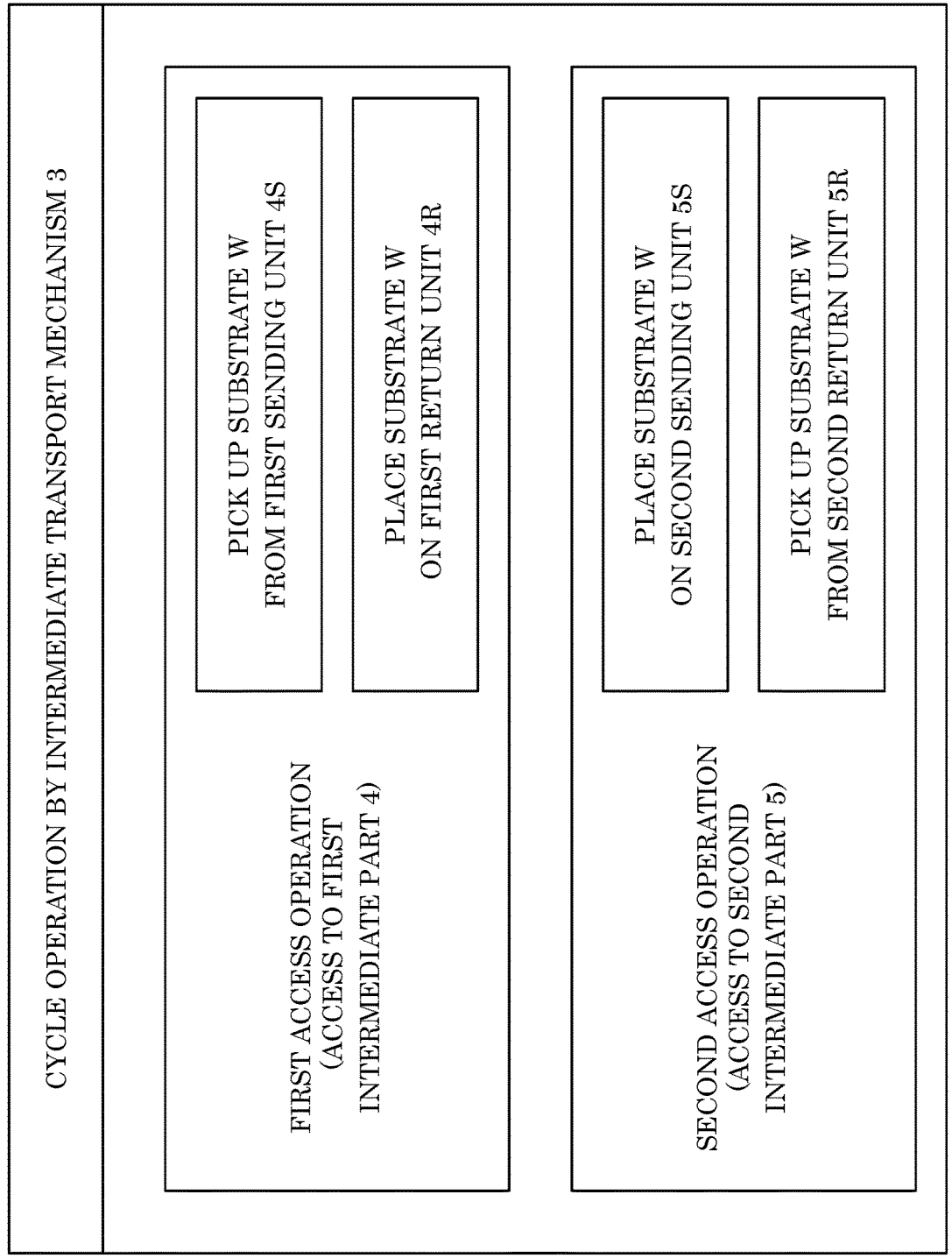
FIG. 2 schematically illustrates cycle operation by an intermediate transport mechanism.

FIG. 2 schematically illustrates cycle operation by the intermediate transport mechanism 3. The intermediate transport mechanism 3 repeats cycle operation illustrated in FIG. 2 in accordance with the control by the controller 6. The cycle operation performed by the intermediate transport mechanism 3 includes only a first access operation and a second access operation. The intermediate transport mechanism 3 performs the first access operation and the second access operation alternately.

The first access operation performed by the intermediate transport mechanism 3 is operation that the intermediate transport mechanism 3 accesses the first intermediate part 4.

The first access operation performed by the intermediate transport mechanism 3 includes operation of picking up the substrates W from the first intermediate part 4. Specifically, the first access operation by the intermediate transport mechanism 3 includes operation of unloading the substrates W from the first sending units 4S. On the other hand, the first access operation by the intermediate transport mechanism 3 does not include operation of loading the substrates W into the first sending units 4S.

The first access operation performed by the intermediate transport mechanism 3 includes operation of placing the substrates W on the first intermediate part 4. Specifically, the first access operation by the intermediate transport mechanism 3 includes operation of loading the substrates W into the first return units 4R. On the other hand, the first access operation by the intermediate transport mechanism 3 does not include operation of unloading the substrates W from the first return units 4R.

As described above, in the first access operation, the intermediate transport mechanism 3 does not perform both the operation of loading the substrates W and the operation of unloading the substrates to the same unit (specifically, one of the first sending units 4S and the first return units 4R).

The second access operation performed by the intermediate transport mechanism 3 is operation that the intermediate transport mechanism 3 accesses the second intermediate part 5.

The second access operation by the intermediate transport mechanism 3 includes operation of placing the substrates W on the second intermediate part 5. Specifically, the second access operation by the intermediate transport mechanism 3 includes operation of loading the substrates W into the second sending units 5S. On the other hand, the second access operation by the intermediate transport mechanism 3 does not include operation of unloading the substrates W from the second sending units 5S.

The second access operation performed by the intermediate transport mechanism 3 includes operation of picking up the substrates W from the second intermediate part 5. Specifically, the second access operation by the intermediate transport mechanism 3 includes operation of unloading the substrates W from the second return units 5R. On the other hand, the second access operation performed by the intermediate transport mechanism 3 does not include loading the substrate W into the second return units 5R.

As described above, in the second access operation, the intermediate transport mechanism 3 does not perform both the operation of loading the substrates W and the operation of unloading the substrates to the same unit (specifically, one of the second sending units 5S and the second return units 5R).

The intermediate transport mechanism 3 performs the cycle operation one time, thereby transporting the substrates W from the first intermediate part 4 to the second intermediate part 5 and vice versa. Specifically, the intermediate transport mechanism 3 performs the cycle operation one time, thereby transporting the substrates W from the first sending units 4S to the second sending units 5S and from the second return units 5R to the first return units 4R.

Figure 3A:
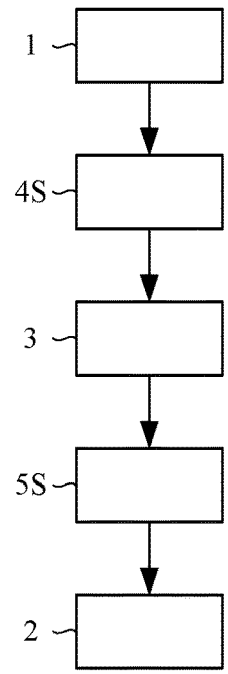
FIGS. 3A and 3B each schematically illustrate a transportation path of a substrate.

The following describes operation of the substrate treating apparatus 10 with reference to FIGS. 2 and 3A. FIG. 3A schematically illustrates a transportation path of the substrate W. The control by the controller 6 causes the substrates W to be sent from the first transport mechanism 1 to the second transport mechanism 2.

Specifically, the first transport mechanism 1 loads one of the substrates W into one of the first sending units 4S. The intermediate transport mechanism 3 unloads the substrate W from the first sending unit 4S (first access operation by the intermediate transport mechanism 3). In this manner, the intermediate transport mechanism 3 receives the substrate W from the first transport mechanism 1 via the first sending unit 4S (first intermediate part 4).

If the first sending unit 4S is the treating unit, the first sending unit 4S performs treatment to the placed substrate W. If the first sending unit 4S is the inspecting unit, the first sending unit 4S performs inspection to the placed substrate W. Specifically, the first sending unit 4S performs the treatment or the inspection to the substrate W placed in the first sending units 4S after the first transport mechanism 1 loads the substrate W into the first sending unit 4S and before the intermediate transport mechanism 3 unloads the substrate W from the first sending unit 4S.

The intermediate transport mechanism 3 loads the substrate W unloaded from the first sending unit 4S, into the second sending unit 5S (second access operation by the intermediate transport mechanism 3). In this manner, the intermediate transport mechanism 3 transports the substrate W from the first intermediate part 4 to the second intermediate part 5.

If the second sending unit 5S is the treating unit or the inspecting unit, the second sending unit 5S performs treatment or inspection to the placed substrate W.

The second transport mechanism 2 unloads the substrate W from the second sending unit 5S. In this manner, the intermediate transport mechanism 3 passes the substrate W to the second transport mechanism 2 via the second intermediate part 5.

Figure 3B:
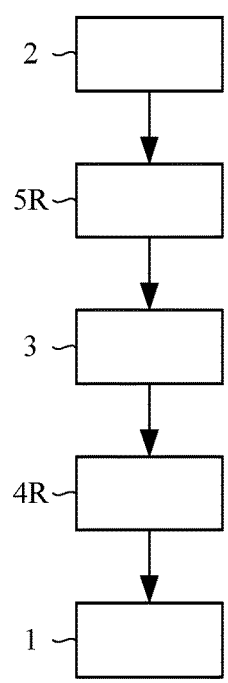

The following describes operation of the substrate treating apparatus 10 with reference to FIGS. 2 and 3B. FIG. 3B schematically illustrates a transportation path of the substrate W. The control by the controller 6 causes the substrates W to be returned from the second transport mechanism 2 to the first transport mechanism 1.

Specifically, the second transport mechanism 2 loads one of the substrates W into the second return unit 5R.

If the second return unit 5R is the treating unit or the inspecting unit, the second return unit 5R performs treatment or inspection to the placed substrate W.

The intermediate transport mechanism 3 unloads the substrate W from the second return unit 5R (second access operation by the intermediate transport mechanism 3). In this manner, the intermediate transport mechanism 3 receives the substrate W from the second transport mechanism 2 via the second intermediate part 5.

The intermediate transport mechanism 3 loads the substrate W unloaded from the second return unit 5R, into the first return unit 4R (first access operation by the intermediate transport mechanism 3). In this manner, the intermediate transport mechanism 3 transports the substrate W from the second intermediate part 5 to the first intermediate part 4.

If the first return unit 4R is the treating unit or the inspecting unit, the first return unit 4R performs treatment or inspection to the placed substrate W.

The first transport mechanism 1 unloads the substrate W from the first return unit 4R. In this manner, the intermediate transport mechanism 3 passes the substrate W to the first transport mechanism 1 via the first intermediate part 4.

In the example operations described above, the intermediate transport mechanism 3 performs one-time operation of unloading the substrate W from the first sending unit 4S and one-time operation of loading the substrate W into the first return unit 4R in a one-time first access operation performed by the intermediate transport mechanism 3.

In the example operations described above, the intermediate transport mechanism 3 performs one-time operation of loading the substrate W into the second sending unit 5S and one-time operation of unloading the substrate W from the second return unit 5R in a one-time second access operation performed by the intermediate transport mechanism 3.

Primary Effect of First Embodiment

The substrate treating apparatus 10 described above produces the following effects.

The cycle operation performed by the intermediate transport mechanism 3 includes only a first access operation and a second access operation. In other words, the number of access operations included in the cycle operation by the intermediate transport mechanism 3 is only two. As noted above, the number of access operations included in the cycle operation by the intermediate transport mechanism 3 is relatively small. Accordingly, the intermediate transport mechanism 3 needs relatively short time for the cycle operation. In other words, the frequency of cycle operation performable per unit time by the intermediate transport mechanism 3 is relatively large. Consequently, the intermediate transport mechanism 3 transports the substrate W at relatively high efficiency (hereinafter, referred to as "transportation efficiency by the intermediate transport mechanism 3" appropriately). This achieves suitably enhanced throughput of the substrate treating apparatus 10.

The first intermediate part 4 is disposed within a first overlapped area BO1 where the first transport mechanism 1 and the intermediate transport mechanism 3 are capable of transporting the substrates W. Consequently, the first transport mechanism 1 and the intermediate transport mechanism 3 allow suitable access to the first intermediate part 4.

The substrates W are placed in the first intermediate part 4. Consequently, the substrates W are capable of being transported suitably between the first transport mechanism 1 and the intermediate transport mechanism 3 via the first intermediate part 4.

The second intermediate part 5 is disposed within a second overlapped area BO2 where intermediate transport mechanism 3 and the second transport mechanism 2 are capable of transporting the substrates W. Consequently, the intermediate transport mechanism 3 and the second transport mechanism 2 allow suitable access to the second intermediate part 5.

The substrates W are placed in the second intermediate part 5. Consequently, the substrates W are capable of being transported suitably between the intermediate transport mechanism 3 and the second transport mechanism 2 via the second intermediate part 5.

The cycle operation performed by the intermediate transport mechanism 3 includes the first access operation in which the intermediate transport mechanism 3 accesses the first intermediate part 4. The cycle operation performed by the intermediate transport mechanism 3 includes the second access operation in which the intermediate transport mechanism 3 accesses the second intermediate part 5. Accordingly, the intermediate transport mechanism 3 performs the cycle operation repeatedly, thereby accessing the first intermediate part 4 and the second intermediate part 5 alternately. As noted above, the cycle operation performed by the intermediate transport mechanism 3 includes only the first access operation and the second access operation. Accordingly, the intermediate transport mechanism 3 is capable of accessing the first intermediate part 4 and the second intermediate part 5 efficiently. Accordingly, the intermediate transport mechanism 3 allows suitable transportation of the substrates W between the first intermediate part 4 and the second intermediate part 5.

The first access operation performed by the intermediate transport mechanism 3 includes operation of unloading the substrates W from the first intermediate part 4. Consequently, the intermediate transport mechanism 3 is capable of unloading the substrates W from the first intermediate part 4 efficiently. The second access operation performed by the intermediate transport mechanism 3 includes operation of loading the substrates into the second intermediate part 5. Consequently, the intermediate transport mechanism 3 is capable of loading the substrates W into the second intermediate part 5 efficiently. Accordingly, the intermediate transport mechanism 3 performs the cycle operation repeatedly, thereby achieving effective transportation of the substrates W from the first intermediate part 4 to the second intermediate part 5.

The first transport mechanism 1 loads the substrates W into the first intermediate part 4. Accordingly, the intermediate transport mechanism 3 performs the cycle operation repeatedly, thereby achieving effective receipt of the substrates W from the first transport mechanism 1 via the first intermediate part 4. The second transport mechanism 2 unloads the substrates W from the second intermediate part 5. Accordingly, the intermediate transport mechanism 3 performs the cycle operation repeatedly, thereby achieving effective deliver of the substrates W into the second transport mechanism 2 via the second intermediate part 5. Accordingly, the intermediate transport mechanism 3 performs the cycle operation repeatedly, thereby achieving effective transportation of the substrates W from the first transport mechanism 1 to the second transport mechanism 2.

The first access operation performed by the intermediate transport mechanism 3 includes operation of loading the substrates W into the first intermediate part 4. Consequently, the intermediate transport mechanism 3 is capable of loading the substrates W into the first intermediate part 4 efficiently. The second access operation performed by the intermediate transport mechanism 3 includes operation of unloading the substrates W from the second intermediate part 5. Consequently, the intermediate transport mechanism 3 is capable of unloading the substrates W from the second intermediate part 5 efficiently. Accordingly, the intermediate transport mechanism 3 performs the cycle operation repeatedly, thereby achieving effective transportation of the substrates W from the second intermediate part 5 to the first intermediate part 4.

The first transport mechanism 1 unloads the substrates W from the first intermediate part 4. Accordingly, the intermediate transport mechanism 3 performs the cycle operation repeatedly, thereby achieving effective deliver of the substrates W into the first transport mechanism 1 via the first intermediate part 4. The second transport mechanism 2 loads the substrates W into the second intermediate part 5. Accordingly, the intermediate transport mechanism 3 performs the cycle operation repeatedly, thereby achieving effective receipt of the substrates W from the second transport mechanism 2 via the second intermediate part 5. Accordingly, the intermediate transport mechanism 3 performs the cycle operation repeatedly, thereby achieving effective transportation of the substrates W from the second transport mechanism 2 to the first transport mechanism 1.

The first access operation by the intermediate transport mechanism 3 includes operation of unloading the substrate W from the first sending unit 4S. Consequently, the intermediate transport mechanism 3 is capable of unloading the substrate W from the first sending unit 4S efficiently.

The first access operation performed by the intermediate transport mechanism 3 does not include loading the substrate W into the first sending unit 4S. Consequently, this simplifies operation of the intermediate transport mechanism 3 with respect to the first sending unit 4S. Accordingly, this also simplifies control of the intermediate transport mechanism 3 by the controller 6.

The second access operation by the intermediate transport mechanism 3 includes operation of loading the substrate W into the second sending unit 5S. Consequently, the intermediate transport mechanism 3 is capable of loading the substrate W into the second sending unit 5S efficiently.

The second access operation by the intermediate transport mechanism 3 does not include operation of unloading the substrate W from the second sending unit 5S. Consequently, this simplifies operation of the intermediate transport mechanism 3 with respect to the second sending units 5S. Accordingly, this also simplifies control of the intermediate transport mechanism 3 by the controller 6.

The first access operation by the intermediate transport mechanism 3 includes operation of loading the substrate W into the first return unit 4R. Consequently, the intermediate transport mechanism 3 is capable of loading the substrate W into the first return unit 4R efficiently.

The first access operation by the intermediate transport mechanism 3 does not include operation of unloading the substrate W from the first return unit 4R. Consequently, this simplifies operation of the intermediate transport mechanism 3 with respect to the first return unit 4R. Accordingly, this also simplifies control of the intermediate transport mechanism 3 by the controller 6.

The second access operation by the intermediate transport mechanism 3 includes operation of unloading the substrate W from the second return unit 5R. Consequently, the intermediate transport mechanism 3 is capable of unloading the substrate W from the second return unit 5R efficiently.

The second access operation performed by the intermediate transport mechanism 3 does not include loading the substrate W into the second return unit 5R. Consequently, this simplifies operation of the intermediate transport mechanism 3 with respect to the second return unit 5R. Accordingly, this also simplifies control of the intermediate transport mechanism 3 by the controller 6.

If the first intermediate part 4 performs treatment to the substrates W placed therein, the substrates are capable of undergoing the treatment effectively in the first intermediate part 4 while being transported to the first intermediate part 4 effectively. This achieves enhanced throughput of the substrate treating apparatus 10 effectively. Likewise, if the second intermediate part 5 performs treatment to the substrates W placed therein, the substrates are capable of undergoing the treatment effectively in the second intermediate part 5 while being transported to the second intermediate part 5 effectively. This achieves enhanced throughput of the substrate treating apparatus 10 effectively.

A space for the non-liquid treatment is relatively small. For instance, the space for the non-liquid treatment is smaller than a space for the liquid treatment. Here, the liquid treatment is performed by supplying a treatment liquid to the substrate W. Accordingly, if the treatment performed by the first intermediate part 4 is the non-liquid treatment, the first intermediate part 4 is capable of performing the non-liquid treatment to the substrates W effectively. For instance, the first intermediate part 4 allows non-liquid treatment to a plurality of substrates W simultaneously. This allows suitable prevention of jammed transportation of the substrates W in the first intermediate part 4. Likewise, even if the treatment performed by the second intermediate part 5 is the non-liquid treatment, jammed transportation of the substrates W is preventable suitably in the second intermediate part 5.

A space for the heat treatment is relatively small. For instance, the space for the heat treatment is smaller than the space for the liquid treatment. Accordingly, if the first intermediate part 4 performs the heat treatment, the first intermediate part 4 is capable of performing the heat treatment to the substrates W effectively. For instance, the first intermediate part 4 allows heat treatment to a plurality of substrates W simultaneously. This allows suitable prevention of jammed transportation of the substrates W in the first intermediate part 4. Likewise, even if the second intermediate part 5 performs the heat treatment, jammed transportation of the substrates W is preventable suitably in the second intermediate part 5.

If the first intermediate part 4 performs further inspection to the substrates W placed therein, the substrates W are capable of undergoing the inspection effectively in the first intermediate part 4 while being transported to the first intermediate part 4 effectively. This achieves enhanced throughput of the substrate treating apparatus 10 effectively. Likewise, if the second intermediate part 5 performs further inspection to the substrates W placed therein, the substrates W are capable of undergoing the inspection effectively in the second intermediate part 5 while being transported to the second intermediate part 5 effectively. This achieves enhanced throughput of the substrate treating apparatus 10 effectively.

If at least one of the first sending units 4S is the treating unit that performs further treatment to the placed substrate W, the intermediate transport mechanism 3 is capable of unloading the substrate W from the treating unit efficiently. Accordingly, the substrate W is capable of undergoing the treatment effectively in at least one of the first sending units 4S while being transported to the first sending units 4S effectively. This achieves enhanced throughput of the substrate treating apparatus 10 effectively. If at least one of the second sending units 5S is the treating unit, the intermediate transport mechanism 3 is capable of loading the substrate W into the treating unit efficiently. Accordingly, the substrate W is capable of undergoing the treatment effectively in at least one of the second sending units 5S while being transported to the second sending units 5S effectively. This achieves enhanced throughput of the substrate treating apparatus 10 effectively.

Likewise, if at least one of the first return units 4R is the treating unit, the intermediate transport mechanism 3 is capable of loading the substrate W into the treating unit efficiently. Accordingly, the substrate W is capable of undergoing the treatment effectively in at least one of the first return units 4R while being transported to the first return units 4R effectively. This achieves enhanced throughput of the substrate treating apparatus 10 effectively. If at least one of the second return units 5R is the treating unit, the intermediate transport mechanism 3 is capable of unloading the substrate W from the treating unit efficiently. Accordingly, the substrate W is capable of undergoing the treatment effectively in at least one of the second return units 5R while being transported to the second return units 5R effectively. This achieves enhanced throughput of the substrate treating apparatus 10 effectively.

The non-liquid treating unit has a relatively small size. For instance, the size of the non-liquid treating unit is smaller than the liquid treating unit. Accordingly, if the first sending units 4S are the non-liquid treating unit, the first intermediate part 4 may include a relatively large number of non-liquid treating units as the first sending units 4S. Consequently, the first sending units 4S are capable of performing the non-liquid treatment to the substrates W efficiently. This allows suitable prevention of the jammed transportation of the substrates W between the first transport mechanism 1 and the intermediate transport mechanism 3. Specifically, this allows suitable prevention of jammed transportation of the substrates in the first sending units 4S. If the second sending units 5S are the non-liquid treating unit, the second intermediate part 5 may include a relatively large number of non-liquid treating units as the second sending units 5S. Consequently, the second sending units 5S are capable of performing the non-liquid treatment to the substrates W efficiently. This allows suitable prevention of the jammed transportation of the substrates W between the second transport mechanism 2 and the intermediate transport mechanism 3. Specifically, this allows suitable prevention of jammed transportation of the substrates in the second sending units 5S.

Likewise, if the first return units 4R are the non-liquid treating unit, the first intermediate part 4 may include a relatively large number of non-liquid treating units as the first return units 4R. Consequently, this allows suitable prevention of the jammed transportation of the substrates W between the first transport mechanism 1 and the intermediate transport mechanism 3. Specifically, this allows suitable prevention of jammed transportation of the substrates in the first return units 4R. If the second return units 5R are the non-liquid treating unit, the second intermediate part 5 may include a relatively large number of non-liquid treating units as the second return units 5R. Consequently, this allows suitable prevention of the jammed transportation of the substrates W between the second transport mechanism 2 and the intermediate transport mechanism 3. Specifically, this allows suitable prevention of jammed transportation of the substrates in the second return units 5R.

The heat treating unit has a relatively small size. For instance, the size of the heat treating unit is smaller than the liquid treating unit. If the first sending units 4S are the heat treating unit, the first intermediate part 4 may include a relatively large number of heat treating units as the first sending units 4S. Consequently, the first sending units 4S are capable of performing the heat treatment to the substrates W efficiently. This allows suitable prevention of the jammed transportation of the substrates W between the first transport mechanism 1 and the intermediate transport mechanism 3. If the second sending units 5S are the heat treating unit, the second intermediate part 5 may include a relatively large number of heat treating units as the second sending units 5S. Consequently, the second sending units 5S are capable of performing the heat treatment to the substrates W efficiently. This allows suitable prevention of the jammed transportation of the substrates W between the second transport mechanism 2 and the intermediate transport mechanism 3.

Likewise, if the first return units 4R are the heat treating unit, the first intermediate part 4 may include a relatively large number of heat treating units as the first return units 4R. Consequently, this allows suitable prevention of the jammed transportation of the substrates W between the first transport mechanism 1 and the intermediate transport mechanism 3. If the second return units 5R are the heat treating unit, the second intermediate part 5 may include a relatively large number of heat treating units as the second return units 5R. Consequently, this allows suitable prevention of the jammed transportation of the substrates W between the second transport mechanism 2 and the intermediate transport mechanism 3.

If at least one of the first return units 4R is the inspecting unit, the intermediate transport mechanism 3 is capable of loading the substrates W into the inspecting unit efficiently. Accordingly, the substrate W is capable of undergoing the inspection effectively in at least one of the first return units 4R while being transported to the first return units 4R effectively. This achieves enhanced throughput of the substrate treating apparatus 10 effectively. If at least one of the second return units 5R is the inspecting unit, the intermediate transport mechanism 3 is capable of unloading the substrate W from the inspecting unit efficiently. Accordingly, the substrate W is capable of undergoing the inspection effectively in at least one of the second return units 5R while being transported to the second return units 5R effectively. This achieves enhanced throughput of the substrate treating apparatus 10 effectively.

The first intermediate part 4 is disposed out of the second area B2 where the second transport mechanism 2 is capable of transporting the substrates W. Accordingly, the first transport mechanism 1 and the intermediate transport mechanism 3 are capable of accessing the first intermediate part 4 without any interference with the second transport mechanism 2.

The second intermediate part 5 is disposed out of the first area B1 where the first transport mechanism 1 is capable of transporting the substrates W. Accordingly, the intermediate transport mechanism 3 and the second transport mechanism 2 are capable of accessing the second intermediate part 5 without any interference with the first transport mechanism 1.

The following describes the substrate treating apparatus 10 in more detail.

Overall Configuration of Substrate Treating Apparatus 10

FIG. 4 is a plan view of the substrate treating apparatus 10 according to the first embodiment. The substrate treating apparatus 10 includes an indexer block 11, a first heat treatment block 21, a first transportation block 41, a second heat treatment block 51, a second transportation block 61, and a liquid treatment block 71. The indexer block 11, the first heat treatment block 21, the first transportation block 41, the second heat treatment block 51, the second transportation block 61, and the liquid treatment block 71 are arranged in line in this order.

Hereinunder, the indexer block 11 is simply referred to as the "block 11" appropriately. Likewise, the first heat treatment block 21, the first transportation block 41, the second heat treatment block 51, the second transportation block 61, and the liquid treatment block 71 are simply referred to as the "blocks, 21, 41, 51, 61, 71", respectively, where appropriate.

A direction where the blocks 11, 21, 41, 51, 61, 71 are arranged is referred to as a "forward/rearward direction X". The forward/rearward direction X is horizontal. One direction of the forward/rearward direction X from the block 71 to the block 11 is referred to as a "forward direction". The direction opposite to the forward direction is referred to as a "rearward direction". A horizontal direction orthogonal to the forward/rearward direction X is referred to as a "width direction Y" or a "lateral direction". Moreover, one direction of the width direction Y is referred to as a "rightward direction" appropriately. The direction opposite to the rightward direction is referred to as a "leftward direction". A vertical direction is referred to as an "upward/downward direction Z". The upward/downward direction Z is orthogonal to the forward/rearward direction X and the width direction Y. In each of the drawings, the terms forward, rearward, rightward, leftward, upward, and downward are indicated appropriately.

The following describes firstly the indexer 11, the first transportation block 41, the second transportation block 61, and the liquid treatment block 71 of the substrate treating apparatus 10. Then, the first heat treatment block 21 and the second heat treatment block 51 are to be described.

Indexer Block 11

Figure 5:
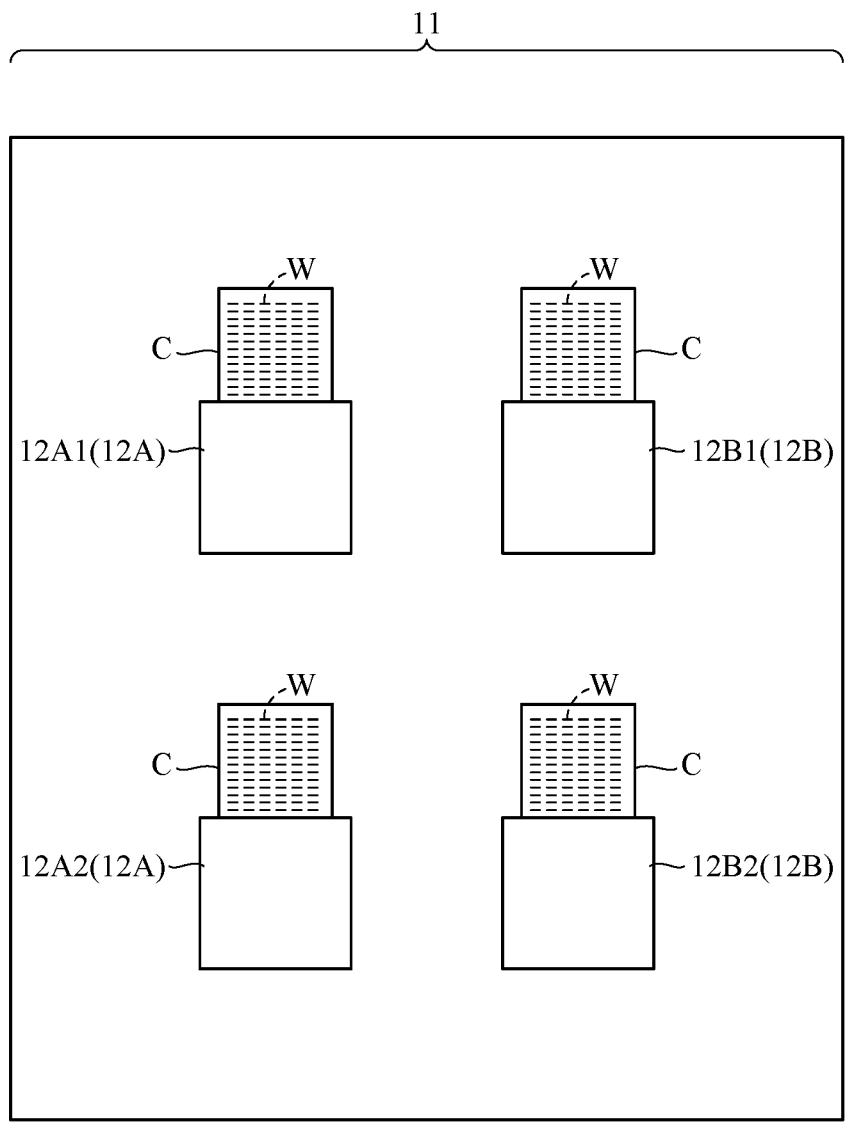
FIG. 5 is a front view of an indexer block.

FIG. 5 is a front view of an indexer block 11. The indexer block 11 includes carrier mount tables 12A1, 12A2, 12B1, 12B2. The carrier mount tables 12A1, 12A2, 12B1, 12B2 each have one carrier C placed thereon. The carrier C accommodates a plurality of substrates W. The carrier C is, for example, a front opening unified pod (FOUP).

The carrier mount tables 12A1, 12A2 are arranged in line in the upward/downward direction Z. The carrier mount table 12A1 is disposed above the carrier mount table 12A2. The carrier mount tables 12B1, 12B2 are arranged in line in the upward/downward direction Z. The carrier mount table 12B1 is disposed above the carrier mount table 12B2. The carrier mount table 12A1, 12B1 are arranged in line in the width direction Y. The carrier mount table 12A1 is disposed rightward of the carrier mount table 12B1. The carrier mount table 12A1 is disposed in substantially the same level as that of the carrier mount table 12B1. The carrier mount table 12A2, 12B2 are arranged in line in the width direction Y. The carrier mount table 12A2 is disposed rightward of the carrier mount table 12B2. The carrier mount table 12A2 is disposed in substantially the same level as that of the carrier mount table 12B2.

Hereinunder, if the carrier mount tables 12A1, 12A2 are not distinguished, they are referred to as the "carrier mount table 12A". Hereinunder, if the carrier mount tables 12B1, 12B2 are not distinguished, they are referred to as the "carrier mount table 12B".

Figure 6:
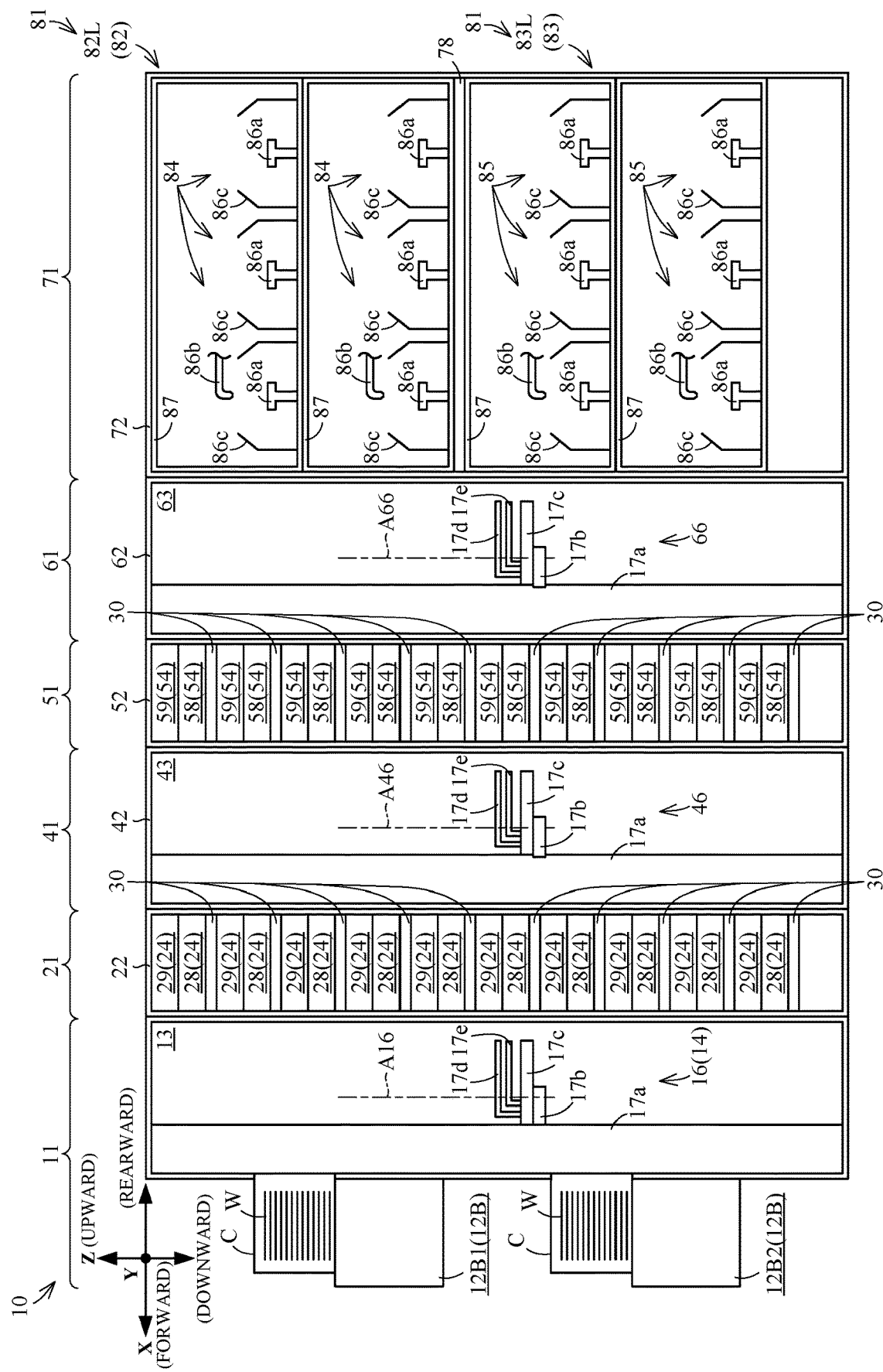
FIG. 6 is a left side view of a left portion of the substrate treating apparatus.
Figure 7:
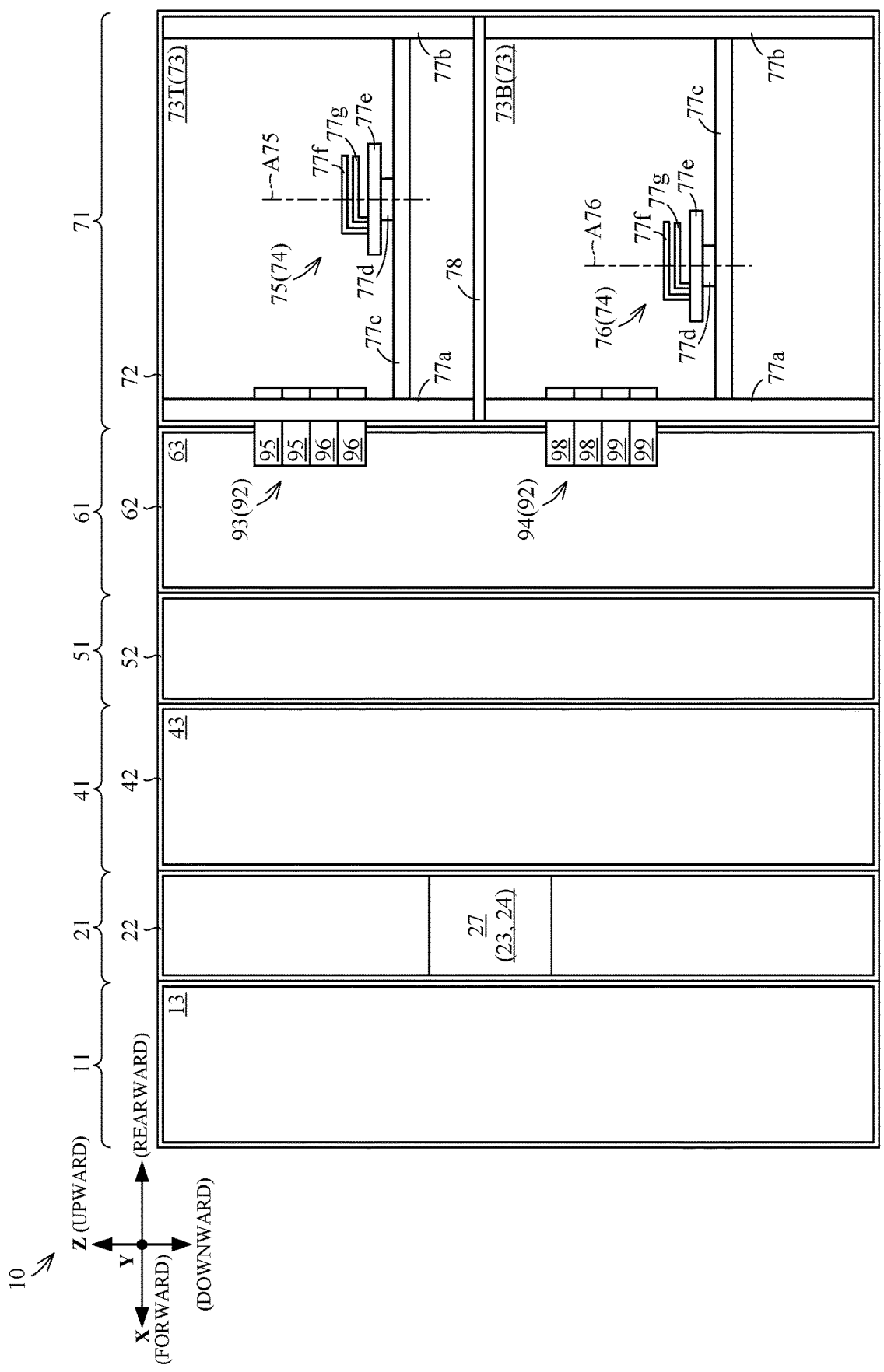
FIG. 7 is a left side view of a middle portion of the substrate treating apparatus in a width direction.
Figure 8:
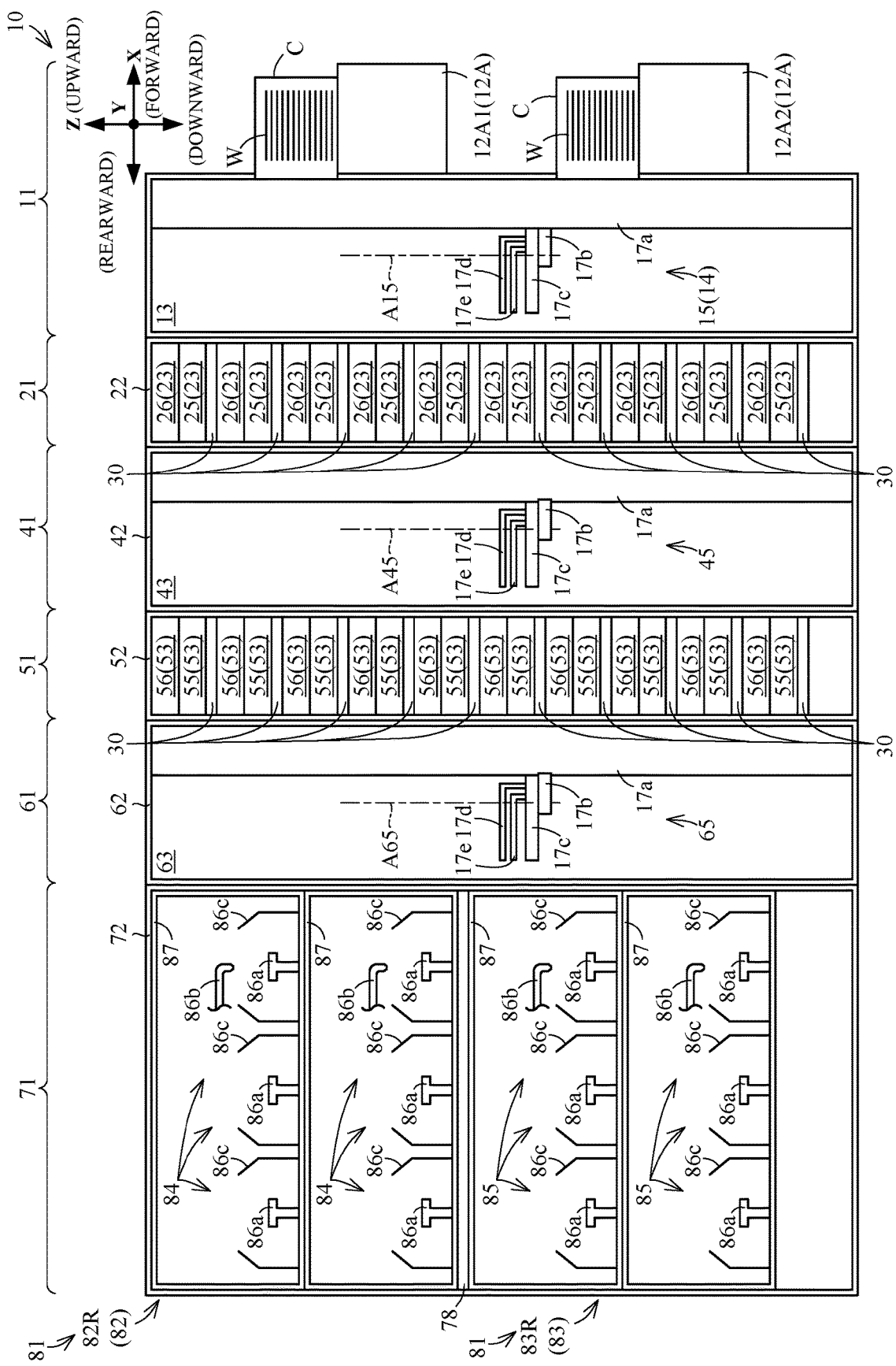
FIG. 8 is a right side view of a right portion of the substrate treating apparatus.

Reference is made to FIGS. 4 and 6 to 9. FIG. 6 is a left side view of a left portion of the substrate treating apparatus 10. FIG. 7 is a left side view of a middle portion of the substrate treating apparatus 10 in the width direction Y. FIG. 8 is a right side view of a right portion of the substrate treating apparatus 10. FIG. 9 is a front view of an interior of the indexer block 11.

The indexer block 11 includes a transportation space 13. The transportation space 13 is disposed rearward of the carrier mount tables 12A, 12B.

The indexer block 11 includes a transport mechanism 14. The transport mechanism 14 is disposed in the transportation space 13. The transport mechanism 14 transports the substrate W.

The transport mechanism 14 includes a transport mechanism 15 and a transport mechanism 16. The transport mechanisms 15, 16 each transport the substrate W.

The transport mechanisms 15, 16 are arranged in line in the width direction Y. The transport mechanism 15 is disposed rightward of the transport mechanism 16. The transport mechanism 15 is disposed at substantially the same level as that of the transport mechanism 16. The transport mechanism 15 is disposed rearward of the carrier mount table 12A. The transport mechanism 15 is accessible to the carrier mount table 12A. The transport mechanism 16 is disposed rearward of the carrier mount table 12B. The transport mechanism 16 is accessible to the carrier mount table 12B.

Reference is made to FIGS. 4, 6, 8, and 9. The transport mechanism 15 includes a strut 17a, a lifting member 17b, a rotator 17c, and holders 17d, 17e. The strut 17a extends in the upward/downward direction Z. The strut 17a is disposed in a fixed manner. In other words, the strut 17a is immovable. The lifting member 17b is supported on the strut 17a. The lifting member 17b is movable in the upward/downward direction Z with respect to the strut 17a. The lifting member 17b is immovable in the horizontal direction. The rotator 17c is supported on the lifting member 17b. The rotator 17c is rotatable around a rotation axis A15 with respect to the lifting member 17b. The rotation axis A15 is parallel to the upward/downward direction Z. The rotator 17c is immovable in the horizontal direction. The rotation axis A15 is immovable in the horizontal direction. The holders 17d, 17e are supported on the rotator 17c. The holders 17d, 17e are capable of reciprocating with respect to the rotator 17c in the horizontal direction. The holders 17d, 17e are capable of reciprocating independently. The holders 17d, 17e each contact the substrate W. The holders 17d, 17e each hold one substrate W horizontally.

The transport mechanism 16 has substantially the same configuration as the transport mechanism 15. That is, the transport mechanism 16 includes a strut 17a, a lifting member 17b, a rotator 17c, and holders 17d, 17e. The rotator 17c of the transport mechanism 16 is rotatable around a rotation axis A16. The rotation axis A16 is parallel to the upward/downward direction Z.

As described above, if the different elements have the same configuration, a common numeral is applied to the configuration to omit the detailed description of the elements in the present embodiment.

FIG. 4 illustrates an area B15 where the transport mechanism 15 is capable of transporting the substrates W. The area B15 is substantially circular in plan view. The rotation axis A15 corresponds to the center of the area B15 in plan view.

FIG. 4 illustrates an area B16 where the transport mechanism 16 is capable of transporting the substrates W. The area B16 is substantially circular in plan view. The rotation axis A16 corresponds to the center of the area B16 in plan view.

First Transportation Block 41

Reference is made to FIGS. 4, 6 to 8, and 10. FIG. 10 is a front view of a first transportation block 41.

The first transportation block 41 is connected to the first heat treatment block 21 and the second heat treatment block 51. The first transportation block 41 has substantially a box shape. The first transportation block 41 is substantially rectangular in plan view, in front view, and in side view.

The first transportation block 41 has a frame 42. The frame 42 is provided as a shell (contour) of the first transportation block 41. The frame 42 defines the shape of the first transportation block 41. The frame 42 is, for example, made of metal.

The first transportation block 41 has a transportation space 43. The transportation space 43 does not contact the transportation space 13 of the indexer block 11. The transportation space 43 and the transportation space 13 are separated by the first heat treatment block 21.

The first transportation block 41 includes transport mechanisms 45, 46. The transport mechanisms 45, 46 each transport the substrate W. The transport mechanisms 45, 46 are arranged in line in the width direction Y. The transport mechanism 45 is disposed rightward of the transport mechanism 46. The transport mechanism 45 is disposed at substantially the same level as that of the transport mechanism 46.

The transport mechanism 45, 46 have substantially the same configuration as the transport mechanism 14 (specifically, the transport mechanisms 15, 16, respectively). The transport mechanisms 45, 46 each have a strut 17a fixed on a frame 42. The transport mechanisms 45, 46 each have a rotator 17c that is rotatable around rotation axes A45, 46, respectively. The rotation axes A45, 46 are each parallel to the upward/downward direction Z.

FIG. 4 illustrates an area B45 where the transport mechanism 45 is capable of transporting the substrates W. The area B45 is substantially circular in plan view. The rotation axis A45 corresponds to the center of the area B45 in plan view.

FIG. 4 illustrates an area B46 where the transport mechanism 46 is capable of transporting the substrates W. The area B46 is substantially circular in plan view. The rotation axis A46 corresponds to the center of the area B46 in plan view.

Second Transportation Block 61

Reference is made to FIGS. 4, 6 to 8, and 11. FIG. 11 is a front view of the second transportation block 61. The second transportation block 61 is connected to the second heat treatment block 51 and the liquid treatment block 71. The second transportation block 61 has substantially a box shape. The second transportation block 61 is substantially rectangular in plan view, in front view, and in side view.

The second transportation block 61 has a frame 62. The frame 62 is provided as a shell (contour) of the second transportation block 61. The frame 62 defines the shape of the second transportation block 61. The frame 62 is, for example, made of metal.

The second transportation block 61 has a transportation space 63. The transportation space 63 does not contact the transportation space 43 of the first transportation block 41. The transportation space 63 and the transportation space 43 are separated by the second heat treatment block 51.

The second transportation block 61 includes transport mechanisms 65, 66. The transport mechanisms 65, 66 each transport the substrate W. The transport mechanisms 65, 66 are arranged in line in the width direction Y. The transport mechanism 65 is disposed rightward of the transport mechanism 66. The transport mechanism 65 is disposed at substantially the same level as that of the transport mechanism 66.

The transport mechanisms 65, 66 have substantially the same configuration as the transport mechanism 14. The transport mechanisms 65, 66 each have a strut 17a fixed on a frame 62. The transport mechanisms 65, 66 each have a rotator 17c that is rotatable around rotation axes A65, A66, respectively. The rotation axes A65, A66 are each parallel to the upward/downward direction Z.

FIG. 4 illustrates an area B65 where the transport mechanism 65 is capable of transporting the substrates W. The area B65 is substantially circular in plan view. The rotation axis A65 corresponds to the center of the area B65 in plan view.

FIG. 4 illustrates an area B66 where the transport mechanism 66 is capable of transporting the substrates W. The area B66 is substantially circular in plan view. The rotation axis A66 corresponds to the center of the area B66 in plan view.

Liquid Treatment Block 71

Reference is made to FIGS. 4 and 6 to 8. The liquid treatment block 71 is connected to the second transportation block 61. The liquid treatment block 71 has substantially a box shape. The liquid treatment block 71 is substantially rectangular in plan view, in front view, and in side view.

The liquid treatment block 71 has a frame 72. The frame 72 is provided as a shell (contour) of the liquid treatment block 71. The frame 72 defines the shape of the liquid treatment block 71. The frame 72 is, for example, made of metal.

The liquid treatment block 71 includes a transportation space 73. The transportation space 73 is disposed in the middle of the liquid treatment block 71 in the width direction Y in plan view. The transportation space 73 contacts the transportation space 63 of the second transportation block 61. The transportation space 73 extends in the forward/rearward direction X.

The transportation space 73 has a transportation space 73T and a transportation space 73B. The transportation space 73T and the transportation space 73B are arranged in line in the upward/downward direction Z. The transportation space 73T is arranged above the transportation space 73B.

Reference is made to FIG. 7. The liquid treatment block 71 includes a partition 78. The partition 78 has a flat plate shape. The partition 78 is arranged in a boundary between the transportation space 73T and the transportation space 73B. The partition 78 separates the transportation space 73T and the transportation space 73B.

The liquid treatment block 71 includes a transport mechanism 74. The transport mechanism 74 is disposed in the transportation space 73. The transport mechanism 74 transports the substrate W.

The transport mechanism 74 includes a transport mechanism 75 and a transport mechanism 76. The transport mechanisms 75, 76 each transport the substrate W.

The transport mechanisms 75, 76 are arranged in line in upward/downward direction Z. The transport mechanism 75 is disposed above the transport mechanism 76. The transport mechanism 75 is disposed in the transportation space 73T. The transport mechanism 75 is disposed above the partition 78. The transport mechanism 76 is disposed in the transportation space 73B. The transport mechanism 76 is disposed below the partition 78. The transport mechanism 76 is separated from the transport mechanism 75 by the partition 78.

The transport mechanism 75 includes struts 77a, 77b, a lifting member 77c, a horizontal moving member 77d, a rotator 77e, and holders 77f, 77g. The struts 77a, 77b extend in the upward/downward direction Z. The struts 77a, 77b are arranged in line in the forward/rearward direction X. The strut 77a is arranged in a left front side of the transportation space 73T. The strut 77b is arranged in a left rear side of the transportation space 73T. The struts 77a, 77b are disposed in a fixed manner. The struts 77a, 77b are fixed on the frame 72. The struts 77a, 77b are immovable. The lifting member 77c extends in the forward/rearward direction X. The lifting member 77c is supported on the struts 77a, 77b. The lifting member 77c is movable in the upward/downward direction Z with respect to the struts 77a, 77b. The horizontal moving member 77d is supported on the lifting member 77c. The horizontal moving member 77d is movable in the horizontal direction (specifically, the forward/rearward direction X) with respect to the lifting member 77c. The rotator 77e is supported on the horizontal moving member 77d. The rotator 77e is movable in the horizontal direction (specifically, the forward/rearward direction X) integrally with the horizontal moving member 77d. The rotator 77e is rotatable around a rotation axis A75 with respect to the horizontal moving member 77d. The rotation axis A75 is parallel to the upward/downward direction Z. The holders 77f, 77g are supported on the rotator 77e. The holders 77f, 77g are capable of reciprocating with respect to the rotator 77e in the horizontal direction. The holders 77f, 77g are capable of reciprocating independently. The holders 77f, 77g each contact the substrate W. The holders 77f, 77g each hold one substrate W horizontally.

The transport mechanism 76 has substantially the same configuration as the transport mechanism 75. That is, the transport mechanism 76 includes struts 77a, 77b, a lifting member 77c, a horizontal moving member 77d, a rotator 77e, and holders 77f, 77g. The rotator 77e of the transport mechanism 76 is rotatable around a rotation axis A76. The rotation axis A76 is parallel to the upward/downward direction Z.

FIG. 4 illustrates areas B75, B76 where the transport mechanisms 75, 76 are capable of transporting the substrates W. The areas B75, B76 are longer in the forward/rearward direction X than the width direction Y. The area B75 is disposed above the area B76. The area B76 is disposed at substantially the same position as that of the area B75 in plan view.

The liquid treatment block 71 includes a processing part 81. The substrates W are placed in the processing part 81. The processing part 81 performs further treatment to the placed substrate W. The processing part 81 is disposed lateral of the transport mechanism 74. The transport mechanism 74 and the processing part 81 are arranged in line in the width direction Y.

Reference is made to FIGS. 4, 6, and 8. The processing part 81 includes processing sections 82, 83. The processing sections 82, 83 are arranged in line in upward/downward direction Z. The processing section 82 is disposed above the processing section 83. The processing section 82 is disposed above the partition 78. The processing section 82 is disposed lateral of the transport mechanism 75. The transport mechanism 75 and the processing section 82 are arranged in line in the width direction Y. The processing section 83 is disposed below the partition 78. The processing section 83 is disposed lateral of the transport mechanism 76. The transport mechanism 76 and the processing section 83 are arranged in line in the width direction Y.

The processing section 82 includes a right processing section 82R and a left processing section 82L. The right processing section 82R, the transport mechanism 75, and the left processing section 82L are arranged in line in the width direction Y. The transport mechanism 75 is arranged between the right processing section 82R and the left processing section 82L. The right processing section 82R is disposed rightward of the transport mechanism 75. The left processing section 82L is disposed leftward of the transport mechanism 75.

The right processing section 82R includes a plurality of (e.g. six) liquid treating units 84. The liquid treating units 84 belonging to the right processing section 82R are arranged in a matrix array in the forward/rearward direction X and the upward/downward direction Z. Three liquid treating units 84 are arranged on an upper layer of the right processing section 82R. The liquid treating units 84 on the upper layer of the right processing section 82R are arranged in line in the forward/rearward direction X. Three liquid treating units 84 arranged on the upper layer of the right processing section 82R are accommodated into one chamber 87. The residual three liquid treating units 84 are arranged on a lower layer of the right processing section 82R. The liquid treating units 84 on the lower layer of the right processing section 82R are arranged in line in the forward/rearward direction X. The three liquid treating units 84 on the lower layer of the right processing section 82R overlap the three liquid treating units 84 on the upper layer of the right processing section 82R in the plan view. Three liquid treating units 84 arranged on the lower layer of the right processing section 82R are accommodated into another chamber 87.

The left processing section 82L includes a plurality of (e.g., six) liquid treating units 84. The liquid treating units 84 of the left processing section 82L are arranged in the same manner as that of the liquid treating units 84 of the right processing section 82R except for a symmetrical configuration.

The processing section 83 includes a right processing section 83R and a left processing section 83L. The right processing section 83R, the transport mechanism 76, and the left processing section 83L are arranged in line in the width direction Y. The transport mechanism 76 is arranged between the right processing section 83R and the left processing section 83L. The right processing section 83R is disposed rightward of the transport mechanism 76. The left processing section 83L is disposed leftward of the transport mechanism 76.

The right processing section 83R includes a plurality of (e.g., six) liquid treating units 85. The left processing section 83L includes a plurality of (e.g., six) liquid treating units 85. The liquid treating units 85 of the right processing section 83R and the left processing section 83L are arranged in the same manner as that of the liquid treating units 84 of the right processing section 82R and the left processing section 82L.

The liquid treating units 84 each include a spin holder 86a, a nozzle 86b, and a cup 86c. The spin holder 86a holds one substrate W horizontally. The spin holder 86a is capable of rotating the held substrate W around an axis parallel to the upward/downward direction Z. The nozzle 86b dispenses a treatment liquid to the substrate W. Examples of the treatment liquid include a coating liquid. The nozzle 86b is positioned at a treatment position and a retracted position in a movable manner. The treatment position is above the substrate W held by the spin holder 86a. The treatment position overlaps the substrate W held by the spin holder 86a in plan view. The retracted position does not overlap the substrate W held by the spin holder 86a in plan view. The cup 86c surrounds the spin holder 86a. The cup 86c collects the treatment liquid.

The liquid treating units 85 have substantially the same configuration and shape as that of the liquid treating units 84.

Arrangement of Transport Mechanism

Reference is made to FIG. 4. The transport mechanism 14, the transport mechanism 45, the transport mechanism 65, and the transport mechanism 74 are arranged in the forward/rearward direction X. The transport mechanism 14, the transport mechanism 46, the transport mechanism 66, and the transport mechanism 74 are arranged in the forward/rearward direction X. The transport mechanism 14 is disposed at the forwardmost position among the transport mechanisms 14, 45, 46, 65, 66, 74. The transport mechanism 74 is disposed at the rearmost position among the transport mechanisms 14, 45, 46, 65, 66, 74.

The area B15 partially overlaps the area B45. The area B45 partially overlaps the area B65. The area B65 partially overlaps the area B75.

Likewise, the area B16 partially overlaps the area B46. The area B46 partially overlaps the area B66. The area B66 partially overlaps the area B76.

Moreover, the area B15 partially overlaps the area B16. The area B45 partially overlaps the area B46. The areas B15, B16, B45, B46 partially overlap one another. The area B65 partially overlaps the area B66. The area B65 partially overlaps the area B76. The area B66 partially overlaps the area B75.

The area B75 does not overlap the area B76. This is because the area B75 is disposed above the area B76.

The carrier mount table 12A and the carriers C placed on the carrier mount table 12A are disposed within the area B15. The carrier mount table 12A and the carriers C placed on the carrier mount table 12A are disposed out of the areas B16, B45, B46, B65, B66, B75, B76.

The carrier mount table 12B and the carriers C placed on the carrier mount table 12B are disposed within the area B16. The carrier mount table 12B and the carriers C placed on the carrier mount table 12B are disposed out of the areas B15, B45, B46, B65, B66, B75, B76.

The processing part 81 is disposed at an area where the transport mechanism 74 is capable of transporting the substrates W. The processing part 81 is disposed out of the areas B15, B16, B45, B46, B65, B66.

Especially, the processing section 82 is disposed within the area B75. The processing section 82 is disposed out of the area B76.

The processing section 83 is disposed within the area B76. The processing section 83 is disposed out of the area B75.

First Heat Treatment Block

Figure 12:
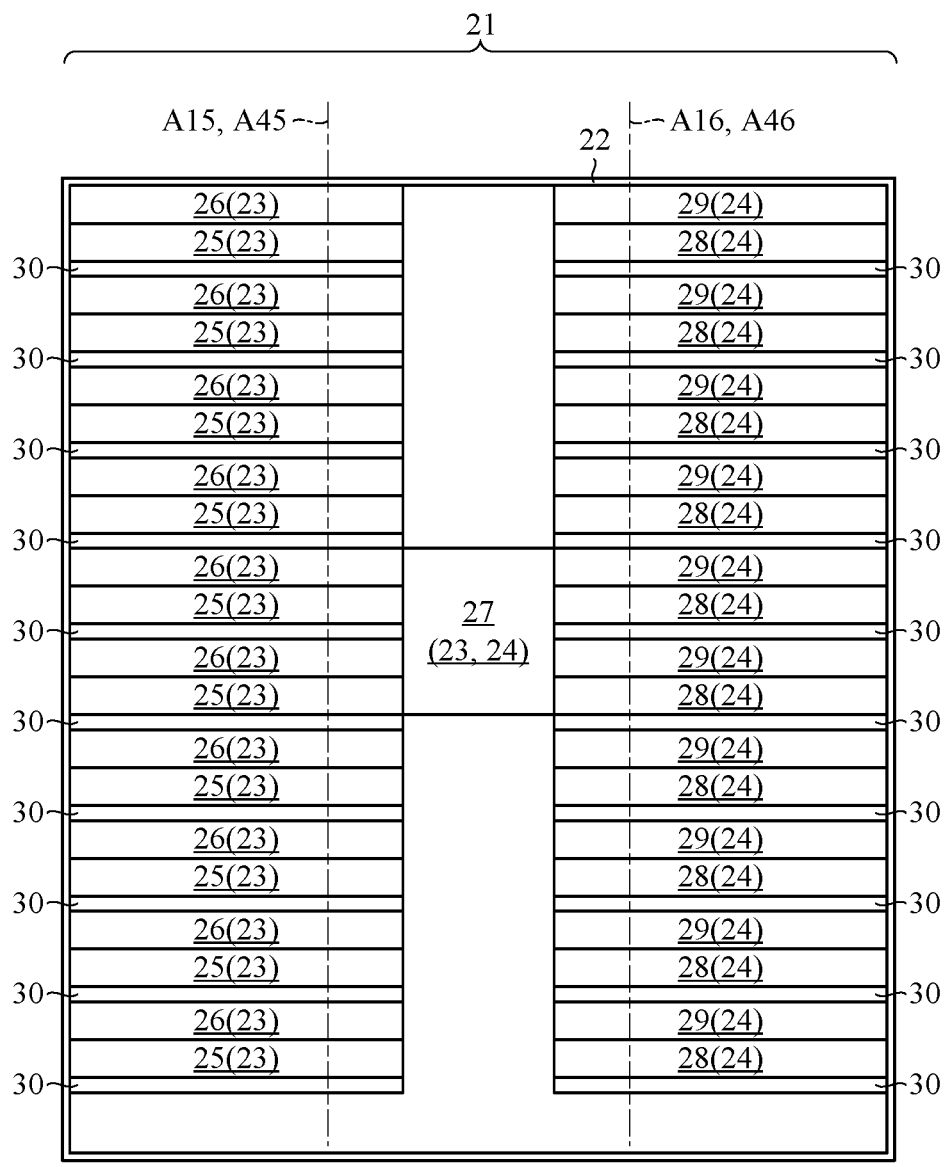
FIG. 12 is a front view of a first heat treatment block.

Reference is made to FIGS. 4, 6 to 8, and 12. FIG. 12 is a front view of a first heat treatment block 21. The first heat treatment block 21 is connected to an indexer block 11 and a first transportation block 41. The first heat treatment block 21 has substantially a box shape. The first heat treatment block 21 is substantially rectangular in plan view, in front view, and in side view.

The first heat treatment block 21 has a frame 22. The frame 22 is provided as a shell (contour) of the first heat treatment block 21. The frame 22 defines the shape of the first heat treatment block 21. The frame 22 is, for example, made of metal.

The first heat treatment block 21 includes intermediate parts 23, 24. The substrate W is placed on the intermediate parts 23, 24. The intermediate parts 23, 24 are arranged in line in the width direction Y. The intermediate part 23 is disposed rightward of the intermediate part 24. The intermediate part 23 partially overlaps the intermediate part 24. An overlapped portion of the intermediate parts 23, 24 is referred to as a common portion.

The intermediate part 23 is disposed between the transport mechanism 15 and the transport mechanism 45 adjacent to each other in the forward/rearward direction X. Specifically, the intermediate part 23 is disposed rearward of the transport mechanism 15 and forward of the transport mechanism 45. The intermediate part 24 is disposed between the transport mechanism 16 and the transport mechanism 46 adjacent to each other in the forward/rearward direction X. Specifically, the intermediate part 24 is disposed rearward of the transport mechanism 16 and forward of the transport mechanism 46. Especially, the common portion of the intermediate parts 23, 24 is disposed between the transport mechanism 14 (15, 16) and the transport mechanisms 45, 46.

The intermediate parts 23, 24 each perform further treatment to the placed substrate W placed thereon. The intermediate parts 23, 24 each perform further inspection to the substrate W placed thereon.

The intermediate part 23 includes a plurality of heat treating units 25 and a plurality of mounting units 26. The intermediate part 24 includes a plurality of heat treating units 28 and a plurality of mounting units 29. Moreover, the intermediate parts 23, 24 include the same inspecting unit 27. In other words, the intermediate parts 23, 24 commonly use the same inspecting unit 27. The inspecting unit 27 is disposed in the common portion of the intermediate parts 23, 24. The inspecting unit 27 belongs to not only the intermediate part 23 but also to the intermediate part 24.

The inspecting unit 27 is positioned leftward of the heat treating unit 25 and the mounting unit 26 in plan view. The inspecting unit 27 is positioned rightward of the heat treating unit 28 and the mounting unit 29 in plan view.

The heat treating unit 25 and the mounting unit 26 are each disposed rearward of the transport mechanism 15 and forward of the transport mechanism 45. The heat treating unit 28 and the mounting unit 29 are each disposed rearward of the transport mechanism 16 and forward of the transport mechanism 46.

The inspecting unit 27 is disposed rearward of the transport mechanism 14 and forward of the transport mechanisms 45, 46. Specifically, the inspecting unit 27 is disposed rearward and leftward of the transport mechanism 15. The inspecting unit 27 is disposed rearward and rightward of the transport mechanism 16. The inspecting unit 27 is disposed at substantially the same interval from the transport mechanisms 15, 16. The inspecting unit 27 is disposed forward and leftward of the transport mechanism 45. The inspecting unit 27 is disposed forward and rightward of the transport mechanism 46. The inspecting unit 27 is disposed at substantially the same interval from the transport mechanisms 45, 46.

The heat treating units 25, 28, the mounting units 26, 29, and the inspecting unit 27 are disposed at substantially the same level as that of the transport mechanisms 14, 45, 46. Specifically, the heat treating units 25, 28, the mounting units 26, 29, and the inspecting unit 27 are disposed at the level where the transport mechanisms 14, 45, 46 are capable of transporting the substrates W. More specifically, the heat treating units 25, 28, the mounting units 26, 29, and the inspecting unit 27 are disposed at the level within a range where the holders 17d, 17e of the transport mechanisms 14, 45, 46 are movable.

Reference is made to FIG. 12. The heat treating units 25 are arranged in line in the upward/downward direction Z. The mounting units 26 are arranged in line in the upward/downward direction Z. The mounting units 26 are positioned so as to overlap the heat treating units 25 in plan view. In other words, the heat treating units 25 and the mounting units 26 are arranged in line in the upward/downward direction Z. The heat treating units 25 and the mounting units 26 are arranged one by one alternately in the upward/downward direction Z.

The first heat treatment block 21 includes a plurality of shelves 30. The shelves 30 each have substantially a flat plate shape. The shelves 30 are supported on the frame 22. The shelves 30 are arranged in line in the upward/downward direction Z. The heat treating units 25 and the mounting units 26 are supported on the shelves 30. The heat treating unit 25 and the mounting unit 26 are arranged between two of the shelves 30 adjacent to each other in the upward/downward direction Z. More specifically, each of the heat treating units 25 and each of the mounting units 26 are arranged between two of the shelves 30 adjacent to each other in the upward/downward direction Z. The number of heat treating unit 25 arranged between the two of the shelves 30 adjacent to each other in the upward/downward direction Z is one. The number of mounting unit 26 arranged between the two of the shelves 30 adjacent to each other in the upward/downward direction Z is one.

The heat treating unit 28 and the mounting unit 29 are arranged in the same manner as that of the heat treating unit 25 and the mounting unit 26 except for a symmetrical configuration.

Figure 13:
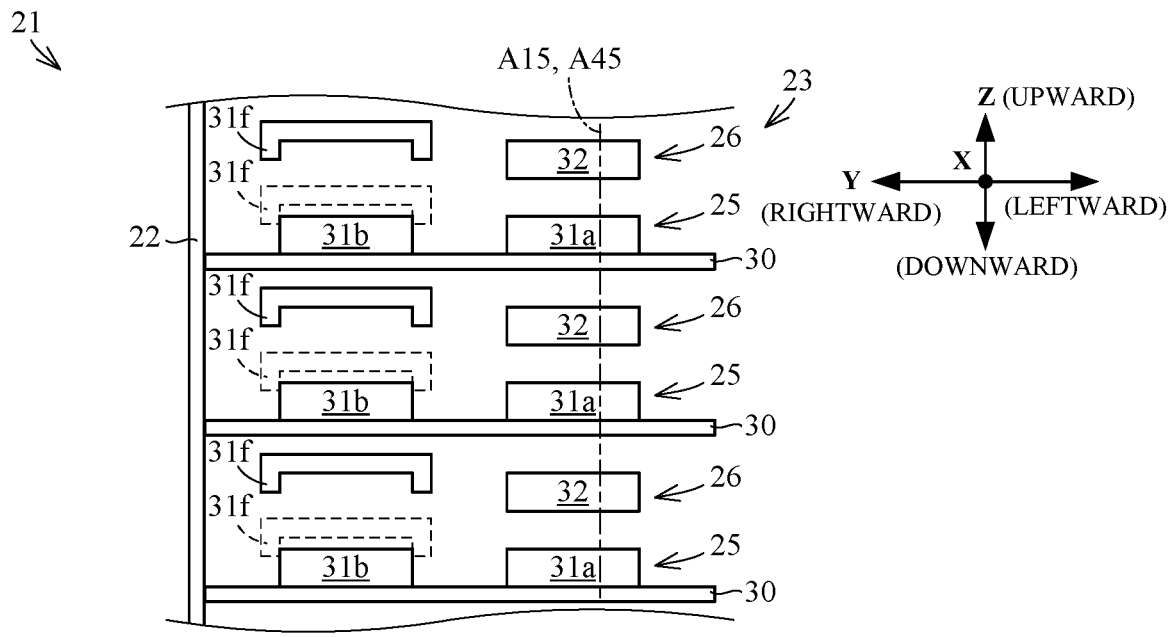
FIG. 13 is a front view of a heat treating unit and a mounting unit.
Figure 14A:
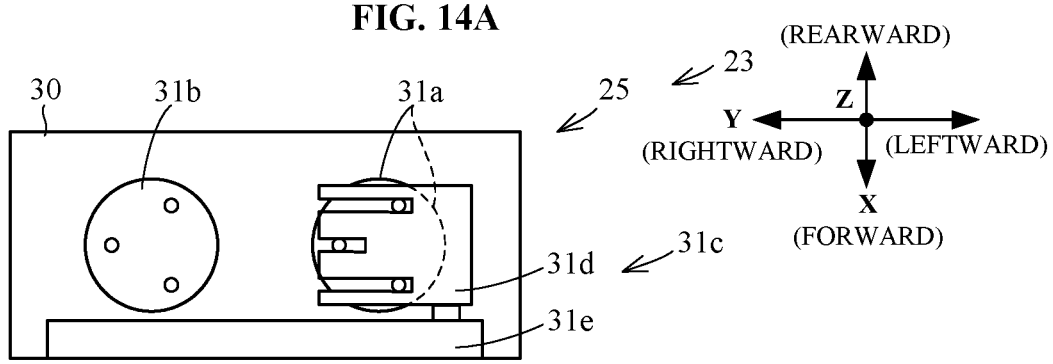
FIG. 14A is a plan view of a lower portion of the heat treating unit.
Figure 14B:
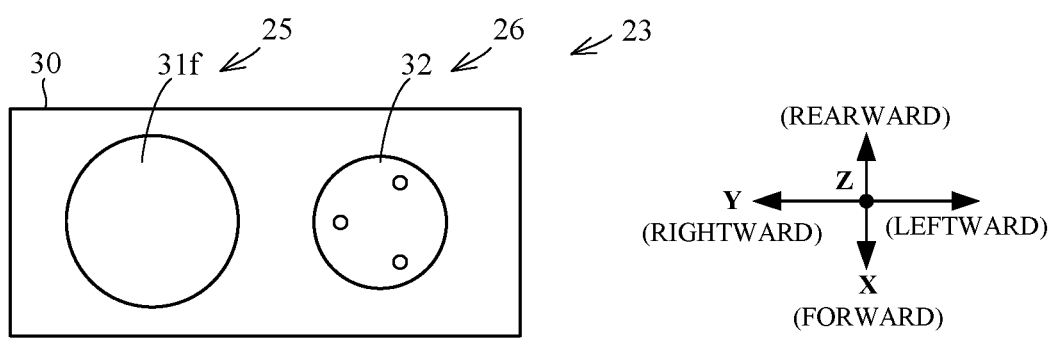
FIG. 14B is a plan view of an upper portion of the heat treating unit and the mounting unit.
Figure 15:
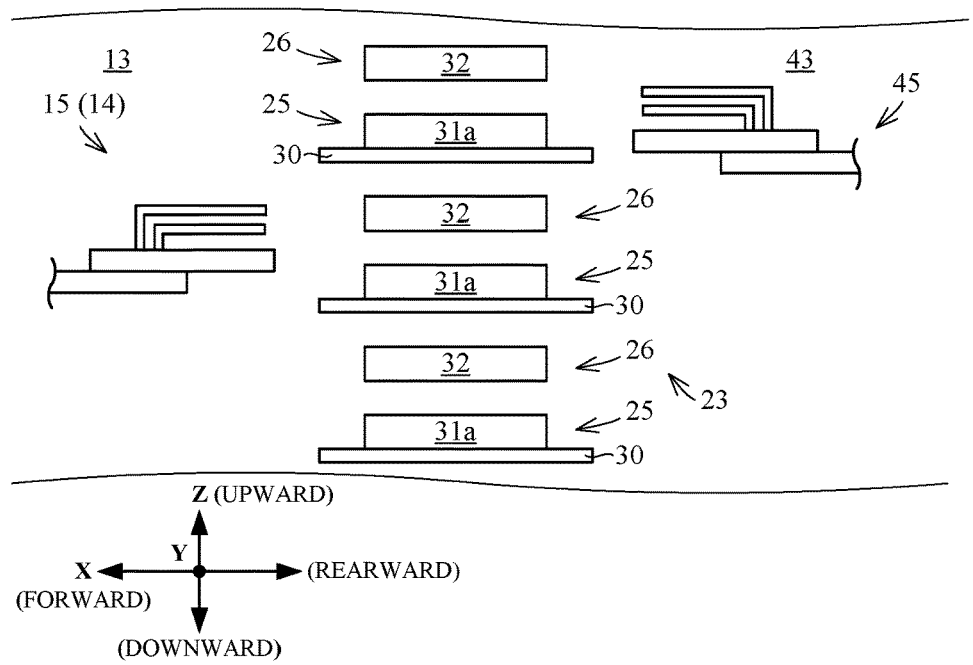
FIG. 15 is a side view of the heat treating unit, the mounting unit, and a transport mechanism.

FIG. 13 is a front view of the heat treating unit 25 and the mounting unit 26. FIG. 14A is a plan view of a lower portion of the heat treating unit 25. FIG. 14B is a plan view of an upper portion of the heat treating unit 25 and the mounting unit 26. FIG. 15 is a side view of the heat treating unit 25, the mounting unit 26, and transport mechanisms 15, 45. The following describes in detail the heat treating unit 25.

One substrate W is placed on one heat treating unit 25. The heat treating unit 25 performs further heat treatment to the placed substrate W. Here, examples of the heat treatment performed by the heat treating unit 25 include a hydrophobic treatment. The hydrophobic treatment is performed by adjusting the temperature of the substrate W to a given temperature while supplying treatment gases containing hexamethyldisilazane (HMDS) to the substrate W. The hydrophobic treatment is performed for obtaining an enhanced adhesion of the coating film to the substrate W.

The heat treating unit 25 includes a first plate 31a. The first plate 31a is disposed on the shelf 30. The first plate 31a is substantially discal. The first plate 31a has a substantially horizontal top face. One substrate W is placed on the top face of the first plate 31a.

The heat treating unit 25 includes a second plate 31b. The second plate 31b is disposed on the shelf 30. The second plate 31b is substantially discal. The second plate 31b has a substantially horizontal top face. One substrate W is placed on the top face of the second plate 31b.

The second plate 31b is disposed lateral of the first plate 31a. The second plate 31b is disposed rightward of the first plate 31a. The first plate 31a and the second plate 31b are disposed in the width direction Y. The second plate 31b is disposed at substantially the same level as that of the first plate 31a.

The heat treating unit 25 includes a local transport mechanism 31c. The local transport mechanism 31c transports the substrate W between the first plate 31 and the second plate 31b.

The local transport mechanism 31c includes a holder 31d and a drive unit 31e. The holder 31d contacts the substrate W. The holder 31d holds one substrate W horizontally. The drive unit 31e is connected to the holder 31d. The drive unit 31e causes the holder 31d to move in the width direction Y. The holder 31d is movable between a first position and a second position. The first position is disposed above the first plate 31a. When the holder 31d is disposed at the first position, the holder 31d is capable of loading the substrate W onto the first plate 31a and unloading the substrate W placed on the first plate 31a. FIG. 14A illustrates the holder 31d at the first position. The second position is disposed above the second plate 31b. If the holder 31d is disposed at the second position, the holder 31d is capable of loading the substrate W onto the second plate 31b and unloading the substrate W placed on the second plate 31b.

The heat treating unit 25 includes a first temperature regulator and a second temperature regulator, not shown. The first temperature regulator is attached to the first plate 31a. The first temperature regulator regulates the temperature of the first plate 31a to a first temperature. The first plate 31a regulates the substrate W to be the first temperature. The second temperature regulator is attached to the second plate 31b. The second temperature regulator regulates the temperature of the second plate 31b to the second temperature. The second plate 31b regulates the substrate W to be the second temperature. The second temperature is, for example, higher than the first temperature. For instance, the first plate 31a cools the substrate W. The second plate 31b heats the substrate W.

Here, the first plate 31a may regulate the temperature of the substrate W directly or indirectly. For instance, the first plate 31a may regulate the temperature of the substrate W on the first plate 31a directly. Alternatively, the first plate 31a may regulate the temperature of the substrate W indirectly via the holder 31d. Specifically, the first plate 31a may regulate the temperature of the holder 31d disposed thereon, and the holder 31d may regulate the temperature of the substrate W held by the holder 31d.

The heat treating unit 25 includes a lid 31f. The lid 31f is disposed above the second plate 31b. The lid 31f is movable in the upward/downward direction Z. The lid 31f is moved between a treatment position and a retracted position. FIG. 13 illustrates the lid 31f at the retracted position by solid lines. FIG. 13 illustrates the lid 31f at the treatment position by dotted lines. The retracted position is above the treatment position. When the lid 31f is in the retracted position, the local transport mechanism 31c is capable of performing access to the second plate 31b. Specifically, when the lid 31f is at the retracted position, the holder 31d is movable to the second position. When the holder 31d is out of the second position, the lid 31f is movable to the treatment position. When the lid 31f is at the treatment position, the lid 31f covers the top face of the second plate 31b. When the lid 31f is at the treatment position, a treating space below the lid 31f and above the second plate 31b is almost closed.

Here, the heat treating unit 25 includes a gas supplying unit, not shown, that supplies a treatment gas to the substrate W. The gas supplying unit is, for example, attached to the lid 31f. The gas supplying unit supplies the treatment gas to the treating space below the lid 31f and above the second plate 31b.

The heat treating unit 25 operates as under. When the substrate W is placed on the first plate 31a, the holder 31d is moved to the first position to pick up the substrate W placed on the first plate 31a. The lid 31f is disposed at the retracted position. The holder 31b is moved to the second position to place the substrate W on the second plate 31b. The holder 31d returns to the first position. The lid 31f is moved from the retracted position to the treatment position. The treating space below the lid 31f and above the second plate 31b is almost closed. The second plate 31b regulates the substrate W to be the second temperature. The gas supplying unit supplies the treatment gas into the treating space. If given time elapses, the gas supplying unit stops supplying the treatment gas. The lid 31f is moved from the treatment position to the retracted position. The local transport mechanism 31c transports the substrate W from the second plate 31b to the first plate 31a. The first plate 31a regulates the substrate W to be the first temperature. This finishes the heat treatment (e.g., the hydrophobic treatment) to the substrate W.

The following describes in detail the mounting unit 26. One substrate W is placed on one mounting unit 26. The mounting unit 26 performs no treatment to the substrate W. The substrate W is merely placed on the mounting unit 26.

The mounting unit 26 includes a mounting plate 32 where the substrate W is placed. The mounting plate 32 is supported on the shelf 30. The mounting plate 32 has substantially a discal shape. The mounting plate 32 has a substantially horizontal top face. One substrate W is placed on the top face of the mounting plate 32. As for the uppermost mounting plate 32, a shelf, not shown, may be disposed above the uppermost mounting plate 32, and may support the uppermost mounting plate 32. Alternatively, the uppermost mounting plate 32 may be supported on the frame 22.

The mounting plate 32 is disposed above the first plate 31a. The mounting plate 32 is positioned so as to overlap the first plate 31a in plan view. The mounting plate 32 is disposed lateral of the lid 31f. The mounting plate 32 is disposed leftward of the lid 31f. The mounting plate 32 and the lid 31f are arranged in line in the width direction Y. The mounting plate 32 is disposed at substantially the same level as that of the lid 31f. The mounting plate 32 is disposed at substantially the same level as that of the lid 31f at the retracted position.

Reference is made to FIG. 15. The first plate 31a and the mounting plate 32 are open forward. The first plate 31a and the mounting plate 32 are open to the transportation space 13 of the indexer block 11.

The first plate 31a and the mounting plate 32 are disposed within the area B15. Accordingly, the transport mechanism 15 is accessible to the heat treating unit 25 and the mounting unit 26. Consequently, in other words, the heat treating unit 25 and the mounting unit 26 are arranged in the area B15.

The first plate 31a and the mounting plate 32 are open rearward. The first plate 31a and the mounting plate 32 are open to the transportation space 43 of the first transportation block 41. The first plate 31a and the mounting plate 32 are disposed within the area B45. Accordingly, the heat treating unit 25 and the mounting unit 26 are arranged in the area B45.

Consequently, the heat treating unit 25 and the mounting unit 26 are arranged in the area where the areas B15, B45 overlap each other.

The heat treating unit 28 and the mounting unit 29 have substantially the same configuration and shape as that of the heat treating unit 25 and the mounting unit 26 except for a symmetrical configuration. The heat treating unit 28 and the mounting unit 29 are arranged in the same manner as that of the heat treating unit 25 and the mounting unit 26 except for a symmetrical configuration. The heat treating unit 28 and the mounting unit 29 are arranged in the area where the areas B16, B46 overlap each other.

Figure 16:
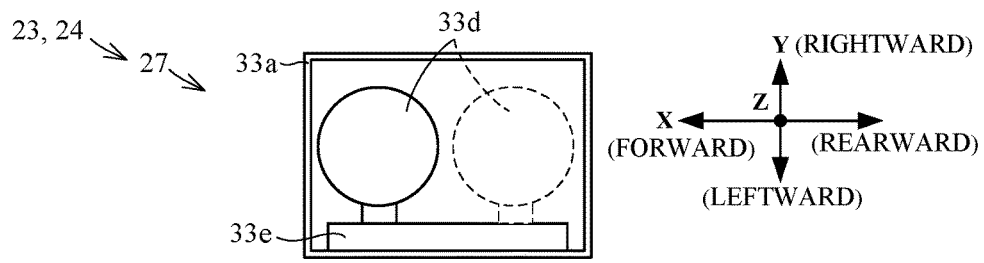
FIG. 16 is a plan view of an inspecting unit.
Figure 17:
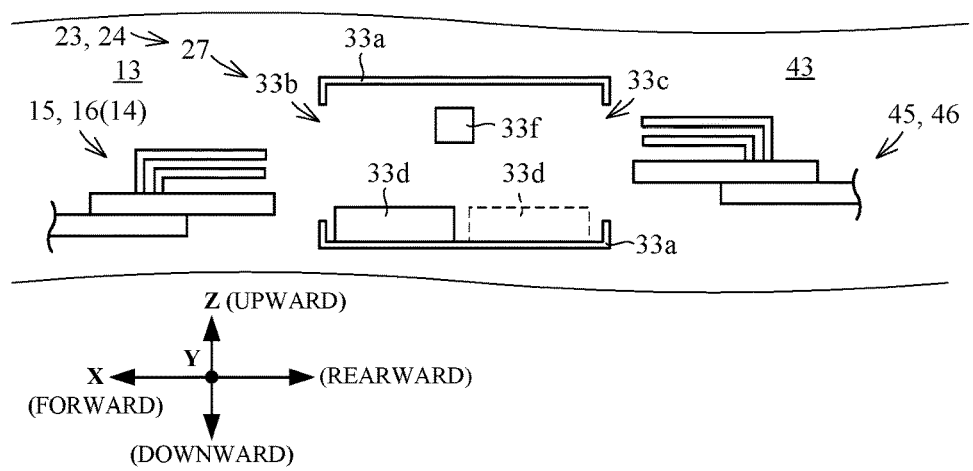
FIG. 17 is a side view of the inspecting unit and the transport mechanism.

FIG. 16 is a plan view of an inspecting unit 27. FIG. 17 is a side view of the inspecting unit 27 and the transport mechanisms, 14, 45, 46. The following describes in detail the inspecting unit 27.

One substrate W is placed on one inspecting unit 27. The inspecting unit 27 performs inspection to the one placed substrate W. For instance, the inspecting unit 27 performs inspection to the surface of the substrate W.

The inspecting unit 27 includes a casing 33a. The casing 33a is supported on the frame 22. The casing 33a has substantially a box shape. The casing 33a includes openings 33b, 33c through which the substrate W passes. The opening 33b is formed in a front face of the casing 33a. The opening 33c is formed in a rear face of the casing 33a.

The inspecting unit 27 includes a mounting plate 33d. The mounting plate 33d is disposed within the casing 33a. The mounting plate 33d is supported on the casing 33a. The mounting plate 33d has substantially a discal shape. The mounting plate 33d has a substantially horizontal top face. One substrate W is placed on the top face of the mounting plate 33d.

The inspecting unit 27 includes a drive unit 33e. The drive unit 33e is disposed within the casing 33a. The drive unit 33e is supported on the casing 33a. The drive unit 33e is connected to the mounting plate 33d. The drive unit 33e causes the mounting plate 33d to move in the forward/rearward direction X. The mounting plate 33d moves between a front position and a rear position. FIGS. 16, 17 each illustrate the mounting plate 33d at the front position by solid lines. FIGS. 16, 17 each illustrate the mounting plate 33d at the rear position by dotted lines. The front position is disposed forward of the rear position. The front and rear positions are within the casing 33a.

The inspecting unit 27 includes an imaging unit 33f. The imaging unit 33f is disposed within the casing 33a. The imaging unit 33f is supported on the casing 33a. The imaging unit 33f is disposed above the mounting plate 33d. The imaging unit 33d images the surface of the substrate W placed on the mounting plate 33d. The driving unit 33e may move the mounting plate 33d while the imaging unit 33f images the substrate W.

The mounting plate 33d is open forward through the opening 33b. The mounting plate 33d is open to the transportation space 13 of the indexer block 11 through the opening 33b.

The mounting plate 33d at the front position is disposed within the area B15. Accordingly, the inspecting unit 27 is arranged in the area B15. Moreover, the mounting plate 33d at the front position is disposed within the area B16. Accordingly, the inspecting unit 27 is arranged in the area B16.

The mounting plate 33d is open rearward through the opening 33c. The mounting plate 33d is open to the transportation space 43 of the first transportation block 41 through the opening 33c.

The mounting plate 33d at the rear position is disposed within the area B45. Accordingly, the inspecting unit 27 is arranged in the area B45. Moreover, the mounting plate 33d at the rear position is disposed within the area B46. Accordingly, the inspecting unit 27 is arranged within the area B46.

In summary, the intermediate part 23 (i.e., the heat treating unit 25, the mounting unit 26, and the inspecting unit 27) are disposed in the overlapped area where the areas B15, B45 overlap each other. Specifically, the intermediate part 23 is disposed adjacent to the rear side of the transport mechanism 15 and front side of the transport mechanism 45.

The intermediate part 24 (i.e., the heat treating unit 28, the mounting unit 29, and the inspecting unit 27) are disposed in the overlapped portion where the areas B16, B46 overlap each other. Specifically, the intermediate part 24 is disposed adjacent to the rear side of the transport mechanism 16 and front side of the transport mechanism 46.

In particular, the common portion of the intermediate parts 23, 24 (i.e., the inspecting unit 27) is disposed in the overlapped area where the areas B15, B16, B45, B46 overlap each other. The heat treating unit 25 and the mounting unit 26 are arranged at a position out of the areas B16, B46. The heat treating unit 28 and the mounting unit 29 are arranged at a position out of the areas B15, B45.

The intermediate parts 23, 24 are disposed out of the areas B65, B66, B75, B76.

Reference is made to FIGS. 12 and 13. The heat treating unit 25 and the mounting unit 26 are positioned so as to overlap a rotation axis A15 of the transport mechanism 15 in front view. More specifically, the first plate 31a of the heat treating unit 25 and the mounting plate 32 of the mounting unit 26 are arranged at positions that overlap the rotation axis A15 of the transport mechanism 15 in front view.

The heat treating unit 25 and the mounting unit 26 are positioned so as to overlap a rotation axis A45 of the transport mechanism 45 in front view. More specifically, the first plate 31a of the heat treating unit 25 and the mounting plate 32 of the mounting unit 26 are arranged at positions that overlap the rotation axis A45 of the transport mechanism 45 in front view.

The rotation axis A45 of the heat treating unit 45 is positioned so as to overlap a rotation axis A15 of the transport mechanism 15 in front view.

Likewise, the heat treating unit 28 and the mounting unit 29 are positioned so as to overlap a rotation axis A16 of the transport mechanism 16 in front view. The heat treating unit 28 and the mounting unit 29 are positioned so as to overlap a rotation axis A46 of the transport mechanism 46 in front view. The rotation axis A46 of the heat treating unit 46 is positioned so as to overlap a rotation axis A16 of the transport mechanism 16 in front view.

The inspecting unit 27 is disposed leftward of the rotation axis A15 of the transport mechanism 15 and rightward of the rotation axis 16A of the transport mechanism 16 in front view. The inspecting unit 27 is disposed leftward of the rotation axis A45 of the transport mechanism 45 and rightward of the rotation axis 46A of the transport mechanism 46 in front view.

The heat treating unit 25 and the mounting unit 26 are positioned so as to overlap the transport mechanism 15 in front view, which illustration is to be omitted. The heat treating unit 25 and the mounting unit 26 are positioned so as to overlap the transport mechanism 45 in front view. The heat treating unit 28 and the mounting unit 29 are positioned so as to overlap the transport mechanism 16 in front view. The heat treating unit 28 and the mounting unit 29 are positioned so as to overlap the transport mechanism 46 in front view.

Second Heat Treatment Block

Figure 18:
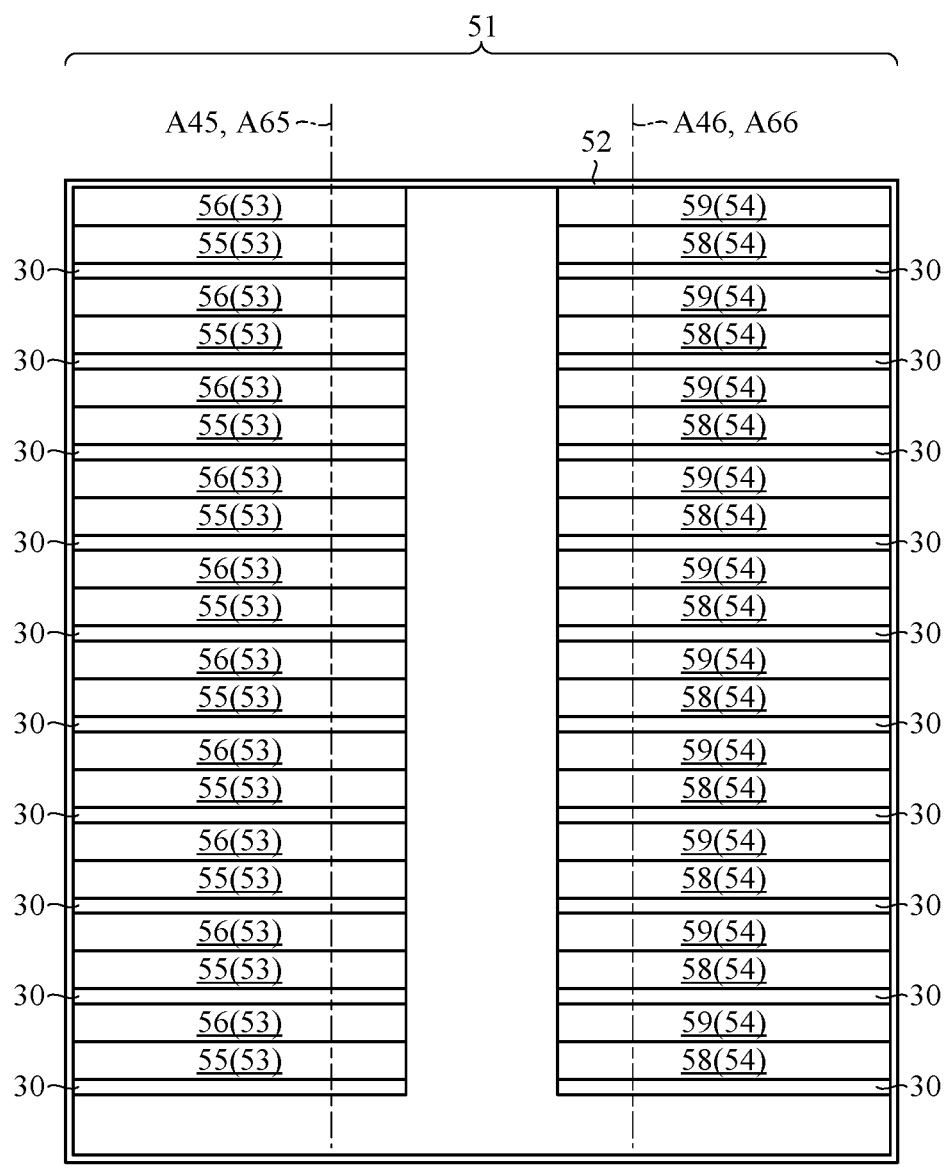
FIG. 18 is a front view of a second heat treatment block.

Reference is made to FIGS. 4, 6 to 8, and 18. FIG. 18 is a front view of a second heat treatment block 51. The second heat treatment block 51 is connected to a first transportation block 41 and a second transportation block 61. The second heat treatment block 51 has substantially a box shape. The second heat treatment block 51 is substantially rectangular in plan view, in front view, and in side view.

The second heat treatment block 51 has a frame 52. The frame 52 is provided as a shell (contour) of the second heat treatment block 51. The frame 52 defines the shape of the second heat treatment block 51. The frame 52 is, for example, made of metal.

The second heat treatment block 51 includes intermediate parts 53, 54. The substrate W is placed on the intermediate parts 53, 54. The intermediate parts 53, 54 are arranged in line in the width direction Y. The intermediate part 53 is disposed rightward of the intermediate part 54.

The intermediate part 53 is disposed between the transport mechanism 45 and the transport mechanism 65 adjacent to each other in the forward/rearward direction X. The intermediate part 54 is disposed between the transport mechanism 46 and the transport mechanism 66 adjacent to each other in the forward/rearward direction X.

The intermediate parts 53, 54 each perform further treatment to the substrate W placed on the intermediate parts 53, 54, respectively.

The intermediate part 53 includes a plurality of heat treating units 55 and a plurality of mounting units 56. The intermediate part 54 includes a plurality of heat treating units 58 and a plurality of mounting units 59. The heat treating unit 55 and the mounting unit 56 are disposed rightward of the heat treating unit 58 and the mounting unit 59 in plan view.

The heat treating unit 55 and the mounting unit 56 are each disposed rearward of the transport mechanism 45 and forward of the transport mechanism 65. The heat treating unit 58 and the mounting unit 59 are each disposed rearward of the transport mechanism 46 and forward of the transport mechanism 66.

The heat treating units 55, 58 and the mounting units 56, 59 are disposed at substantially the same level as that of the transport mechanisms 45, 46, 65, 66, respectively. Specifically, the heat treating units 55, 58 and the mounting units 56, 59 are disposed at the level where the transport mechanisms 45, 46, 65, 66 are capable of transporting the substrates W.

The heat treating units 55 are arranged in line the in upward/downward direction Z. The mounting units 56 are arranged in line in the upward/downward direction Z. The mounting units 56 are positioned so as to overlap the heat treating units 55 in plan view. In other words, the heat treating units 55 and the mounting units 56 are arranged in line in the upward/downward direction Z. The heat treating unit 55 and the mounting unit 56 are arranged one by one alternately. The heat treating unit 58 and the mounting unit 59 are arranged in the same manner as that of the heat treating unit 55 and the mounting unit 56 except for a symmetrical configuration.

The heat treating units 55, 58 and the mounting units 56, 59 are disposed with the shelf 30 in the same manner as that of the heat treating units 25, 28 and the mounting units 26, 29.

One substrate W is placed on one heat treating unit 55. The heat treating unit 55 performs further heat treatment to the placed substrate W. Here, examples of the heat treatment performed by the heat treating unit 55 include a heating treatment. The heat treating unit 55 has substantially the same configuration and shape as that of the heat treating unit 25. Here, the heat treating unit 55 does not necessarily include a gas supplying unit, not shown, of the heat treating unit 25.

One substrate W is placed on one mounting unit 56. The mounting unit 56 performs no treatment to the substrates W. The substrate W is merely placed on the mounting unit 56. The mounting unit 56 has substantially the same configuration and shape as that of the mounting unit 26.

The heat treating unit 58 and the mounting unit 59 have substantially the same configuration and shape as that of the heat treating unit 55 and the mounting unit 56 except for a symmetrical configuration.

Reference is made to FIG. 4. The heat treating unit 55 and the mounting unit 56 are arranged in the area where the areas B45, B65 overlap each other. Consequently, the intermediate part 53 (i.e., the heat treating unit 55 and the mounting unit 56) is disposed in the area where the areas B45, B65 overlap each other. Specifically, the intermediate part 53 is disposed adjacent to the rear side of the transport mechanism 45 and front side of the transport mechanism 65. The processing part 53 is disposed out of the areas B46, B66.

The heat treating unit 58 and the mounting unit 59 are disposed in the area where the areas B46, B66 overlap each other. Consequently, the intermediate part 54 (i.e., the heat treating unit 58 and the mounting unit 59) is disposed in the area where the areas B46, B66 overlap each other. Specifically, the intermediate part 54 is disposed adjacent to the rear side of the transport mechanism 46 and front side of the transport mechanism 66. The intermediate part 54 is disposed out of the areas B45, B65.

Here, the intermediate parts 53, 54 are disposed out of the areas B15, B16 B75, B76.

Reference is made to FIG. 18. The heat treating unit 55 and the mounting unit 56 are positioned so as to overlap a rotation axis A45 of the transport mechanism 45 in front view. The heat treating unit 55 and the mounting unit 56 are positioned so as to overlap a rotation axis A65 of the transport mechanism 65 in front view. The rotation axis A45 of the heat treating unit 45 is arranged positioned so as to overlap the rotation axis A65 of the transport mechanism 65 in front view.

The heat treating unit 58 and the mounting unit 59 are positioned so as to overlap a rotation axis A46 of the transport mechanism 46 in front view. The heat treating unit 58 and the mounting unit 59 are positioned so as to overlap a rotation axis A66 of the transport mechanism 66 in front view. The rotation axis A46 of the heat treating unit 46 is positioned so as to overlap the rotation axis A66 of the transport mechanism 66 in front view.

The heat treating unit 55 and the mounting unit 56 are positioned so as to overlap the transport mechanism 45 in front view, which illustration is to be omitted. The heat treating unit 55 and the mounting unit 56 are positioned so as to overlap the transport mechanism 65 in front view. The heat treating unit 58 and the mounting unit 59 are positioned so as to overlap the transport mechanism 46 in front view. The heat treating unit 58 and the mounting unit 59 are positioned so as to overlap the transport mechanism 66 in front view.

Intermediate Part 92

Reference is made to FIGS. 4, 7, and 11. The substrate treating apparatus 1 further includes an intermediate part 92. The substrate W is placed on the intermediate part 92.

The intermediate part 92 is disposed between the transport mechanism 65 and the transport mechanism 74 adjacent to each other in the forward/rearward direction X. The intermediate part 92 is disposed between the transport mechanism 66 and the transport mechanism 74 adjacent to each other in the forward/rearward direction X. The intermediate part 92 is disposed rearward of the transport mechanisms 65, 66 and forward of the transport mechanism 74. Specifically, the intermediate part 92 is disposed rearward and leftward of the transport mechanism 65. The intermediate part 92 is disposed rearward and rightward of the transport mechanism 66. The intermediate part 92 is disposed at substantially the same interval from the transport mechanisms 65, 66.

The intermediate part 92 is disposed between the second transportation block 61 and liquid treatment block 71. The intermediate part 92 is disposed across the transportation space 63 of the second transportation block 61 and the transportation space 73 of the liquid treatment block 71.

The intermediate part 92 includes intermediate sections 93, 94. The substrate W is placed on the intermediate sections 93, 94. The intermediate sections 93, 94 are arranged in line in upward/downward direction Z. The intermediate section 93 is disposed above the intermediate section 94. The intermediate section 94 is positioned so as to overlap the intermediate section 93 in plan view.

The intermediate section 93 is disposed across the transportation space 63 of the second transportation block 61 and a transportation space 73T of the liquid treatment block 71. The intermediate section 93 is disposed forward of the transport mechanism 75. The intermediate section 93 is disposed at substantially the same level as that of the transport mechanism 75. The intermediate section 93 is disposed at substantially the same level as that of the transport mechanisms 65, 66. Specifically, the intermediate section 93 disposed at the level where the transport mechanisms 65, 66, 75 are capable of transporting the substrates W. More specifically, the intermediate section 93 is disposed at the level within a range where the holders 17d, 17e of the transport mechanisms 65, 66 are movable and the holders 77f, 77g of the transport mechanism 75 are movable.

The intermediate section 94 is disposed across the transportation space 63 of the second transportation block 61 and a transportation space 73B of the liquid treatment block 71. The intermediate section 94 is disposed forward of the transport mechanism 76. The intermediate section 94 is disposed at substantially the same level as that of the transport mechanism 76. The intermediate section 94 is disposed at substantially the same level as that of the transport mechanisms 65, 66. Specifically, the intermediate section 94 disposed at the level where the transport mechanisms 65, 66, 76 are capable of transporting the substrates W.

The intermediate sections 93, 94 each perform further treatment to the substrate W placed on the intermediate sections 93, 94, respectively.

The intermediate section 93 includes a plurality of mounting-cum-cooling units 95 and a plurality of mounting units 96. The mounting-cum-cooling units 95 are arranged in line in the upward/downward direction Z. The mounting units 96 are arranged in line in the upward/downward direction Z. The mounting units 96 overlap the mounting-cum-cooling units 95 in plan view. The mounting-cum-cooling units 95 and the mounting units 96 are arranged in line in the upward/downward direction Z.

The intermediate section 94 includes a plurality of mounting-cum-cooling units 98 and a plurality of mounting units 99. The mounting-cum-cooling units 98 are arranged in line in the upward/downward direction Z. The mounting units 99 are arranged in line in the upward/downward direction Z. The mounting units 99 are positioned so as to overlap the mounting-cum-cooling units 98 in plan view. The mounting-cum-cooling units 98 and the mounting units 99 are arranged in line in the upward/downward direction Z. The mounting-cum-cooling units 98 and the mounting units 99 are overlap the mounting-cum-cooling units 95 and the mounting units 96 in plan view.

Reference is made to FIG. 11. One substrate W is placed on one mounting-cum-cooling unit 95. The mounting-cum-cooling unit 95 performs further heat treatment to the placed substrate W. Here, examples of the heat treatment performed by the mounting-cum-cooling unit 95 include a cooling treatment.

The mounting-cum-cooling unit 95 includes a mounting plate 97. The mounting plate 97 has substantially a discal shape. The mounting plate 97 has a substantially horizontal top face. One substrate W is placed on the top face of the mounting plate 97.

The mounting-cum-cooling unit 95 further includes a temperature regulator (not shown). The temperature regulator is attached to the mounting plate 97. The temperature regulator regulates the temperature of the mounting plate 97 to a given temperature. The given temperature is, for example, a temperature of the substrate W suitable for the liquid treatment by the processing part 81. For instance, the mounting plate 97 cools the substrate W.

One substrate W is placed on one mounting unit 96. The mounting unit 96 performs no treatment to the substrates W. The substrate W is merely placed on the mounting unit 96. The mounting unit 96 has substantially the same configuration and shape as that of the mounting unit 26.

The mounting-cum-cooling unit 98 and the mounting unit 99 have substantially the same configuration and shape as that of the mounting-cum-cooling unit 95 and the mounting unit 96.

Reference is made to FIG. 4. The mounting-cum-cooling unit 95 and the mounting unit 96 are disposed in the area where the areas B65, B75 overlap each other. Accordingly, the intermediate section 93 (i.e., the mounting-cum-cooling unit 95 and the mounting unit 96) is disposed in the area where the areas B65, B75 overlap each other. Specifically, the intermediate section 93 is disposed adjacent to the rear side of the transport mechanism 65 and front side of the transport mechanism 75. Furthermore, the intermediate section 93 is disposed in the area where the areas B66, B75 overlap each other. The intermediate section 93 is disposed out of the area B76.

The mounting-cum-cooling unit 98 and the mounting unit 99 are disposed in the area where the areas B66, B76 overlap each other. Accordingly, the intermediate section 94 (i.e., the mounting-cum-cooling unit 98 and the mounting unit 99) is disposed in the area where the areas B66, B76 overlap each other. Specifically, the intermediate section 94 is disposed adjacent to the rear side of the transport mechanism 66 and front side of the transport mechanism 76. Furthermore, the intermediate section 94 is disposed in the area where the areas B65, B76 overlap each other. The intermediate section 94 is disposed out of the area B75.

Here, the intermediate part 92 (93, 94) is disposed out of the areas B15, B16 B45, B46.

Cycle Operation by Individual Transport Mechanism

The transport mechanisms 14, 45, 46, 65, 66, 74 each repeat cycle operation in accordance with the control by the controller 6 in FIG. 1.

The cycle operation performed by the transport mechanism 15 includes only the first access operation and the second access operation. The first access operation by the transport mechanism 15 is operation of accessing the carrier C mounted on the carrier mount table 12A. The first access operation by the transport mechanism 15 includes operation of unloading the substrate W from the carrier C mounted on the carrier mount table 12A and loading the substrate W into the carrier C mounted on the carrier mount table 12A. The second access operation performed by the transport mechanism 15 is operation of accessing the intermediate part 23. The second access operation by the transport mechanism 15 includes operation of loading the substrate W into the heat treating unit 25 and unloading the substrate W from the mounting unit 26 or the inspecting unit 27.

The cycle operation performed by end transport mechanism 16 includes only the first access operation and the second access operation. The first access operation by the transport mechanism 16 is operation of accessing the carrier C mounted on the carrier mount table 12B. The first access operation by the transport mechanism 16 includes operation of unloading the substrate W from the carrier C mounted on the carrier mount table 12B and loading the substrate W into the carrier C mounted on the carrier mount table 12B. The second access operation performed by the transport mechanism 16 is operation of accessing the intermediate part 24. The second access operation by the transport mechanism 16 includes operation of loading the substrate W into the heat treating unit 28 and unloading the substrate W from the mounting unit 29 or the inspecting unit 27.

The cycle operation performed by the transport mechanism 45 includes only the first access operation and the second access operation. The first access operation performed by the transport mechanism 45 is operation of accessing the intermediate part 23. The first access operation by the transport mechanism 45 includes operation of unloading the substrate W from the heat treating unit 25 and loading the substrate W into the mounting unit 26 or the inspecting unit 27. The second access operation performed by the transport mechanism 45 is operation of accessing the intermediate part 53. The second access operation by the transport mechanism 45 includes operation of loading the substrate W into the mounting unit 56 and unloading the substrate W from the heat treating unit 55.

The cycle operation performed by the transport mechanism 46 includes only the first access operation and the second access operation. The first access operation performed by the transport mechanism 46 is operation of accessing the intermediate part 24. The first access operation by the transport mechanism 46 includes operation of unloading the substrate W from the heat treating unit 28 and loading the substrate W into the mounting unit 29 or the inspecting unit 27. The second access operation performed by the transport mechanism 46 is operation of accessing the intermediate part 54. The second access operation by the transport mechanism 46 includes operation of loading the substrate W into the mounting unit 59 and unloading the substrate W from the heat treating unit 58.

The cycle operation performed by the transport mechanism 65 includes only the first access operation and the second access operation. The first access operation performed by the transport mechanism 65 is operation of accessing the intermediate part 53. The first access operation by the transport mechanism 65 includes operation of unloading the substrate W from the mounting unit 56 and loading the substrate W into the heat treating unit 55. The second access operation performed by the transport mechanism 65 is operation of accessing the intermediate section 93. The second access operation by the transport mechanism 65 includes operation of loading the substrate W into the mounting-cum-cooling unit 95 and unloading the substrate W from the mounting unit 96.

The cycle operation performed by the transport mechanism 66 includes only the first access operation and the second access operation. The first access operation performed by the transport mechanism 66 is operation of accessing the intermediate part 54. The first access operation by the transport mechanism 66 includes operation of unloading the substrate W from the mounting unit 59 and loading the substrate W into the heat treating unit 58. The second access operation performed by the transport mechanism 66 is operation of accessing the intermediate section 94. The second access operation by the transport mechanism 66 includes operation of loading the substrate W into the mounting-cum-cooling unit 98 and unloading the substrate W from the mounting unit 99.

The cycle operation performed by the transport mechanism 75 includes only the first access operation and the second access operation. The first access operation performed by the transport mechanism 75 is operation of accessing the intermediate section 93. The first access operation by the transport mechanism 75 includes operation of unloading the substrate W from the mounting-cum-cooling unit 95 and loading the substrate W into the mounting unit 96. The second access operation performed by the transport mechanism 75 is operation of accessing the processing section 82. The second access operation by the transport mechanism 75 includes operation of loading the substrate W into the liquid treating unit 84 and unloading the substrate W from the liquid treating unit 84.

The cycle operation performed by the transport mechanism 76 includes only the first access operation and the second access operation. The first access operation performed by the transport mechanism 76 is operation of accessing the intermediate section 94. The first access operation by the transport mechanism 76 includes operation of unloading the substrate W from the mounting-cum-cooling unit 98 and loading the substrate W into the mounting unit 99. The second access operation performed by the transport mechanism 76 is operation of accessing the processing section 83. The second access operation by the transport mechanism 76 includes operation of loading the substrate W into the liquid treating unit 85 and unloading the substrate W from the liquid treating unit 85.

The following describes correspondence between the elements in FIGS. 4 to 18 and the elements in FIGS. 1 to 3. The transport mechanisms 15, 65 correspond to the first and second transport mechanisms 1, 2, respectively. The transport mechanism 45 corresponds to the intermediate transport mechanism 3. The intermediate parts 23, 53 correspond to the first and second intermediate parts 4, 5, respectively. The heat treating unit 25 corresponds to the first sending unit 4S. The mounting unit 26 and the inspecting unit 27 correspond to the first return unit 4R. The mounting unit 56 corresponds to the second sending unit 5S. The heat treating unit 55 corresponds to the second return unit 5R.

Likewise, the transport mechanisms 16, 66 correspond to the first and second transport mechanisms 1, 2, respectively. The transport mechanism 46 corresponds to the intermediate transport mechanism 3. The intermediate parts 24, 54 correspond to the first and second intermediate parts 4, 5, respectively. The heat treating unit 28 corresponds to the first sending unit 4S. The inspecting unit 27 and the mounting unit 29 correspond to the first return unit 4R. The mounting unit 59 corresponds to the second sending unit 5S. The heat treating unit 58 corresponds to the second return unit 5R.

The transport mechanisms 45, 75 correspond to the first and second transport mechanisms 1, 2, respectively. The transport mechanism 65 corresponds to the intermediate transport mechanism 3. The intermediate part 53 and the intermediate section 93 correspond to the first and second intermediate parts 4, 5, respectively. The mounting unit 56 corresponds to the first sending unit 4S. The heat treating unit 55 corresponds to the first return unit 4R. The mounting-cum-cooling unit 95 corresponds to the second sending unit 5S. The mounting unit 96 corresponds to the second return unit 4R.

Likewise, the transport mechanisms 46, 76 correspond to the first and second transport mechanisms 1, 2, respectively. The transport mechanism 66 corresponds to the intermediate transport mechanism 3. The intermediate parts 54 and the intermediate section 94 correspond to the first and second intermediate parts 4, 5, respectively. The mounting unit 59 corresponds to the first sending unit 4S. The heat treating unit 58 corresponds to the first return unit 4R. The mounting-cum-cooling unit 98 corresponds to the second sending unit 5S. The mounting unit 99 corresponds to the second return unit 5R.

The transport mechanism 14 (15, 16) is one example of the front end transport mechanism in the present invention. The transport mechanism 74 (75, 76) is one example of the rear end transport mechanism in the present invention. The transport mechanisms 45, 46, 65, 66 are one example of the intermediate transport mechanism in the present invention. The intermediate parts 23, 24 are one example of the front end intermediate part in the present invention. The intermediate part 92 (93, 94) is one example of the rear end intermediate part in the present invention. The processing part 81 (82, 83) is one example of the rear end processing part in the present invention.

Example of Operation of Substrate Treating Apparatus 10

Figure 19:
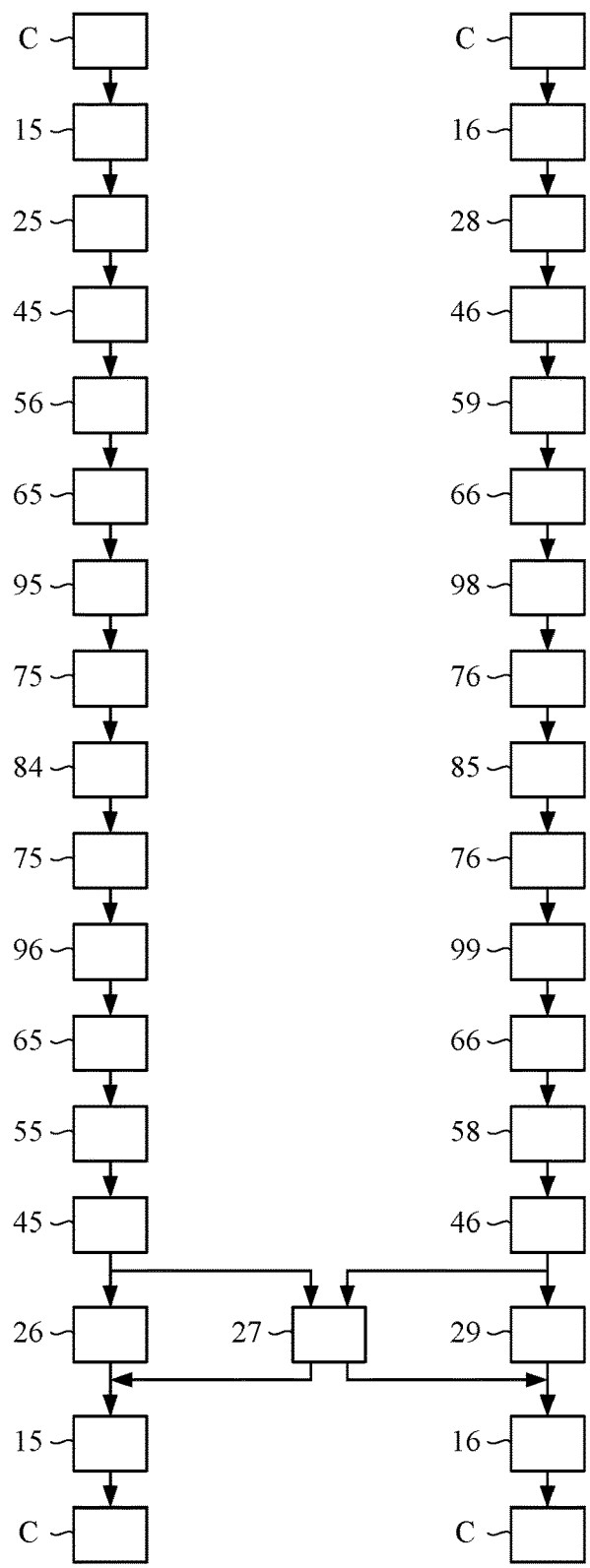
FIG. 19 schematically illustrates a transportation path of the substrate.

FIG. 19 schematically illustrates a transportation path of the substrate W. The transport mechanisms 15, 45, 65, 75 transport the substrate W in a similar manner to the transport mechanisms 16, 46, 66, 76, respectively. Accordingly, description is made of transporting the substrate W by the transport mechanisms 15, 45, 65, 75, and thus description of transporting the substrate W by the transport mechanisms 16, 46, 66, 76 is to be omitted.

The transport mechanism 15 unloads the substrate W from the carrier C mounted on the carrier mount table 12A (first access operation by the transport mechanism 15). The transport mechanism 15 places the substrate W on the heat treating unit 25 (specifically, the first plate 31a of the heat treating unit 25) (second access operation by the transport mechanism 15). The heat treating unit 25 performs the hydrophobic treatment to the substrate W.

The transport mechanism 45 unloads the substrate W from the heat treating unit 25 (specifically, the first plate 31a of the heat treating unit 25) (first access operation by the transport mechanism 45). The transport mechanism 45 places the substrate W on the mounting unit 56 (second access operation by the transport mechanism 45).

The transport mechanism 65 unloads the substrate W from the mounting unit 56 (first access operation by the transport mechanism 65). The transport mechanism 65 places the substrate W on the mounting-cum-cooling unit 95 (second access operation by the transport mechanism 65). The mounting-cum-cooling unit 95 cools the substrate W.

The transport mechanism 75 unloads the substrate W from the mounting-cum-cooling unit 95 (first access operation by the transport mechanism 75). The transport mechanism 75 places the substrate W on the liquid treating unit 84 (second access operation by the transport mechanism 75). The liquid treating unit 84 performs the liquid treatment to the substrate W. The transport mechanism 75 unloads the substrate W from the liquid treating unit 84 (second access operation by the transport mechanism 75). The transport mechanism 75 places the substrate W on the mounting unit 96 (first access operation by the transport mechanism 75).

The transport mechanism 65 unloads the substrate W from the mounting unit 96 (second access operation by the transport mechanism 65). The transport mechanism 65 places the substrate W on the heat treating unit 55 (first access operation by the transport mechanism 65). The heat treating unit 55 performs the heat treatment to the substrate W.

The transport mechanism 45 unloads the substrate W from the heat treating unit 55 (second access operation by the transport mechanism 45). The transport mechanism 45 transports the substrate W to either the mounting unit 26 or the inspecting unit 27 (first access operation by the transport mechanism 45).

When the transport mechanism 45 transports the substrate W to the mounting unit 26, the transport mechanism 15 unloads the substrate W from the mounting unit 26 (second access operation by the transport mechanism 15). When the transport mechanism 45 transports the substrate W to the inspecting unit 27, the inspecting unit 27 inspects the substrate W. Thereafter, the transport mechanism 15 unloads the substrate W from the inspecting unit 27 (second access operation by the transport mechanism 15).

The transport mechanism 15 loads the substrate W into the carrier C mounted on the carrier mount table 12A (first access operation by the transport mechanism 15).

Other Effect of First Embodiment

The primary effect of the first embodiment has already been described as above. For instance, the cycle operation performed by the transport mechanism 45 includes only two access operations (i.e., the first access operation and the second access operation). Accordingly, relatively high transportation efficiency by the transport mechanism 45 is obtainable. This achieves suitably enhanced throughput of the substrate treating apparatus 10.

From the similar reason, relatively high transportation efficiency by the transport mechanisms 46, 65, 66 is also obtainable. This achieves suitably enhanced throughput of the substrate treating apparatus 10.

The following describes other effects of the first embodiment.

Since the first sending units 4S are arranged in line in the upward/downward direction Z, the first transport mechanism 1 and the intermediate transport mechanism 3 allow easy access to the first sending units 4S individually. Since the second sending units 5S are arranged in line in the upward/downward direction Z, the intermediate transport mechanism 3 and the second transport mechanism 2 allow easy access to the second sending units 5S individually. For instance, since the heat treating units 25 are arranged in line in the upward/downward direction Z, the transport mechanisms 15, 45 allow easy access to the heat treating units 25 individually. From the similar reason, the transport mechanisms 16, 46 allow easy access to the heat treating units 28 individually. The transport mechanisms 45, 65 allow easy access to the mounting units 56 individually. The transport mechanisms 46, 66 allow easy access to the mounting units 59 individually. The transport mechanisms 65, 75 allow easy access to the mounting-cum-cooling units 95 individually. The transport mechanisms 66, 76 allow easy access to the mounting-cum-cooling units 98 individually.

Since the first return units 4R are arranged in line in the upward/downward direction Z, the first transport mechanism 1 and the intermediate transport mechanism 3 allow easy access to the first return units 4R individually. Since the second return units 5R are arranged in line in the upward/downward direction Z, the intermediate transport mechanism 3 and the second transport mechanism 2 allow easy access to the second return units 5R individually. For instance, since the mounting units 26 are arranged in line in the upward/downward direction Z, the transport mechanisms 15, 45 allow easy access to the mounting units 26 individually. From the similar reason, the transport mechanisms 16, 46 allow easy access to the mounting units 29 individually. The transport mechanisms 45, 65 allow easy access to the heat treating units 55 individually. The transport mechanisms 46, 66 allow easy access to the heat treating units 58 individually. The transport mechanisms 65, 75 allow easy access to the mounting units 96 individually. The transport mechanisms 66, 76 allow easy access to the mounting units 99 individually.

Since the first return units 4R are disposed so as to overlap the first sending units 4S in plan view, the first transport mechanism 1 and the intermediate transport mechanism 3 allow easy access to both the first sending units 4S and the first return units 4R. Since the second return units 5R are disposed so as to overlap the second sending units 5S in plan view, the intermediate transport mechanism 3 and the second transport mechanism 2 allow easy access to both the second sending units 5S and the second return units 5R. For instance, the mounting unit 26 are disposed so as to overlap the heat treating unit 55 in plan view, the transport mechanisms 15, 45 allows easy access to both the heat treating unit 25 and the mounting unit 26. From the similar reason, the transport mechanisms 16, 46 allow easy access to both the heat treating unit 28 and the mounting unit 29. The transport mechanisms 45, 65 allow easy access to both the heat treating unit 55 and the mounting unit 56. The transport mechanisms 46, 66 allow easy access to both the heat treating unit 58 and the mounting unit 59. The transport mechanisms 65, 75 allow easy access to both the mounting-cum-cooling unit 95 and the mounting unit 96. The transport mechanisms 66, 76 allow easy access to both the mounting-cum-cooling unit 98 and the mounting unit 99.

The intermediate part 23 includes a relatively large number of heat treating units 25. This causes the intermediate part 23 to perform an effective heat treatment to the substrate W. For instance, the intermediate part 23 allows the heat treatment to a plurality of substrates W simultaneously. Moreover, the intermediate part 23 includes a relatively large number of mounting units 26. This allows suitable prevention of jammed transportation of the substrates W in the intermediate part 23. From the similar reason, jammed transportation of the substrates W in the intermediate parts 24, 53, 54 is preventable suitably. Accordingly, enhanced throughput of the substrate treating apparatus 10 is obtainable effectively.

The heat treating unit 25 and the mounting unit 26 are arranged one by one alternately. Consequently, the transport mechanisms 15, 45 allow more easy access to both the heat treating unit 25 and the mounting unit 26. From the similar reason, the transport mechanisms 16, 46 allow more easy access to both the heat treating unit 28 and the mounting unit 29. The transport mechanisms 45, 65 allow more easy access to both the heat treating unit 55 and the mounting unit 56. The transport mechanisms 46, 66 allow more easy access to both the heat treating unit 58 and the mounting unit 59.

Since the shelves 30 are arranged in line in the upward/downward direction Z, the heat treating unit 25 and the mounting unit 26 are arrangeable suitably. Likewise, the heat treating units 28, 55, 58 and the mounting units 29, 56, 59 are arrangeable suitably in the shelves 30.

The number of heat treating unit 25 arranged between the two of the shelves 30 adjacent to each other in the upward/downward direction Z is one. The number of mounting unit 26 arranged between the two of the shelves 30 adjacent to each other in the upward/downward direction Z is one. Accordingly, the heat treating unit 25 and the mounting unit 26 are easily arrangeable one by one alternately in the upward/downward direction Z. From the similar reason, the heat treating unit 28 and the mounting unit 29 are easily arrangeable one by one alternately in the upward/downward direction Z. The heat treating unit 55 and the mounting unit 56 are easily arrangeable one by one alternately in the upward/downward direction Z. The heat treating unit 58 and the mounting unit 59 are easily arrangeable one by one alternately in the upward/downward direction Z.

The mounting plate 32 of the mounting unit 26 is arranged above the first plate 31a of the heat treating unit 25 and lateral of the lid 31f of the heat treating unit 25. This achieves a small installation space of the heat treating unit 25 and the mounting unit 26. Consequently, the intermediate part 23 may include a relatively large number of heat treating units 25 and a relatively large number of mounting units 26. From the similar reason, the heat treating units 28 and the mounting units 29 are each arrangeable in a small installation space. Consequently, the intermediate part 24 may include a relatively large number of heat treating units 28 and a relatively large number of mounting units 29. Moreover, a small installation space of the heat treating units 55 and the mounting units 56 is obtainable. Consequently, the intermediate part 53 may include a relatively large number of heat treating units 55 and a relatively large number of mounting units 56. Moreover, a small installation space of the heat treating units 58 and the mounting units 59 is obtainable. Consequently, the intermediate part 54 may include a relatively large number of heat treating units 58 and a relatively large number of mounting units 59.

The intermediate part 23 further performs treatment to the substrate W placed thereon, leading to effectively enhanced throughput of the substrate treating apparatus 10. Likewise, the intermediate parts 24, 53, 54, 92 (93, 94) each further perform treatment to the substrate W placed thereon, leading to effectively enhanced throughput of the substrate treating apparatus 10.

Since the intermediate part 23 performs non-liquid treatment, jammed transportation of the substrates W in the intermediate part 23 is preventable. Likewise, since the intermediate parts 24, 53, 54, 92 (93, 94) each further perform non-liquid treatment, jammed transportation of the substrates W in the intermediate parts 24, 53, 54, 92 (93, 94) is preventable.

Since the intermediate part 23 performs the heat treatment, jammed transportation of the substrates W in the intermediate part 23 is preventable. Likewise, since the intermediate parts 24, 53, 54, 92 (93, 94) each further perform the heat treatment, jammed transportation of the substrates W in the intermediate parts 24, 53, 54, 92 (93, 94) is preventable.

The intermediate part 23 inspects the substrate W placed thereon, leading to effectively enhanced throughput of the substrate treating apparatus 10. Likewise, the intermediate part 24 inspects the substrate W placed thereon, leading to effectively enhanced throughput of the substrate treating apparatus 10.

The area B45 is substantially circular in plan view. Consequently, the transport mechanism 45 is capable of accessing the intermediate parts 23, 53 easily. From the similar reason, the transport mechanism 46 is capable of accessing the intermediate parts 24, 54 easily. The transport mechanism 65 is capable of accessing the intermediate parts 53 and the intermediate section 93 easily. The transport mechanism 66 is capable of accessing the intermediate parts 54 and the intermediate section 94 easily. The transport mechanism 15 is capable of accessing the carrier C mounted on the carrier mount table 12A and the intermediate part 23 easily. The transport mechanism 16 is capable of accessing the carrier C mounted on the carrier mount table 12B and the intermediate part 24 easily.

The rotator 17c of the transport mechanism 45 is immovable in the horizontal direction. Consequently, the transport mechanism 45 is capable of accessing the intermediate parts 23, 53 easily. From the similar reason, the transport mechanism 46 is capable of accessing the intermediate parts 24, 54 easily. The transport mechanism 65 is capable of accessing the intermediate parts 53 and the intermediate section 93 easily. The transport mechanism 66 is capable of accessing the intermediate parts 54 and the intermediate section 94 easily. The transport mechanism 15 is capable of accessing the carrier C mounted on the carrier mount table 12A and the intermediate part 23 easily. The transport mechanism 16 is capable of accessing the carrier C mounted on the carrier mount table 12B and the intermediate part 24 easily.

The transport mechanisms 14, 45, 65, 74 are disposed in the forward/rearward direction X. The intermediate parts 23, 53, 92 are disposed between the transport mechanisms 14, 45, 65, 74. As noted above, the cycle operations performed by the transport mechanisms 45, 65 each include only two access operations. Accordingly, the transport mechanisms 45, 65 allow suitable transportation of the substrates W between the intermediate parts 23, 92. Likewise, the transport mechanisms 14, 46, 66, 74 are disposed in the forward/rearward direction X. The intermediate parts 24, 53, 92 are disposed between the transport mechanisms 14, 46, 66, 74. As noted above, the cycle operations performed by the transport mechanisms 46, 66 each include only two access operations. Accordingly, the transport mechanisms 46, 66 allow suitable transportation of the substrates W between the intermediate parts 24, 92.

The number of access operations included in the cycle operation by the transport mechanism 15 is only two. Accordingly, relatively high transportation efficiency by the transport mechanism 15 is obtainable. Likewise, the number of access operations included in the cycle operation by the transport mechanism 16 is only two. Accordingly, relatively high transportation efficiency by the transport mechanism 16 is obtainable. This achieves much enhanced throughput of the substrate treating apparatus 10.

In the first access operation performed by the transport mechanism 15, the transport mechanism 15 performs access to the carrier C mounted on the carrier mount table 12A. In the second access operation performed by the transport mechanism 15, the transport mechanism 15 performs access to the intermediate part 23. Accordingly, the transport mechanism 15 performs the cycle operation repeatedly, thereby accessing the carrier C and the intermediate part 23 alternately. Consequently, the transport mechanism 15 is capable of accessing the carrier C and the intermediate part 23 effectively. Therefore, the transport mechanism 15 allows efficient transportation of the substrate W between the carrier C and the intermediate part 23. Likewise, the transport mechanism 16 allows efficient transportation of the substrate W between the carrier C and the intermediate part 24.

The transport mechanism 15 places the substrate W on the heat treating unit 25. Accordingly, the substrate W is capable of undergoing the treatment between the transport mechanisms 15, 45 effectively while being transported between the transport mechanisms 15, 45 effectively. Specifically, the substrate W is capable of undergoing the treatment rapidly after being unloaded from the carrier C. This achieves enhanced throughput of the substrate treating apparatus 10 effectively.

Likewise, the transport mechanism 16 places the substrate W on the heat treating unit 28. Accordingly, the substrate W is capable of undergoing the treatment between the transport mechanisms 16, 46 effectively while being transported between the transport mechanisms 16, 46 effectively. This achieves enhanced throughput of the substrate treating apparatus 10 effectively.

The number of access operations included in the cycle operation by the transport mechanism 75 is only two. Accordingly, relatively high transportation efficiency by the transport mechanism 75 is obtainable. Likewise, the number of access operations included in the cycle operation by the transport mechanism 76 is only two. Accordingly, relatively high transportation efficiency by the transport mechanism 76 is obtainable. This achieves much enhanced throughput of the substrate treating apparatus 10.

In the first access operation performed by the transport mechanism 75, the transport mechanism 75 performs access to the intermediate section 93. In the second access operation performed by the transport mechanism 75, the transport mechanism 75 performs access to the processing section 82. Accordingly, the transport mechanism 75 performs the cycle operation repeatedly, thereby accessing the intermediate section 93 and the processing section 82 alternately. Consequently, the transport mechanism 75 is capable of accessing the intermediate section 93 and the processing section 82 effectively. Therefore, the transport mechanism 75 allows efficient transportation of the substrate W between the intermediate section 93 and the processing section 82. Likewise, the transport mechanism 76 allows efficient transportation of the substrate W between the intermediate section 94 and the processing section 83.

The processing part 81 performs treatment to the substrates W. Accordingly, the substrate W is capable of undergoing the treatment effectively in the processing part 81 while being transported to the processing part 81 effectively. This achieves enhanced throughput of the substrate treating apparatus 10 effectively.

Second Embodiment

The following describes a substrate treating apparatus 10 according to a second embodiment with reference to drawings. Like numerals are used to identify like components which are the same as that in the first embodiment, and the components will not particularly be described.

Summary of Substrate Treating Apparatus

Figure 20:
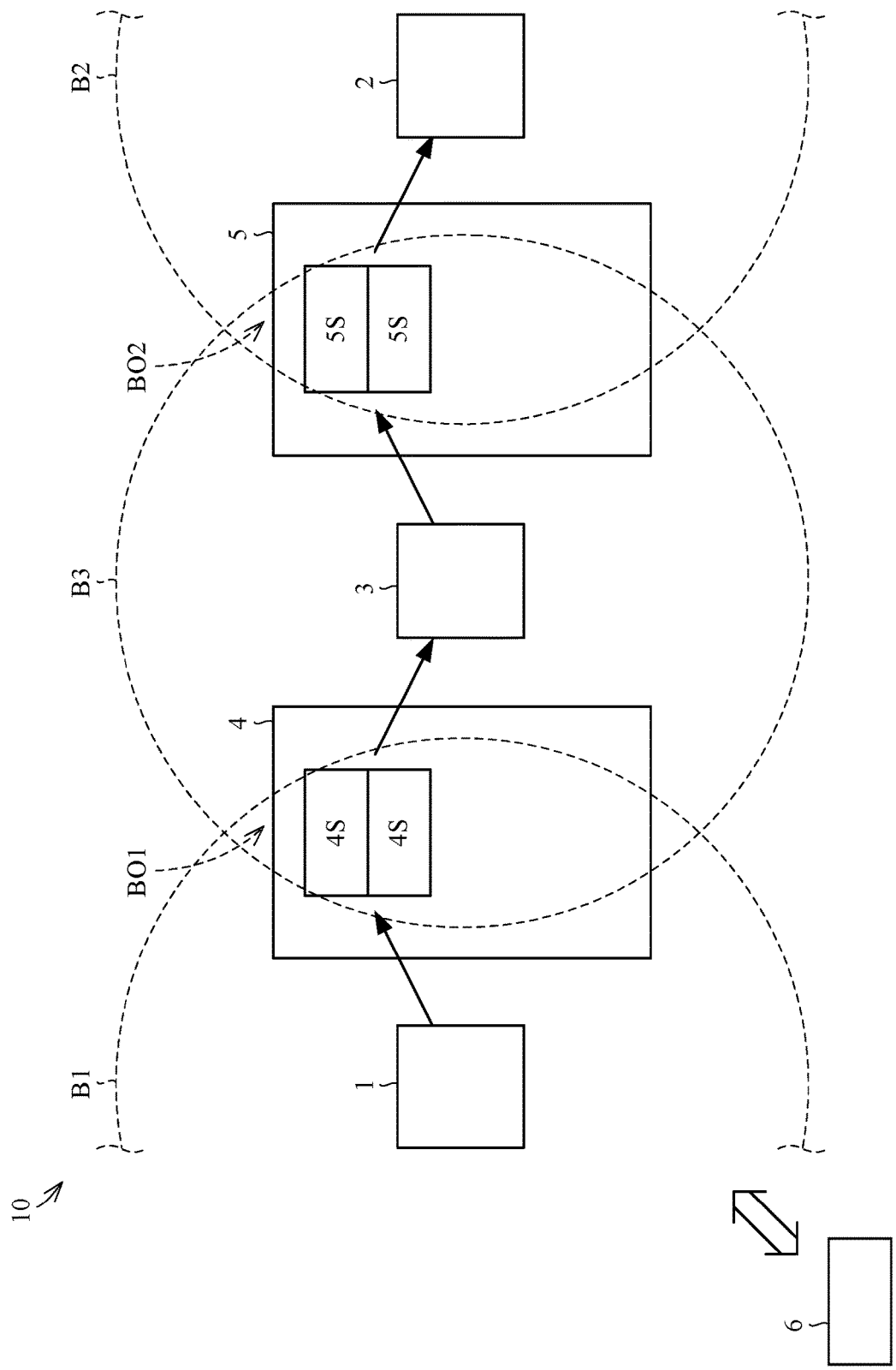
FIG. 20 is a conceptual view of a substrate treating apparatus according to the second embodiment.

FIG. 20 is a conceptual view of a substrate treating apparatus according to the second embodiment. The first intermediate part 4 includes a plurality of first sending units 4S. On the other hand, the first intermediate part 4 includes no return unit 4R.

The second intermediate part 5 includes a plurality of second sending units 5S. On the other hand, the second intermediate part 5 includes no return unit 5R.

At least one of the first sending units 4S and the second sending units 5S may be the treating unit or the inspecting unit.

The first transport mechanism 1 places the substrates W on the first intermediate part 4. Specifically, the first transport mechanism 1 loads the substrates W into the first sending units 4S.

The second transport mechanism 2 picks up the substrates W from the second intermediate part 5. Specifically, the second transport mechanism 2 unloads the substrates W from the second sending units 5S.

Figure 21:
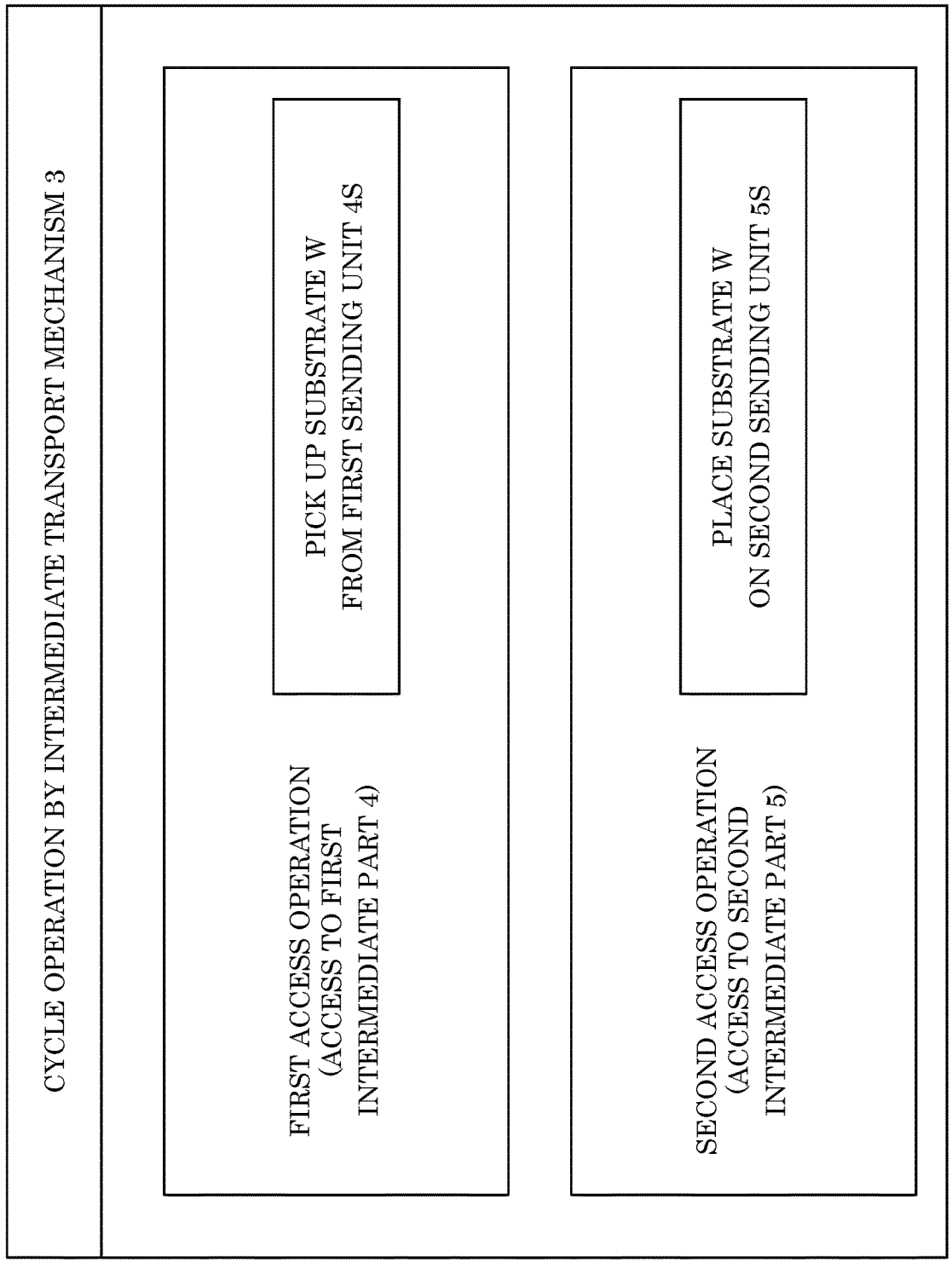
FIG. 21 schematically illustrates cycle operation by an intermediate transport mechanism.

FIG. 21 schematically illustrates cycle operation by an intermediate transport mechanism 3. The intermediate transport mechanism 3 repeats cycle operation illustrated in FIG. 21 in accordance with the control by the controller 6. The cycle operation performed by the intermediate transport mechanism 3 includes only a first access operation and a second access operation.

The first access operation performed by the intermediate transport mechanism 3 is operation that the intermediate transport mechanism 3 accesses the first intermediate part 4.

The first access operation performed by the intermediate transport mechanism 3 includes operation of picking up the substrates W from the first intermediate part 4. On the other hand, the first access operation performed by the intermediate transport mechanism 3 does not include operation that the intermediate transport mechanism 3 places the substrates W on the first intermediate part 4. Specifically, the first access operation by the intermediate transport mechanism 3 includes operation of unloading the substrates W from the first sending units 4S. On the other hand, the first access operation by the intermediate transport mechanism 3 does not include operation of loading the substrates W into the first sending units 4S.

As described above, the first access operation performed by the intermediate transport mechanism 3 includes only the operation of unloading the substrates W from the first intermediate part 4, and thus does not include the operation of loading the substrates W into the first intermediate part 4.

The second access operation performed by the intermediate transport mechanism 3 is operation that the intermediate transport mechanism 3 accesses the second intermediate part 5.

The second access operation performed by the intermediate transport mechanism 3 includes operation that the intermediate transport mechanism 3 places the substrates W on the second intermediate part 5. On the other hand, the second access operation performed by the intermediate transport mechanism 3 does not include operation of picking up the substrates W from the second intermediate part 5. Specifically, the second access operation by the intermediate transport mechanism 3 includes operation that the intermediate transport mechanism 3 loads the substrates W into the second sending units 5S. On the other hand, the second access operation by the intermediate transport mechanism 3 does not include operation that the intermediate transport mechanism 3 unloads the substrates W from the second sending units 5S.

As described above, the second access operation performed by the intermediate transport mechanism 3 includes only the operation of loading the substrates W into the second intermediate part 5, and thus does not include the operation of unloading the substrates W from the second intermediate part 5.

The intermediate transport mechanism 3 performs cycle operation one time, thereby transporting of the substrates W from the first intermediate part 4 to the second intermediate part 5. Specifically, the intermediate transport mechanism 3 performs the cycle operation one time, thereby transporting the substrates W from the first sending units 4S to the second sending units 5S. On the other hand, the intermediate transport mechanism 3 does not transport the substrate W from the second intermediate part 5 into the first intermediate part 4.

Reference is made to FIG. 3A for convenience. The following describes one example of operation of the substrate treating apparatus 10. The control by the controller 6 causes the substrates W to be sent from the first transport mechanism 1 to the second transport mechanism 2.

Specifically, the first transport mechanism 1 loads one of the substrates W into one of the first sending units 4S. If the first sending units 4S are the treating unit or the inspecting unit, the first sending units 4S perform treatment or inspection to the placed substrate W.

The intermediate transport mechanism 3 unloads the substrate W from the first sending unit 4S (first access operation by the intermediate transport mechanism 3). In this manner, the intermediate transport mechanism 3 receives the substrate W from the first transport mechanism 1 via the first sending unit 4S (first intermediate part 4).

The intermediate transport mechanism 3 loads the substrate W unloaded from the first sending unit 4S into the second sending unit 5S (second access operation by the intermediate transport mechanism 3). In this manner, the intermediate transport mechanism 3 transports the substrate W from the first intermediate part 4 to the second intermediate part 5.

If the second sending unit 5S is the treating unit or the inspecting unit, the second sending unit 5S performs treatment or inspection to the placed substrate W.

The second transport mechanism 2 unloads the substrate W from the second sending unit 5S. In this manner, the intermediate transport mechanism 3 passes the substrate W to the second transport mechanism 2 via the second intermediate part 5.

Primary Effect of Second Embodiment

The substrate treating apparatus 10 described above produces the following effects.

The cycle operation performed by the intermediate transport mechanism 3 includes only a first access operation and a second access operation. Accordingly, relatively high transportation efficiency by the intermediate transport mechanism 3 is also obtainable in the second embodiment. This achieves suitably enhanced throughput of the substrate treating apparatus 10.

The first access operation performed by the intermediate transport mechanism 3 does not include the operation of loading the substrates W into the first intermediate part 4. Accordingly, the intermediate transport mechanism 3 needs much shorter time for the first access operation. The second access operation performed by the intermediate transport mechanism 3 does not include the operation of unloading the substrates W from the second intermediate part 5. Accordingly, the intermediate transport mechanism 3 needs much shorter time for the second access operation. Consequently, the intermediate transport mechanism 3 needs much shorter time for the cycle operation. The intermediate transport mechanism 3 does not transport the substrate W from the second intermediate part 5 into the first intermediate part 4. This achieves much enhanced transportation efficiency by the intermediate transport mechanism 3. As a result, much enhanced throughput of the substrate treating apparatus 10 is obtainable.

The following describes the substrate treating apparatus 10 in more detail.

Overall Configuration of Substrate Treating Apparatus 10

Figure 22:
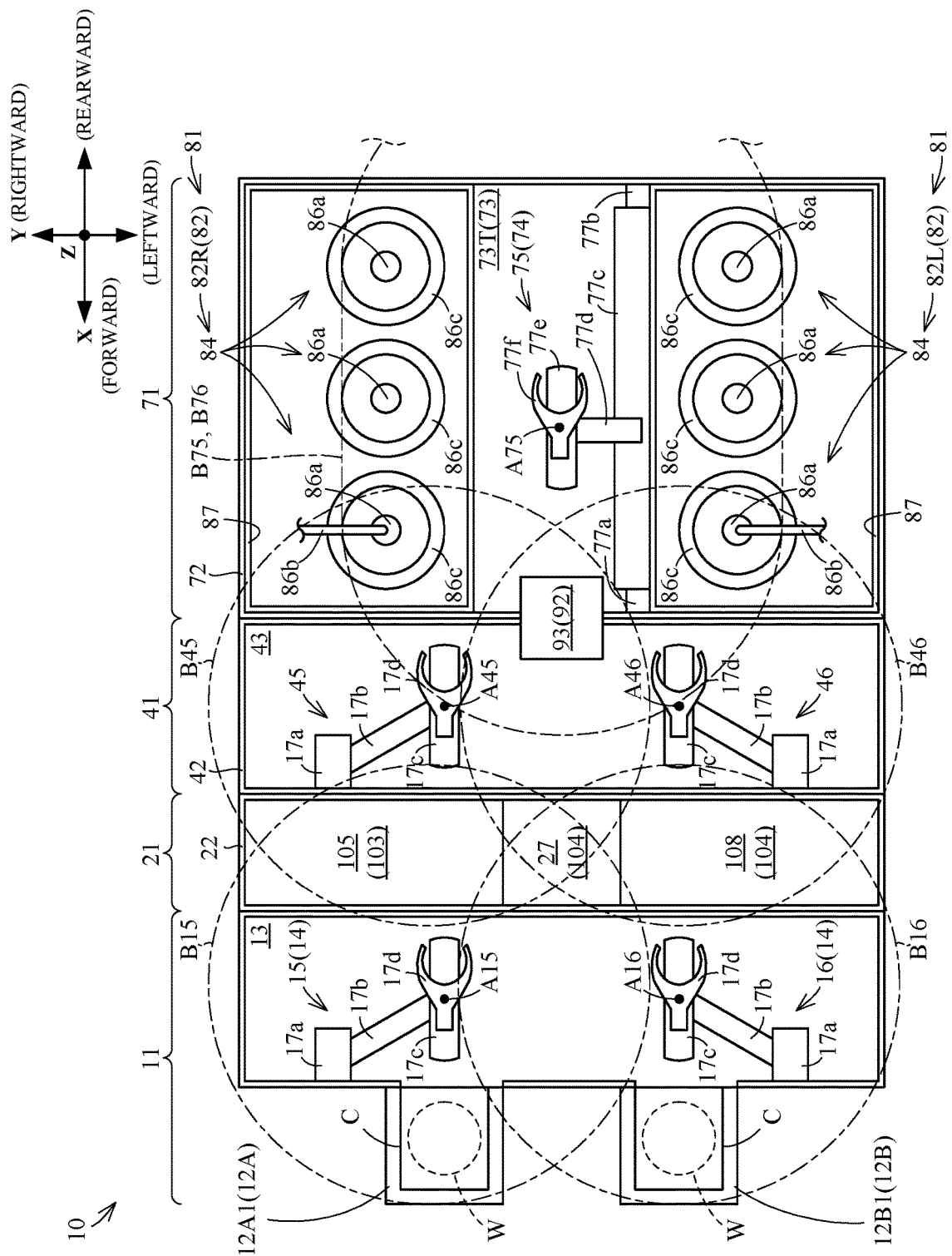
FIG. 22 is a plan view of the substrate treating apparatus according to the second embodiment.

FIG. 22 is a plan view of the substrate treating apparatus 10 according to the second embodiment. The substrate treating apparatus 10 includes an indexer block 11, a first heat treatment block 21, a first transportation block 41, and a liquid treatment block 71. The indexer block 11, the first heat treatment block 21, the first transportation block 41, and the liquid treatment block 71 are arranged in line in this order. The substrate treating apparatus 10 according to the second embodiment does not include the second heat treatment block 51 and the second transportation block 61 in the first embodiment. The first transportation block 41 is connected to the liquid treatment block 71.

The transport mechanisms 14, 45, 74 are arranged in the forward/rearward direction X. The transport mechanisms 14, 46, 74 are arranged in the forward/rearward direction X. The transport mechanism 14 is disposed at the forwardmost positon among the transport mechanisms 14, 45, 46, 74. The transport mechanism 74 is disposed at the rearmost position among the transport mechanisms 14, 45, 46, 74.

The area B15 partially overlaps the area B45. The area B45 partially overlaps the area B75. The area B45 partially overlaps the area B76.

Likewise, the area B16 partially overlaps the area B46. The area B46 partially overlaps the area B75. The area B46 partially overlaps the area B76.

Moreover, the area B15 is partially overlapped on the area B16. The area B45 is partially overlapped on the area B46.

The indexer block 11, the first transportation block 41, and the liquid treatment block 71 in the second embodiment are configured in substantially the same manner as that in the first embodiment. Accordingly, the following describes the configuration of the first heat treatment block 21 and the intermediate part 92.

First Heat Treatment Block 21

Figure 23:
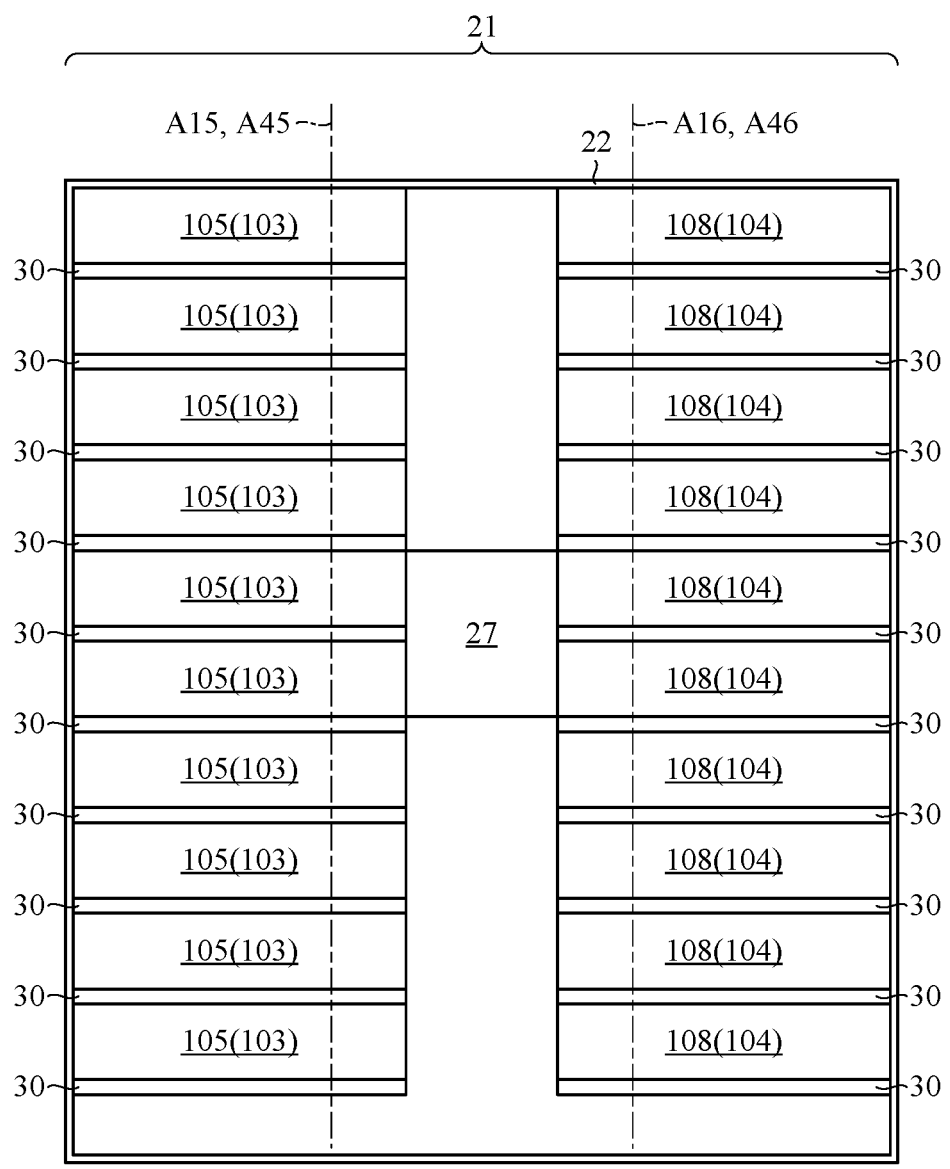
FIG. 23 is a front view of a first heat treatment block.

Reference is made to FIGS. 22 and 23. FIG. 23 is a front view of a first heat treatment block 21.

The first heat treatment block 21 includes intermediate parts 103, 104. The substrate W is placed on the intermediate parts 103, 104. The intermediate parts 103, 104 are arranged in line in the width direction Y. The intermediate part 103 is disposed rightward of the intermediate part 104. The intermediate part 103 does not overlap the intermediate part 104. The intermediate part 103 is disposed between the transport mechanism 15 and the transport mechanism 45 adjacent to each other in the forward/rearward direction X. The intermediate part 104 is disposed between the transport mechanism 16 and the transport mechanism 46 adjacent to each other in the forward/rearward direction X.

The intermediate part 103 includes a plurality of heat treating units 105. The intermediate part 103 includes no mounting unit and no inspecting unit. The intermediate part 104 includes one inspecting unit 27 and a plurality of heat treating units 108. The inspecting unit 27 belongs to only the intermediate part 104, and thus does not belong to the intermediate part 103. The intermediate part 104 includes no mounting unit.

The heat treating unit 105 is positioned rightward of the inspecting unit 27 in plan view. The heat treating unit 105 is disposed rearward of the transport mechanism 15 and forward of the transport mechanism 45. The heat treating unit 108 is positioned leftward of the inspecting unit 27 in plan view. The heat treating unit 108 is disposed rearward of the transport mechanism 16 and forward of the transport mechanism 46.

The heat treating units 105 are arranged in line the in upward/downward direction Z. The heat treating units 108 are arranged in line the in upward/downward direction Z. The heat treating units 105, 108 and the inspecting unit 27 are disposed at substantially the same level as that of the transport mechanisms 14, 45, 46. Specifically, the heat treating units 105, 108 and the inspecting unit 27 are disposed at the level where the transport mechanisms 14, 45, 46 are capable of transporting the substrates W.

The heat treating unit 105 has substantially the same configuration as that of the heat treating units 25, 28 described in the first embodiment. The heat treating unit 105 performs a hydrophobic treatment as the heat treatment, for example.

The heat treating unit 108 has substantially the same configuration as that of the heat treating units 55, 58 described in the first embodiment. The heat treating unit 108 performs a heating treatment as the heat treatment, for example.

The heat treating unit 105 is disposed in the area where the areas B15, B45 overlap each other. That is, the intermediate part 103 is disposed in the area where the areas B15, B45 overlap each other. The intermediate part 103 is disposed out of the areas B16, B46.

The inspecting unit 27 and the heat treating unit 108 are arranged in the area where the areas B16, B46 overlap each other. That is, the intermediate part 104 is disposed in the area where the areas B16, B46 overlap each other. The intermediate part 104 is disposed out of the areas B15, B45.

Here, the intermediate parts 103, 104 are disposed out of the areas B75, B76.

Intermediate Part 92

Reference is made to FIG. 22. The intermediate part 92 is disposed between the transport mechanism 45 and the transport mechanism 74 adjacent to each other in the forward/rearward direction X. The intermediate part 92 is disposed between the transport mechanism 46 and the transport mechanism 74 adjacent to each other in the forward/rearward direction X. The intermediate part 92 is disposed rearward of the transport mechanisms 45, 46 and forward of the transport mechanism 74. Specifically, the intermediate part 92 is disposed rearward and leftward of the transport mechanism 45. The intermediate part 92 is disposed rearward and rightward of the transport mechanism 46. The intermediate part 92 is disposed at substantially the same interval from the transport mechanisms 45, 46.

The intermediate part 92 is disposed between the first transportation block 41 and liquid treatment block 71. The intermediate part 92 is disposed across the transportation space 43 of the first transportation block 41 and the transportation space 73 of the liquid treatment block 71.

The intermediate section 93 is disposed across the transportation space 43 of the first transportation block 41 and a transportation space 73T of the liquid treatment block 71. The intermediate section 93 is disposed at substantially the same level as that of the transport mechanisms 45, 46, 75. Specifically, the intermediate section 93 is disposed at the level where the transport mechanisms 45, 46, 75 are capable of transporting the substrates W.

The intermediate section 94 is disposed across the transportation space 43 of the first transportation block 41 and a transportation space 73B of the liquid treatment block 71. Here, reference should be made to FIG. 7 for the intermediate section 94 and the transportation space 73B. The intermediate section 94 is disposed at substantially the same level as that of the transport mechanisms 45, 46, 76. Specifically, the intermediate section 94 is disposed at the level where the transport mechanisms 45, 46, 76 are capable of transporting the substrates W.

The intermediate section 93 is disposed in the area where the areas B45, B75 overlap each other. Furthermore, the intermediate section 93 is disposed in the area where the areas B46, B75 overlap each other. The intermediate section 93 is disposed out of the area B76.

The intermediate section 94 is disposed in the area where the areas B46, B76 overlap each other. Furthermore, the intermediate section 94 is disposed in the area where the areas B45, B76 overlap each other. The intermediate section 94 is disposed out of the area B75.

Here, the intermediate sections 93, 94 are disposed out of the areas B15, B16.

Cycle Operation by Individual Transport Mechanism

The transport mechanisms 14, 45, 46, 74 each repeat cycle operation in accordance with the control by the controller 6 in FIG. 1.

The cycle operation performed by the transport mechanism 15 includes only the first access operation and the second access operation. The first access operation by the transport mechanism 15 is operation of accessing the carrier C mounted on the carrier mount table 12A. The transport mechanism 15 performs first access operation of unloading the substrate W from the carrier C mounted on the carrier mount table 12A. On the other hand, the first access operation performed by the transport mechanism 15 does not include the operation of loading the substrate W into the carrier C mounted on the carrier mount table 12A. The second access operation performed by the transport mechanism 15 is operation of accessing the intermediate part 103. The second access operation performed by the transport mechanism 15 includes the operation of placing the substrate W on the heat treating unit 105. On the other hand, the second access operation performed by the transport mechanism 15 does not include the operation of unloading the substrates W from the intermediate part 103.

The cycle operation performed by end transport mechanism 16 includes only the first access operation and the second access operation. The first access operation by the transport mechanism 16 is operation of accessing the carrier C mounted on the carrier mount table 12B. The first access operation performed by the transport mechanism 16 includes the operation of loading the substrate W into the carrier C mounted on the carrier mount table 12B. On the other hand, the first access operation performed by the transport mechanism 16 does not include the operation of unloading the substrate W from the carrier C mounted on the carrier mount table 12B. The second access operation performed by the transport mechanism 16 is operation of accessing the intermediate part 104. The second access operation by the transport mechanism 16 includes the operation of unloading the substrate W from the heat treating unit 108 or the inspecting unit 27. On the other hand, the second access operation performed by the transport mechanism 16 does not include the operation of placing the substrates W onto the intermediate part 104.

The cycle operation performed by the transport mechanism 45 includes only the first access operation and the second access operation. The first access operation performed by the transport mechanism 45 is operation of accessing the intermediate part 103. The first access operation performed by the transport mechanism 45 includes the operation of unloading the substrate W from the heat treating unit 105. On the other hand, the first access operation performed by the transport mechanism 45 does not include the operation of placing the substrates W onto the intermediate part 103. The second access operation performed by the transport mechanism 45 is operation of accessing the intermediate part 92. The second access operation by the transport mechanism 45 includes the operation of loading the substrate W into the mounting-cum-cooling unit 95 or the mounting-cum-cooling unit 98. On the other hand, the second access operation performed by the transport mechanism 45 does not include the operation of unloading the substrates W from the intermediate part 92.

The cycle operation performed by the transport mechanism 46 includes only the first access operation and the second access operation. The first access operation performed by the transport mechanism 46 is operation of accessing the intermediate part 92. The first access operation performed by the transport mechanism 46 includes the operation of unloading the substrate W from either the mounting unit 96 or the mounting unit 99. On the other hand, the first access operation performed by the transport mechanism 46 does not include the operation of placing the substrates W onto the intermediate part 92. The second access operation performed by the transport mechanism 46 is operation of accessing the intermediate part 104. The second access operation by the transport mechanism 46 includes the operation of loading the substrate W into the heat treating unit 108 or the inspecting unit 27. On the other hand, the second access operation performed by the transport mechanism 46 does not include the operation of unloading the substrates W from the intermediate part 104.

The transport mechanisms 75, 76 each perform the cycle operation in the same manner as that in the first embodiment.

The following describes correspondence between the elements in FIGS. 22 to 23 and the elements in FIGS. 20 to 21. The transport mechanisms 15, 74 correspond to the first and second transport mechanisms 1, 2, respectively. The transport mechanism 45 corresponds to the intermediate transport mechanism 3. The intermediate parts 103, 92 correspond to the first and second intermediate parts 4, 5, respectively. The heat treating unit 105 corresponds to the first sending unit 4S. The mounting-cum-cooling unit 95, 98 corresponds to the second sending unit 5S.

Moreover, the transport mechanisms 74, 16 correspond to the first and second transport mechanisms 1, 2, respectively. The transport mechanism 46 corresponds to the intermediate transport mechanism 3. The intermediate parts 92, 104 correspond to the first and second intermediate parts 4, 5, respectively. The mounting units 96, 99 correspond to the first sending unit 4S. The heat treating unit 108 and the inspecting unit 27 correspond to the second sending unit 5S.

The transport mechanism 14 (15, 16) is one example of the front end transport mechanism in the present invention. The transport mechanism 74 (75, 76) is one example of the rear end transport mechanism in the present invention. The transport mechanisms 45, 46 are one example of the intermediate transport mechanism in the present invention. The intermediate parts 103, 104 are one example of the front end intermediate part in the present invention. The intermediate part 92 (93, 94) is one example of the rear end intermediate part in the present invention. The processing part 81 (82, 83) is one example of the rear end processing part in the present invention.

Example of Operation of Substrate Treating Apparatus 10

Figure 24:
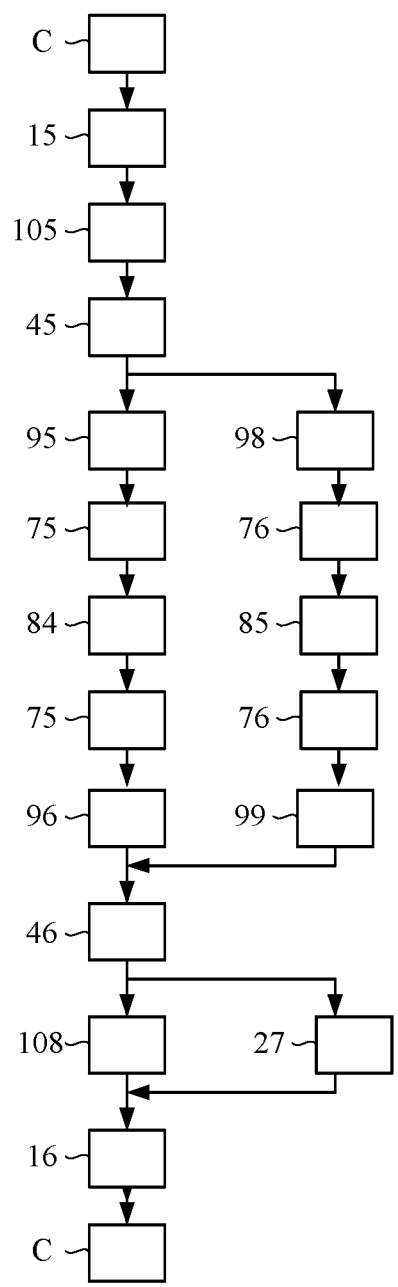
FIG. 24 schematically illustrates a transportation path of the substrate.

FIG. 24 schematically illustrates a transportation path of the substrate W.

The transport mechanism 15 unloads the substrate W from the carrier C mounted on the carrier mount table 12A (first access operation by the transport mechanism 15). The transport mechanism 15 places the substrate W on the heat treating unit 105 (second access operation by the transport mechanism 15). The heat treating unit 105 performs the hydrophobic treatment to the substrate W.

The transport mechanism 45 unloads the substrate W from the heat treating unit 105 (first access operation by the transport mechanism 45). The transport mechanism 45 places the substrate W on either the mounting-cum-cooling unit 95 or the mounting-cum-cooling unit 98 (second access operation by the transport mechanism 45). For instance, the transport mechanism 45 may place the substrate W on the mounting-cum-cooling unit 95 and the mounting-cum-cooling unit 98 alternately every cycle operation.

The transport mechanism 75 unloads the substrate W from the mounting-cum-cooling unit 95 (first access operation by the transport mechanism 75). The transport mechanism 75 places the substrate W on the liquid treating unit 84 (second access operation by the transport mechanism 75). The liquid treating unit 84 performs the liquid treatment to the substrate W. The transport mechanism 75 unloads the substrate W from the liquid treating unit 84 (second access operation by the transport mechanism 75). The transport mechanism 75 places the substrate W on the mounting unit 96 (first access operation by the transport mechanism 75).

The transport mechanism 76 unloads the substrate W from the mounting-cum-cooling unit 98 (first access operation by the transport mechanism 76). The transport mechanism 76 places the substrate W on the liquid treating unit 85 (second access operation by the transport mechanism 76). The liquid treating unit 85 performs the liquid treatment to the substrate W. The transport mechanism 76 unloads the substrate W from the liquid treating unit 85 (second access operation by the transport mechanism 76). The transport mechanism 76 places the substrate W on the mounting unit 99 (first access operation by the transport mechanism 76).

The transport mechanism 46 unloads the substrate W from either the mounting unit 96 or the mounting unit 99 (first access operation by the transport mechanism 46). The transport mechanism 46 loads the substrate W into either the heat treating unit 108 or the inspecting unit 27 (second access operation by the transport mechanism 46).

When the transport mechanism 46 transports the substrate W to the heat treating unit 108, the heat treating unit 108 performs the heat treatment (e.g., the heating treatment) to the substrate W. When the transport mechanism 46 transports the substrate W to the inspecting unit 27, the inspecting unit 27 inspects the substrate W.

The transport mechanism 16 unloads the substrate W from either the heat treating unit 108 or the inspecting unit 27 (second access operation by the transport mechanism 16). The transport mechanism 16 transports the substrate W into the carrier C mounted on the carrier mount table 12B (first access operation by the transport mechanism 16).

Other Effect of Second Embodiment

The primary effect of the second embodiment has already been described as above. For instance, the first access operation performed by the transport mechanism 45 does not include the operation of placing the substrates W onto the intermediate part 103. The second access operation performed by the transport mechanism 45 does not include the operation of unloading the substrates W from the intermediate part 92. Accordingly, much higher transportation efficiency by the transport mechanism 45 is obtainable.

Likewise, the first access operation performed by the transport mechanism 46 does not include the operation of placing the substrates W onto the intermediate part 92. The second access operation performed by the transport mechanism 46 does not include the operation of unloading the substrates W from the intermediate part 104. Accordingly, much higher transportation efficiency by the transport mechanism 46 is also obtainable. As a result, much enhanced throughput of the substrate treating apparatus 10 is obtainable.

The following describes other effects of the second embodiment.

The first access operation performed by the transport mechanism 15 does not include the operation of loading the substrate W into the carrier C mounted on the carrier mount table 12A. The second access operation performed by the transport mechanism 15 does not include the operation of unloading the substrates W from the intermediate part 103. Accordingly, much higher transportation efficiency by the transport mechanism 15 is obtainable.

The first access operation performed by the transport mechanism 16 does not include the operation of unloading the substrate W from the carrier C mounted on the carrier mount table 12B. The second access operation performed by the transport mechanism 16 does not include the operation of placing the substrates W onto the intermediate part 104. Accordingly, much higher transportation efficiency by the transport mechanism 16 is obtainable.

The present invention is not limited to the foregoing first and second embodiments, but may be modified as follows.

In the first and second embodiments described above, the intermediate parts 23, 24, 53, 54, 92 (93, 94), 103, 104 each perform further treatment to the placed substrate W. However, this is not limitative. At least one among the intermediate parts 23, 24, 53, 54, 92 (93, 94), 103, 104 may perform treatment to the placed substrate W. All of the intermediate parts 23, 24, 53, 54, 92 (93, 94), 103, 104 do not necessarily perform treatment to the placed substrate W.

In the first embodiment described above, the transport mechanism 45 transports the substrate W to the transport mechanism 15. For instance, the transport mechanism 15 unloads the substrate W that is transported by the transport mechanism 45 into the mounting unit 26 or the inspecting unit 27. However, this is not limitative. The transport mechanism 45 may transport the substrate W to the transport mechanism 16. For instance, the transport mechanism 16 may unload the substrate W that is transported by the transport mechanism 45 into the inspecting unit 27.

In the first embodiment described above, the transport mechanism 46 transports the substrate W to the transport mechanism 16. For instance, the transport mechanism 16 unloads the substrate W that is transported by the transport mechanism 46 into the inspecting unit 27 or the mounting unit 29. However, this is not limitative. The transport mechanism 46 may transport the substrate W to the transport mechanism 15. For instance, the transport mechanism 15 may unload the substrate W that is transported by the transport mechanism 46 into the inspecting unit 27.

In the first and second embodiments described above, the inspecting unit 27 are disposed within the area where the transport mechanisms 15, 16, 45, 46 are capable of transporting the substrates W (i.e., the area where the areas B15, 16, 45, 46 overlap). However, this is not limitative. At least either the mounting unit or the treating unit may be disposed within the area where the transport mechanisms 15, 16, 45, 46 are capable of transporting the substrates W.

In the first and second embodiments described above, the substrate treating apparatus 10 includes two transport mechanisms 15, 16 as the front end transport mechanism. However, this is not limitative. One or three or more front end transport mechanisms may be provided. For instance, either of the transport mechanisms 15, 16 is omittable.

In the first and second embodiments described above, the substrate treating apparatus 10 includes two transport mechanisms 75, 76 as the rear end transport mechanism. However, this is not limitative. One or three or more rear end transport mechanisms may be provided. For instance, either of the transport mechanisms 75, 76 is omittable.

The processing part 81 in the first and second embodiments described above is disposed lateral of the transport mechanism 74. However, this is not limitative. The processing part 81 may be disposed in at least either a lateral position of the transport mechanism 74 or a rear position of the transport mechanism 74.

The processing section 82 in the first and second embodiments described above is disposed lateral of the transport mechanism 75. However, this is not limitative. The processing section 82 may be disposed in at least one of a lateral position of the transport mechanism 75 and a rear position of the transport mechanism 75.

The processing section 83 in the first and second embodiments described above is disposed lateral of the transport mechanism 76. However, this is not limitative. The processing section 83 may be disposed in at least one of a lateral position of the transport mechanism 76 and a rear position of the transport mechanism 76.

In the first embodiment described above, the intermediate part 23 includes one inspecting unit 27. However, this is not limitative. Alternatively, the number of inspecting units 27 included in the intermediate part 23 may be zero or two or more.

In the first embodiment described above, the intermediate part 24 includes one inspecting unit 27. However, this is not limitative. Alternatively, the number of inspecting units 27 included in the intermediate part 24 may be zero or two or more.

In the first embodiment described above, the intermediate part 53 includes no inspecting unit. However, this is not limitative. The intermediate part 53 may include the inspecting unit.

In the first embodiment described above, the intermediate part 54 includes no inspecting unit. However, this is not limitative. The intermediate part 54 may include the inspecting unit.

In the second embodiment described above, the intermediate part 103 includes no inspecting unit. However, this is not limitative. The intermediate part 103 may include the inspecting unit.

In the second embodiment described above, the intermediate part 104 includes one inspecting unit 27. However, this is not limitative. Alternatively, the number of inspecting units 27 included in the intermediate part 104 may be zero or two or more.

The first and second embodiments and the modifications described above may be variable appropriately by replacing or combining the unit of the present embodiments with other thereof.

The present invention may be embodied in other specific forms without departing from the spirit or essential attributes thereof and, accordingly, reference should be made to the appended claims, rather than to the foregoing specification, as indicating the scope of the invention.

What is claimed is:
1. A substrate treating apparatus, comprising:
a first transport mechanism configured and arranged for transporting a substrate;
a second transport mechanism configured and arranged for transporting the substrate;
an intermediate transport mechanism that is disposed between the first transport mechanism and the second transport mechanism, and configured and arranged for transporting the substrate;
a first intermediate part that is disposed within a first overlapped area to which the first transport mechanism and the intermediate transport mechanism are configured and arranged for transporting the substrate, the first intermediate part being configured and arranged for receiving the substrate;
a second intermediate part that is disposed within a second overlapped area to which the intermediate transport mechanism and the second transport mechanism are configured and arranged for transporting the substrate, the second intermediate part being configured and arranged for receiving the substrate; and a controller that is connected to the first, second and intermediate transport mechanisms, and programmed for performing a control of the first transport mechanism, the second transport mechanism, and the intermediate transport mechanism, the intermediate transport mechanism repeating a cycle operation in accordance with the programmed control by the programmed controller, the cycle operation performed by the intermediate transport mechanism including only a first access operation of accessing the first intermediate part and a second access operation of accessing the second intermediate part in accordance with the programmed control by the programmed controller, and at least either the first intermediate part or the second intermediate part further performs treatment to the placed substrate.

2. The substrate treating apparatus according to claim 1, wherein the first transport mechanism places the substrate on the first intermediate part, the first access operation performed by the intermediate transport mechanism includes picking up the substrate from the first intermediate part, the second access operation performed by the intermediate transport mechanism includes placing the substrate on the second intermediate part, the second transport mechanism picks up the substrate from the second intermediate part, and the intermediate transport mechanism performs the cycle operation, thereby receiving the substrate via the first intermediate part from the first transport mechanism, transporting the substrate from the first intermediate part to the second intermediate part, and passing the substrate via the second intermediate part to the second transport mechanism.

3. The substrate treating apparatus according to claim 2, wherein the first access operation performed by the intermediate transport mechanism includes placing the substrate on the first intermediate part, the second access operation performed by the intermediate transport mechanism includes picking up the substrate from the second intermediate part, and the intermediate transport mechanism performs the cycle operation, thereby transporting the substrate from the second intermediate part to the first intermediate part.

4. The substrate treating apparatus according to claim 3, wherein the first transport mechanism picks up the substrate from the first intermediate part, the second transport mechanism places the substrate on the second intermediate part, and the intermediate transport mechanism performs the cycle operation, thereby receiving the substrate via the second intermediate part from the second transport mechanism, and passing the substrate via the first intermediate part to the first transport mechanism.

5. The substrate treating apparatus according to claim 2, wherein the first access operation performed by the intermediate transport mechanism does not include placing the substrate on the first intermediate part, the second access operation performed by the intermediate transport mechanism does not include picking up the substrate from the second intermediate part, and the intermediate transport mechanism does not transport the substrate from the second intermediate part to the first intermediate part.

6. The substrate treating apparatus according to claim 1, wherein the first intermediate part includes a plurality of first sending units configured and arranged for receiving substrates individually, the second intermediate part includes a plurality of second sending units configured and arranged for receiving the substrates individually, the first access operation performed by the intermediate transport mechanism includes picking up the substrates from the first sending units, and does not include placing the substrates on the first sending units, the second access operation performed by the intermediate transport mechanism includes placing the substrates on the second sending units, and does not include picking up the substrates from the second sending units.

7. The substrate treating apparatus according to claim 6, wherein the first sending units are arranged in an upward/downward direction, and the second sending units are arranged in the upward/downward direction.

8. The substrate treating apparatus according to claim 6, wherein the first intermediate part includes a plurality of first return units configured and arranged for receiving the substrates individually, the second intermediate part includes a plurality of second return units configured and arranged for receiving the substrates individually, the first access operation performed by the intermediate transport mechanism includes placing the substrates on the first return units, and does not include picking up the substrates from the first return units, and the second access operation performed by the intermediate transport mechanism includes picking up the substrates from the second return units, and does not include placing the substrates on the second return units.

9. The substrate treating apparatus according to claim 8, wherein the first return units are arranged in an upward/downward direction, and the second return units are arranged in the upward/downward direction.

10. The substrate treating apparatus according to claim 8, wherein the first return units are positioned so as to overlap the first sending units in plan view, and the second return units are positioned so as to overlap the second sending units in plan view.

11. The substrate treating apparatus according to claim 1, wherein the treatment is a non-liquid treatment without supplying any treatment liquid to the substrate.

12. The substrate treating apparatus according to claim 1, wherein the treatment is a heat treatment.

13. The substrate treating apparatus according to claim 1, wherein at least either the first intermediate part or the second intermediate part further inspects the placed substrate.

14. The substrate treating apparatus according to claim 1, wherein
the first intermediate part is disposed out of a second area where the second transport mechanism is arranged for transporting the substrate, and
the second intermediate part is disposed out of a first area where first transport mechanism is arranged for transporting the substrate.

15. The substrate treating apparatus according to claim 1, wherein
an intermediate area where the intermediate transport mechanism is arranged for transporting the substrate is substantially circular in plan view.

16. The substrate treating apparatus according to claim 1, wherein
the intermediate transport mechanism includes:
a rotator that is rotatable around a rotation axis parallel to the upward/downward direction, and
a holder that is supported on the rotator for holding the substrate, wherein
the rotator is immovable in a horizontal direction.

17. A substrate treating apparatus, comprising:
three or more transport mechanisms that are disposed in a forward/rearward direction,
two or more intermediate parts that are each disposed between an adjacent two of the transport mechanisms in a forward/rearward direction and configured and arranged for receiving a substrate, and
a controller that is connected to the three or more transport mechanisms and programmed for performing a control to the transport mechanisms, wherein
one of the transport mechanisms disposed on a forwardmost side is a front end transport mechanism, one of the transport mechanisms disposed on a rearmost side is a rear end transport mechanism, all of the transport mechanisms except for the front end transport mechanism and the rear end transport mechanism are an intermediate transport mechanism, the intermediate part adjacent to a rear side of the front end transport mechanism is a front end intermediate part, and the intermediate part adjacent to a front side of the rear end transport mechanism is a rear end intermediate part,
the intermediate transport mechanism repeatedly performs a cycle operation in accordance with the programmed control by the programmed controller,
the cycle operation performed by the intermediate transport mechanism includes only a first access operation of accessing the intermediate part adjacent to a front side of the intermediate transport mechanism, and a second access operation of accessing the intermediate part adjacent to a rear side of the intermediate transport mechanism, in accordance with the programmed control by the programmed controller, and
at least one of the intermediate parts is further configured and arranged for performing treatment to the placed substrate.

18. The substrate treating apparatus according to claim 17, wherein:
the front end transport mechanism is configured and arranged for placing the substrate on the front end intermediate part,
the rear end transport mechanism is configured and arranged for picking up the substrate from the rear end intermediate part,
the first access operation performed by the intermediate transport mechanism includes picking up the substrate from the intermediate part adjacent to the front side of the intermediate transport mechanism,
the second access operation performed by the intermediate transport mechanism includes placing the substrate on the intermediate part adjacent to the rear side of the intermediate transport mechanism, and
the intermediate transport mechanism performs the cycle operation, thereby receiving the substrate via the front end intermediate part from the front end transport mechanism, and transporting the substrate from the front end intermediate part to the rear end intermediate part intermediate part, and passing the substrate via the rear end intermediate part to the rear end transport mechanism.

19. The substrate treating apparatus according to claim 17, wherein:
the front end transport mechanism is configured and arranged for picking up the substrate from the front end intermediate part,
the rear end transport mechanism is configured and arranged for placing the substrate on the rear end intermediate part,
the first access operation performed by the intermediate transport mechanism includes placing the substrate on the intermediate part adjacent to the front side of the intermediate transport mechanism,
the second access operation performed by the intermediate transport mechanism includes operation of picking up the substrate from the intermediate part adjacent to the rear side of the intermediate transport mechanism,
the intermediate transport mechanism performs the cycle operation, thereby receiving the substrate via the rear end intermediate part from the rear end transport mechanism, and transporting the substrate from the rear end intermediate part to the front end intermediate part intermediate part, and passing the substrate via the front end intermediate part to front end transport mechanism.

20. The substrate treating apparatus according to claim 17, further comprising:
a carrier mount table that is disposed forward of the front end transport mechanism and configured and arranged for receiving a carrier for accommodating the substrate, wherein
the front end transport mechanism repeats a cycle operation in accordance with the programmed control by the programmed controller, and
the cycle operation performed by the front end transport mechanism includes only a third access operation of accessing the carrier mounted on the carrier mount table, and a fourth access operation of accessing the front end intermediate part, in accordance with the programmed control by the programmed controller.

21. The substrate treating apparatus according to claim 17, further comprising:
a rear end processing part that is disposed in at least either a lateral position of the rear end transport mechanism or a rear position of the rear end transport mechanism and configured and arranged for performing treatment to the substrate, wherein
the rear end transport mechanism repeats a cycle operation in accordance with the programmed control by the programmed controller, and
the cycle operation by the rear end transport mechanism includes only a third access operation of accessing the rear end intermediate part, and a fourth access operation of accessing the rear end processing part, in accordance with the programmed control by the programmed controller.

22. A substrate treating apparatus, comprising:
a first transport mechanism configured and arranged for transporting a substrate;
a second transport mechanism configured and arranged for transporting the substrate;
an intermediate transport mechanism that is disposed between the first transport mechanism and the second transport mechanism, and configured and arranged for transporting the substrate;
a first intermediate part that is disposed within a first overlapped area to which the first transport mechanism and the intermediate transport mechanism are configured and arranged for transporting the substrate, the first intermediate part being configured and arranged for receiving the substrate;
a second intermediate part that is disposed within a second overlapped area to which the intermediate transport mechanism and the second transport mechanism are configured and arranged for transporting the substrate, the second intermediate part being configured and arranged for receiving the substrate; and
a controller that is connected to the first, second and intermediate transport mechanisms, and programmed for performing a control of the first transport mechanism, the second transport mechanism, and the intermediate transport mechanism,
the intermediate transport mechanism repeating a cycle operation in accordance with the programmed control by the programmed controller,
the cycle operation performed by the intermediate transport mechanism including only a first access operation of accessing the first intermediate part and a second access operation of accessing the second intermediate part in accordance with the programmed control by the programmed controller,
the first intermediate part includes a plurality of first sending units configured and arranged for receiving substrates individually,
the second intermediate part includes a plurality of second sending units configured and arranged for receiving the substrates individually,
the first access operation performed by the intermediate transport mechanism includes picking up the substrates from the first sending units, and does not include placing the substrates on the first sending units,
the second access operation performed by the intermediate transport mechanism includes placing the substrates on the second sending units, and does not include picking up the substrates from the second sending units,
the first intermediate part includes a plurality of first return units configured and arranged for receiving the substrates individually,
the second intermediate part includes a plurality of second return units configured and arranged for receiving the substrates individually,
the first access operation performed by the intermediate transport mechanism includes placing the substrates on the first return units, and does not include picking up the substrates from the first return units,
the second access operation performed by the intermediate transport mechanism includes picking up the substrates from the second return units, and does not include placing the substrates on the second return units,
at least one of the first sending units is one of a heat treating unit configured and arranged for performing a heat treatment to the substrate, and a mounting unit only configured for receiving the substrate without performing any treatment to the substrate,
at least one of the first return units is the other of the heat treating unit and the mounting unit,
the mounting unit is positioned so as to overlap the heat treating unit in plan view, and
the heat treating unit and the mounting unit are arranged one by one alternatively.

23. The substrate treating apparatus according to claim 22, further comprising
shelves that are arranged in the upward/downward direction, and support the heat treating unit and the mounting unit, wherein
the number of the heat treating units arranged between two of the shelves adjacent to each other in the upward/downward direction is one, and
the number of the mounting units arranged between two of the shelves adjacent to each other in the upward/downward direction is one.

24. The substrate treating apparatus according to claim 22, wherein
the heat treating unit includes:
a first plate configured and arranged for receiving the substrate,
a second plate that is disposed lateral of the first plate and configured and arranged for receiving the substrate, and
a lid disposed above the second plate,
the mounting unit includes a mounting plate that is disposed above the first plate and lateral of the lid and configured for receiving the substrate, and
the first access operation performed by the intermediate transport mechanism includes accessing the first plate and the mounting plate.

25. A substrate treating apparatus, comprising:
three or more transport mechanisms that are disposed in a forward/rearward direction,
two or more intermediate parts that are each disposed between an adjacent two of the transport mechanisms in a forward/rearward direction and configured and arranged for receiving a substrate, and
a controller that is connected to the three or more transport mechanisms and programmed for performing a control to the transport mechanisms, wherein
one of the transport mechanisms disposed on a forwardmost side is a front end transport mechanism, one of the transport mechanisms disposed on a rearmost side is a rear end transport mechanism, all of the transport mechanisms except for the front end transport mechanism and the rear end transport mechanism are an intermediate transport mechanism, the intermediate part adjacent to a rear side of the front end transport mechanism is a front end intermediate part, and the intermediate part adjacent to a front side of the rear end transport mechanism is a rear end intermediate part,
the intermediate transport mechanism repeatedly performs a cycle operation in accordance with the programmed control by the programmed controller,
the cycle operation performed by the intermediate transport mechanism includes only a first access operation of accessing the intermediate part adjacent to a front side of the intermediate transport mechanism, and a second access operation of accessing the intermediate part adjacent to a rear side of the intermediate transport mechanism, in accordance with the programmed control by the programmed controller, and the front end intermediate parts are further configured and arranged for performing treatment to the placed substrate.

\* \* \* \* \*